US009460813B2

(12) United States Patent
Hashimoto et al.

(10) Patent No.: US 9,460,813 B2
(45) Date of Patent: Oct. 4, 2016

(54) MEMORY SYSTEM

(71) Applicant: KABUSHIKI KAISHA TOSHIBA, Minato-ku (JP)

(72) Inventors: Daisuke Hashimoto, Kanagawa (JP); Toyokazu Eguchi, Tokyo (JP); Hajime Matsumoto, Tokyo (JP); Daisuke Ide, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 522 days.

(21) Appl. No.: 13/933,812

(22) Filed: Jul. 2, 2013

(65) Prior Publication Data

US 2014/0281154 A1  Sep. 18, 2014

Related U.S. Application Data

(60) Provisional application No. 61/784,453, filed on Mar. 14, 2013.

(51) Int. Cl.
| | |
|---|---|
| *G06F 13/16* | (2006.01) |
| *G11C 29/46* | (2006.01) |
| *G11C 29/12* | (2006.01) |
| *G06F 13/42* | (2006.01) |

(52) U.S. Cl.
CPC ........... *G11C 29/46* (2013.01); *G06F 13/4286* (2013.01); *G06F 13/4295* (2013.01); *G11C 29/1201* (2013.01); *G06F 2213/0002* (2013.01); *G06F 2213/0026* (2013.01); *G06F 2213/0032* (2013.01)

(58) Field of Classification Search
None
See application file for complete search history.

(56) References Cited

U.S. PATENT DOCUMENTS

| | | | |
|---|---|---|---|
| 7,280,411 B2* | 10/2007 | Iwasaki | G11C 7/1057 365/100 |
| 7,870,446 B2 | 1/2011 | Kurashige | |
| 7,930,461 B2 | 4/2011 | Tsuji | |
| 7,949,818 B2* | 5/2011 | Suyama | G11C 16/26 711/103 |
| 8,379,427 B2 | 2/2013 | Sugita et al. | |
| 2006/0197549 A1* | 9/2006 | Nygren | G11C 7/1048 326/26 |
| 2009/0228641 A1 | 9/2009 | Kurashige | |
| 2010/0073860 A1 | 3/2010 | Moriai et al. | |

(Continued)

FOREIGN PATENT DOCUMENTS

| | | |
|---|---|---|
| JP | 2004-328483 | 11/2004 |
| JP | 2008-192106 | 8/2008 |
| JP | 2010-521014 | 6/2010 |

OTHER PUBLICATIONS

U.S. Appl. No. 61/803,932, filed Mar. 21, 2013, Hashimoto.

(Continued)

*Primary Examiner* — Gary Portka
(74) *Attorney, Agent, or Firm* — Oblon, McClelland, Maier & Neustadt, L.L.P.

(57) ABSTRACT

According to one embodiment, there is provided a memory system that is connected to a host apparatus. The memory system includes a transmitting port and a controller. The transmitting port transmits a transmission signal to the host apparatus. The controller includes a first output interface that is connected to the transmitting port and a second output interface that is connected to the transmitting port. The memory system is configured such that a drivability of an output from the first output interface is larger than a drivability of an output from the second output interface in a first mode.

20 Claims, 40 Drawing Sheets

(56) References Cited

U.S. PATENT DOCUMENTS

| | | |
|---|---|---|
| 2011/0019356 A1 | 1/2011 | Moriai et al. |
| 2011/0026214 A1 | 2/2011 | Matsumoto et al. |
| 2011/0273834 A1 | 11/2011 | Moriai et al. |
| 2012/0169380 A1* | 7/2012 | Kang .................. G11C 7/1051 327/108 |
| 2012/0210049 A1 | 8/2012 | Nagahara et al. |
| 2012/0284453 A1 | 11/2012 | Hashimoto |
| 2013/0159785 A1 | 6/2013 | Hashimoto |
| 2013/0159814 A1 | 6/2013 | Hashimoto |

OTHER PUBLICATIONS

U.S. Appl. No. 13/768,157, filed Feb. 15, 2013, Ohba et al.
Microchip Technology Inc.; "PIC24F Family Reference Manual, Section 21 UART"; 2006; Section 21, pp. 1-38.

* cited by examiner

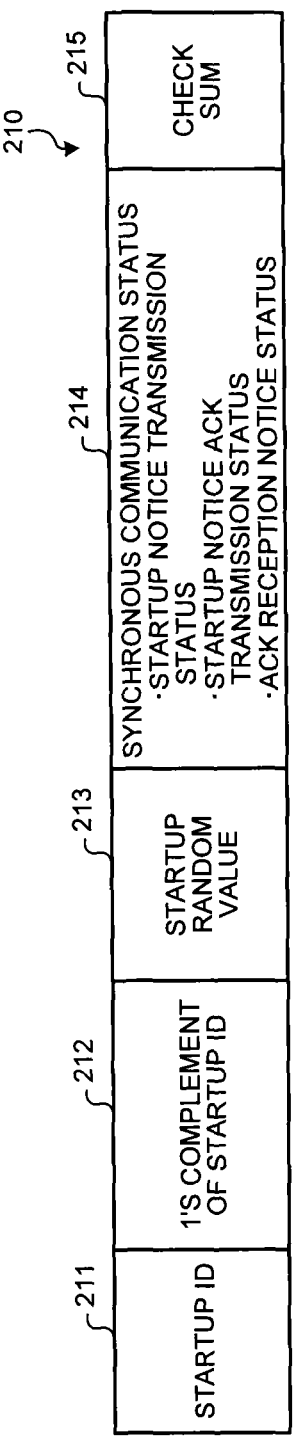

|  | UART0 || UART1 ||
|---|---|---|---|---|
|  | φUART0-Tx | φUART0-Rx | φUART1-Tx | φUART1-Rx |
| NORMAL MODE | Output Signal | Receive Signal | Pull up to High | Ignore Signal |
| TEST MODE | High-Z | Ignore Signal | Output Signal | Receive Signal |

| φUART0-Tx | φVin0A | φVin0B |
|---|---|---|
| Low | High | High |
| High | Low | Low |
| H-Z | High | Low |

| φUART1-Tx | φVin1 |
|---|---|
| Low | High |
| High | Low |

|  | UART0 | | UART1 | |
|---|---|---|---|---|
|  | φUART0-Tx | φUART0-Rx | φUART1-Tx | φUART1-Rx |
| NORMAL MODE | Output Signal | Receive Signal | Pull down to Low | Ignore Signal |
| TEST MODE | High-Z | Ignore Signal | Output Signal | Receive Signal |

FIG.24

|  | UART0 | | UART1 | | UART2 | |
| --- | --- | --- | --- | --- | --- | --- |
|  | φUART0-Tx | φUART0-Rx | φUART1-Tx | φUART1-Rx | φUART2-Tx | φUART2-Rx |
| NORMAL MODE | Output Signal | Receive Signal | Pull up to High | Ignore Signal | High-Z | Ignore Signal |
| TEST MODE | High-Z | Ignore Signal | Output Signal | Receive Signal | High-Z | Ignore Signal |
| SECOND TEST MODE | High-Z | Ignore Signal | Pull up to High | Ignore Signal | Output Signal | Receive Signal |

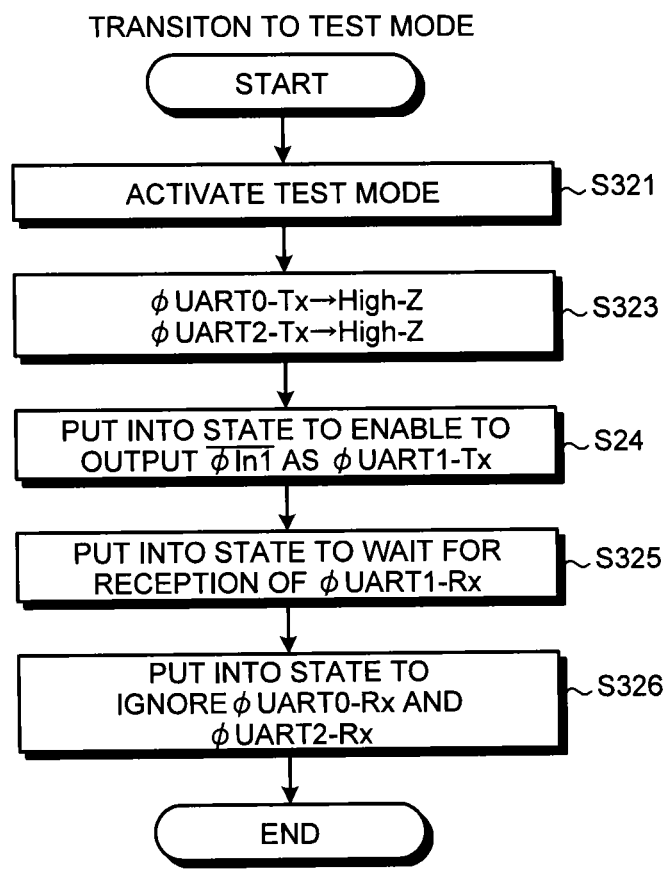

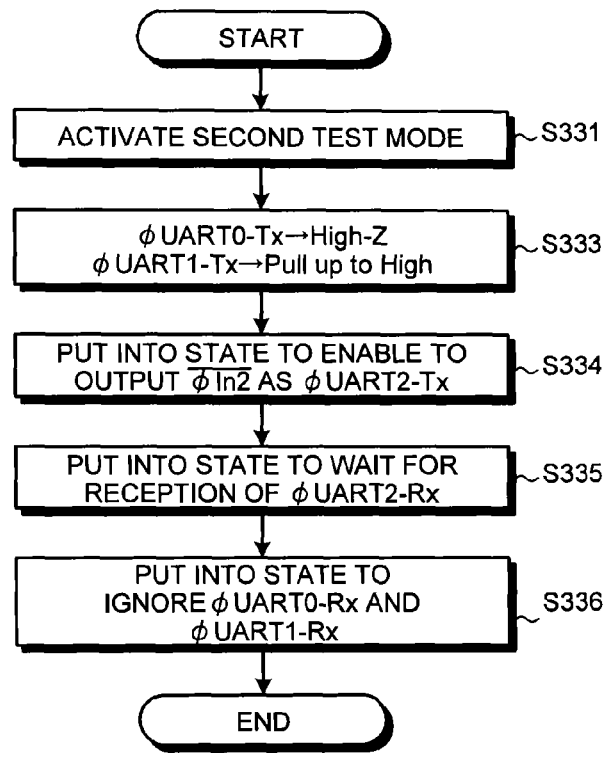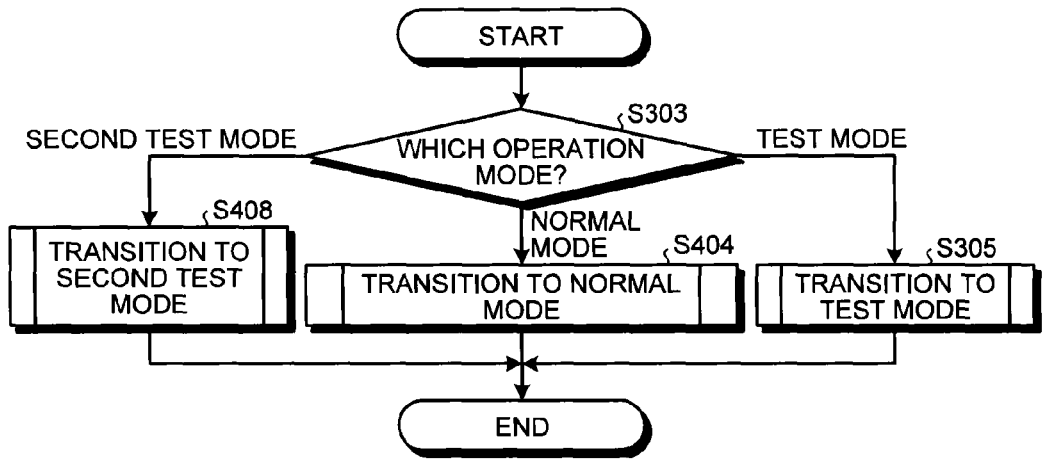

FIG.32

| | UART0 | | UART1 | | UART2 | |
|---|---|---|---|---|---|---|
| | φUART0-Tx | φUART0-Rx | φUART1-Tx | φUART1-Rx | φUART2-Tx | φUART2-Rx |
| NORMAL MODE | Output Signal | Receive Signal | Pull down to Low | Ignore Signal | High-Z | Ignore Signal |
| TEST MODE | High-Z | Ignore Signal | Output Signal | Receive Signal | High-Z | Ignore Signal |
| SECOND TEST MODE | High-Z | Ignore Signal | Pull down to Low | Ignore Signal | Output Signal | Receive Signal |

| φUART1-Tx | φVin1A1 | φVin1A2 |
|---|---|---|
| Pull up to High | Low | High |
| Output High | Low | Low |
| Output Low | High | High |

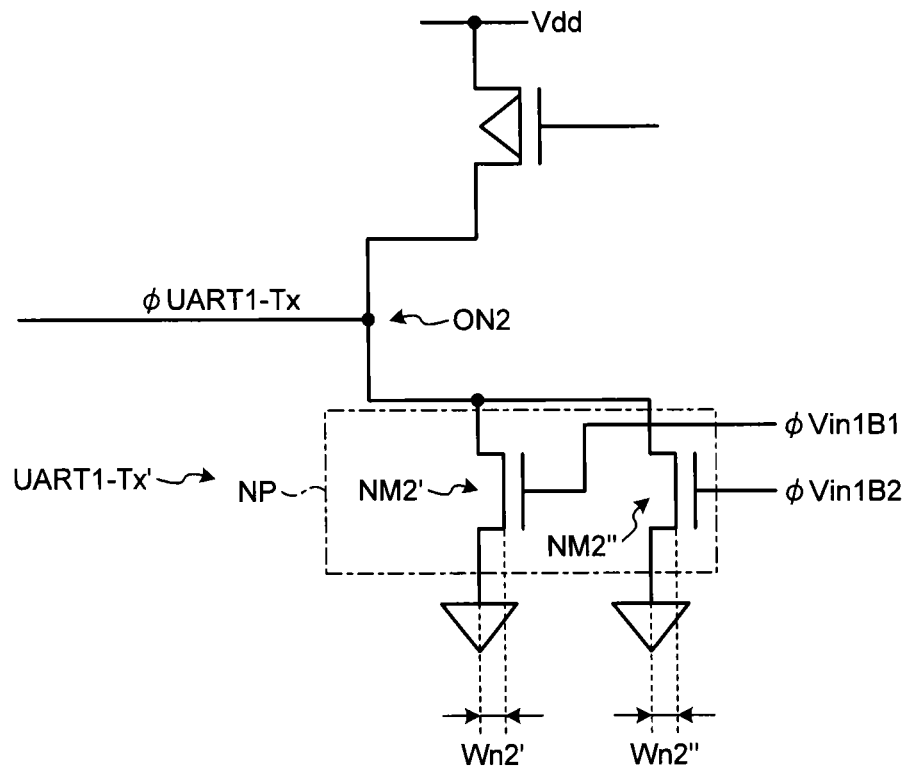

FIG.49

| Pin# | Mate | Signal Name | Type | Signal Description |
|---|---|---|---|---|
| E1 | 3rd | PCIe B RefClk+ | Diff-Pair | PCIe Reference Clock+ (Port B) |
| E2 | 3rd | PCIe B RefClk- | Diff-Pair | PCIe Reference Clock- (Port B) |
| E3 | 3rd | +3.3Vaux | Power | +3.3V for SM bus |
| E4 | 3rd | PCIe B RST | Output | PCIe Reset (Port B) |
| E5 | 3rd | PCIe A RST | Output | PCIe Reset (Port A) |
| E6 | 3rd | Reserved | | Reserved |
| | | | | |
| S15 | 3rd | Reserved | | Reserved |
| S16 | 2nd | Ground | Ground | Grond |
| S17 | 3rd | PETp1/S2T+ | Diff-Pair | PCIe 1/SAS 2 Tx+ |
| S18 | 3rd | PETn1/S2T- | Diff-Pair | PCIe 1/SAS 2 Tx- |
| S19 | 2nd | Ground | Ground | Grond |
| S20 | 3rd | PETn1/S2R- | Diff-Pair | PCIe 1/SAS 2 Rx- |
| S21 | 3rd | PETp1/S2R+ | Diff-Pair | PCIe 1/SAS 2 Rx+ |
| S22 | 2nd | Ground | Ground | Grond |
| S23 | 3rd | PETp2/S3T+ | Diff-Pair | PCIe 2/SAS 3 Tx+ |
| S24 | 3rd | PETn2/S3T- | Diff-Pair | PCIe 2/SAS 3 Tx- |
| S25 | 2nd | Ground | Ground | Grond |
| S26 | 3rd | PERn2/S3R- | Diff-Pair | PCIe 2/SAS 3 Rx- |
| S27 | 3rd | PERp2/S3R+ | Diff-Pair | PCIe 2/SAS 3 Rx+ |
| S28 | 2nd | Ground | Ground | Grond |

FIG.51

| Pin# | Mate | Signal Name | Type | Signal Description |
|---|---|---|---|---|
| | | | | |
| P1 | 3rd | Wake# | Input | Reserved |
| P2 | 3rd | Dev Reset | Bi-Dir | Device reset |
| P3 | 2nd | DevSLP# | Output | Device Sleep |
| P4 | 1st | IfDet# | Input | Interface type detect |
| P5 | 2nd | Ground | Power | Ground |
| P6 | 2nd | Ground | Power | Ground |
| P7 | 2nd | +5V Precharge | Power | +5V Precharge |
| P8 | 3rd | +5V | Power | +5V |
| P9 | 3rd | +5V | Power | +5V |
| P10 | 2nd | PRSNT# | Input | Device present |
| P11 | 3rd | Activity/Spinup | Bi-Dir | Activity/Spinup |
| P12 | 1st | Ground | Power | Hot plut ground |
| P13 | 2nd | +12V Precharge | Power | +12V Precharge |
| P14 | 3rd | +12V | Power | +12V |
| P15 | 3rd | +12V | Power | +12V |

|  | UART0 | | UART1 | |
|---|---|---|---|---|
|  | φUART0-Tx | φUART0-Rx | φUART1-Tx | φUART1-Rx |
| NORMAL MODE | Output Signal | Receive Signal | High-Z | Ignore Signal |
| TEST MODE | High-Z | Ignore Signal | Output Signal | Receive Signal |

MEMORY SYSTEM

CROSS-REFERENCE TO RELATED APPLICATIONS

This application is based upon and claims the benefit of priority from Provisional Application No. 61/784,453, filed on Mar. 14, 2013; the entire contents of which are incorporated herein by reference.

FIELD

Embodiments described herein relate generally to a memory system.

BACKGROUND

An SSD (Solid State Drive) which is provided with a memory chip including NAND memory cells has drawn attention as a memory system used in a computer system. For example, the SSD has a high processing speed and a light weight, as compared to a magnetic disk device. The memory system, such as the SSD, includes a connector that includes a plurality of ports for connection to the host apparatus in the computer system.

BRIEF DESCRIPTION OF THE DRAWINGS

FIGS. 4A and 4B are diagrams illustrating the configuration of a data frame in the first embodiment;

FIG. 24 is a diagram illustrating the operation of the memory system according to the third embodiment;

FIG. 29 is a flowchart illustrating a transition in the operation mode to the test mode in the third embodiment;

FIG. 30 is a flowchart illustrating a transition in the operation mode to a second test mode in the third embodiment;

FIG. 31 is a flowchart illustrating the operation of a memory system according to a fourth embodiment;

FIG. 32 is a diagram illustrating the operation of the memory system according to the fourth embodiment;

FIG. 44 is a diagram illustrating the structure of a second output interface in an eighth embodiment;

FIG. 45 is a diagram illustrating the operation of the second output interface in the eighth embodiment;

FIG. 49 is a diagram illustrating the structure of a high-speed serial port unit in the eleventh embodiment;

FIG. 51 is a diagram illustrating the structure of a port unit for other purposes in the twelfth embodiment;

DETAILED DESCRIPTION

In general, according to one embodiment, there is provided a memory system that is connected to a host apparatus. The memory system includes a transmitting port and a controller. The transmitting port transmits a transmission signal to the host apparatus. The controller includes a first output interface that is connected to the transmitting port and a second output interface that is connected to the transmitting port. The memory system is configured such that a drivability of an output from the first output interface is larger than a drivability of an output from the second output interface in a first mode.

Exemplary embodiments of a memory system will be explained below in detail with reference to the accompanying drawings. The present invention is not limited to the following embodiments.

(First Embodiment)

Figure 1A:
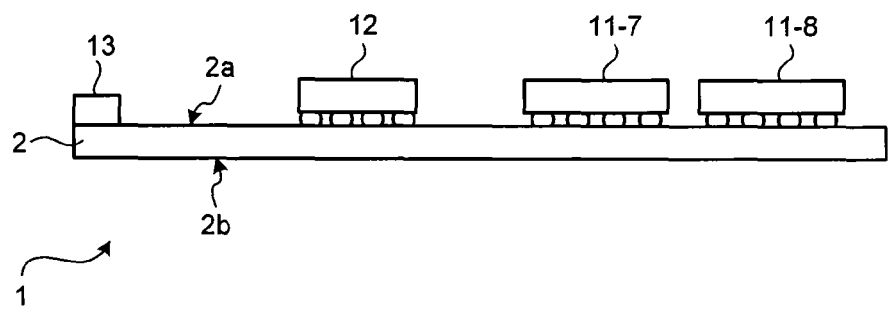
FIGS. 1A and 1B are diagrams illustrating the structure of a memory system according to a first embodiment.
Figure 1B:
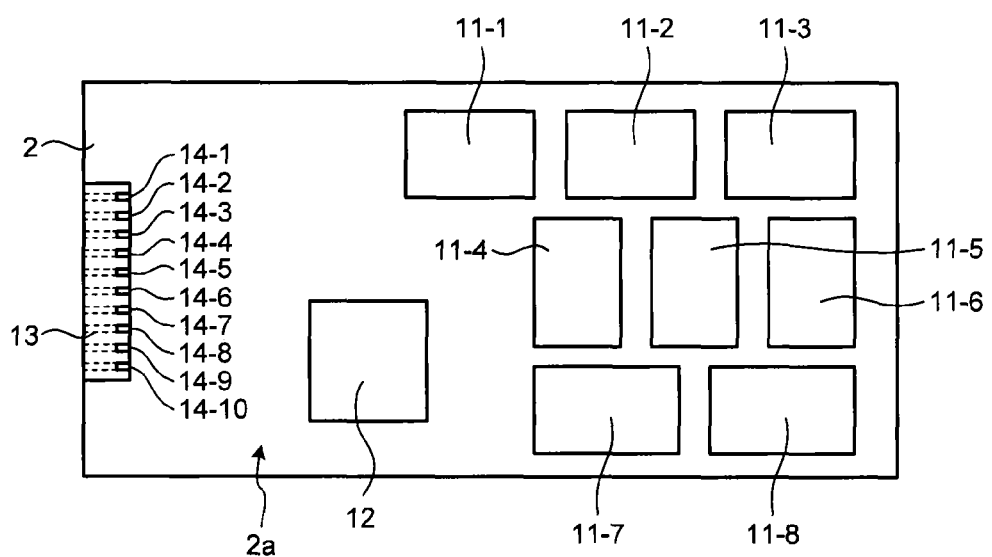

The outward appearance and structure of a memory system 1 according to a first embodiment will be described with reference to FIGS. 1A and 1B. FIGS. 1A and 1B are diagrams schematically illustrating an example of the outward appearance and structure of the memory system 1. FIG. 1A is a side view and FIG. 1B is a top view of FIG. 1A.

The memory system 1 is connected to a host apparatus 100 (see FIG. 3) through a connector 13 and performs communication (for example, serial communication) with the host apparatus 100 through the connector 13. In this way, the memory system 1 functions as an external storage device of the host apparatus 100.

The memory system 1 may be, for example, an SSD (Solid State Drive) or other readable and writable non-volatile storage devices, such as a hard disk drive, a hybrid hard disk drive, a USB memory, and an SD card. The host apparatus 100 may be, for example, an information processing apparatus such as a personal computer, a tester apparatus, a manufacturing apparatus, an imaging apparatus, such as a still camera or a video camera, a portable terminal such as a tablet computer or a smart phone, a game machine, or an in-vehicle terminal such as a car navigation system.

Hereinafter, an example in which the memory system 1 is an SSD and the host apparatus 100 is a personal computer will be described.

As illustrated in FIGS. 1A and 1B, the memory system 1 includes a printed circuit board 2, a plurality of memory chips 11-1 to 11-8, a controller chip 12, and the connector 13.

The printed circuit board 2 includes a main surface 2a and a main surface 2b. The main surface 2b is a reverse side to the main surface 2a. For example, the plurality of memory chips 11-1 to 11-8, the controller chip 12, and the connector 13 are arranged on the main surface 2a of the printed circuit board 2 (see FIG. 1B).

Each of the memory chips 11-1 to 11-8 includes, for example, a non-volatile semiconductor memory (for example, a NAND flash memory) and is mounted on the main surface 2a of the printed circuit board 2 in the form of a package. For example, FIG. 1A exemplarily illustrates a BGA (Ball Grid Array) mounting method in which external terminals, such as bumps connected to each of the memory chips 11-1 to 11-8, are connected to pads on the main surface 2a of the printed circuit board 2. However, other mounting methods may be used.

Figure 2:
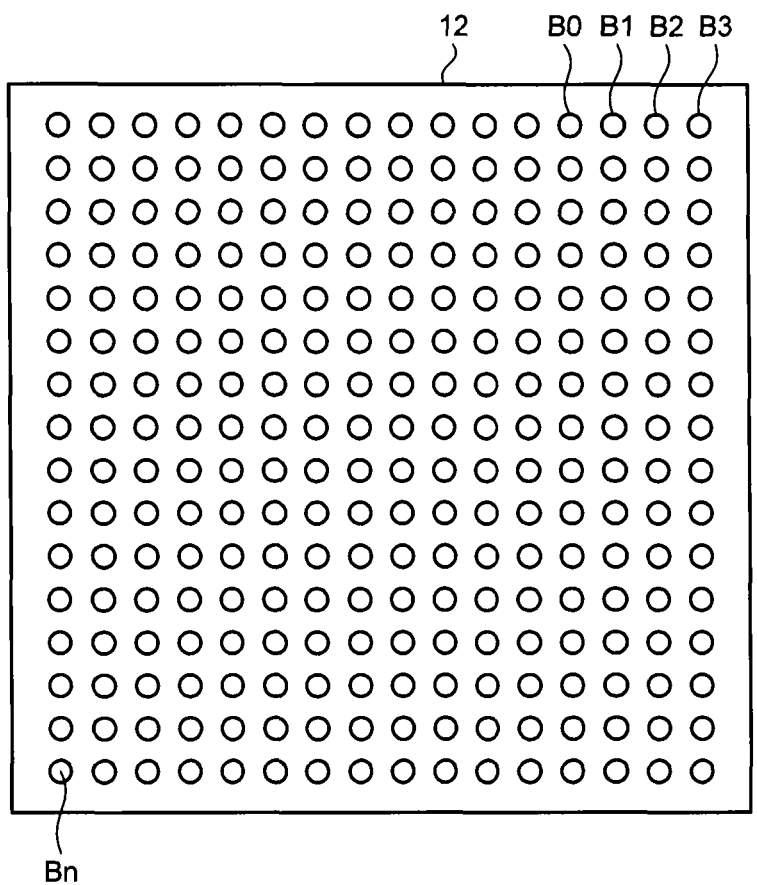
FIG. 2 is a diagram illustrating the structure of a controller chip in the first embodiment.

The controller chip 12 includes, for example, a controller CTR (see FIG. 3) and is mounted on the main surface 2a of the printed circuit board 2 in the form of a package. For example, the controller chip 12 controls each of the memory chips 11-1 to 11-8. FIG. 1A illustrates the BGA mounting method in which the external terminals, such as bumps B0, B1, ..., Bn connected to the controller chip 12 as illustrated in FIG. 2, are connected to the pads on the main surface 2a of the printed circuit board 2. However, other mounting methods may be used.

A communication line group CL (see FIG. 3) for communication with the host apparatus 100 is connected to the connector 13. That is, the connector 13 includes a plurality of ports 14-1 to 14-10 for communication with the host apparatus 100. Each of the ports 14-1 to 14-10 is connected to, for example, the controller chip 12 through board lines SL (see FIG. 3) of the printed circuit board 2 and is also connected to the host apparatus 100 through the communication line group CL (see FIG. 3).

The connector 13 illustrated in FIG. 1B is simplified for illustration and exemplification. However, in practice, the connector 13 may include a larger number of ports than those in this example and may follow the form factor standard of the memory system 1 (for example, the connector 13 may have a shape different from that illustrated in the drawings). The form factor standard of the memory system 1 may be, for example, a standard form factor such as a 2.5-inch form factor, an SFF-8639 form factor, or an NGFF form factor or a standard which is uniquely designated by the manufacturer (a delivery destination of the memory system 1) of a computer system CS.

Figure 3:
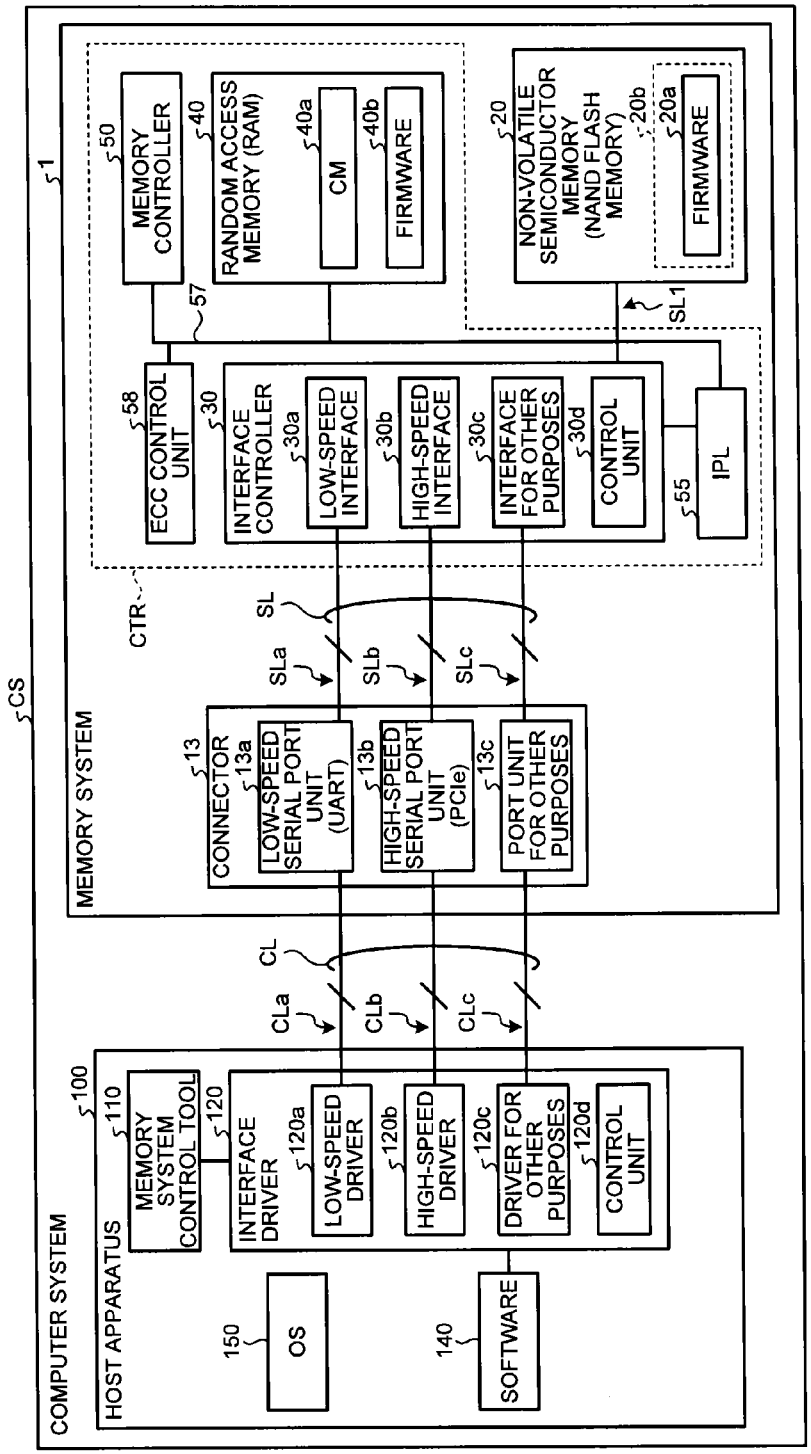
FIG. 3 is a diagram illustrating the structure of a computer system including the memory system according to the first embodiment.

Next, the hardware configuration of the computer system CS including the memory system 1 will be described with reference to FIG. 3. FIG. 3 is a diagram illustrating the hardware configuration of the computer system CS.

The computer system CS includes the communication line group CL, the memory system 1, and the host apparatus 100.

As illustrated in FIG. 3, the communication line group CL connects the memory system 1 and the host apparatus 100. For example, the communication line group CL includes a low-speed serial communication line group CLa, a high-speed serial communication line group CLb, and a communication line group CLc for other purposes.

In addition, the memory system 1 includes a non-volatile semiconductor memory 20, the controller CTR, the connector 13, and the board lines SL. The controller CTR includes a RAM 40, a memory controller 50, an IPL (Initial Program Loader) 55, an ECC control unit 58, a bus 57, and an interface controller 30. The controller CTR may be, for example, an MPU (Micro Processer Unit) including one chip or a plurality of chips. The RAM 40, the memory controller 50, the IPL 55, the ECC control unit 58, the bus 57, and the interface controller 30, which are included in the controller CTR, may be embedded as one chip (e.g., the controller chip 12), or may be embedded as a plurality of different chips on the main surface 2a and/or main surface 2b.

The non-volatile semiconductor memory 20 stores data in a non-volatile manner and may be, for example, a NAND flash memory, a ReRAM (Resistance Random Access Memory), or a magnetic disk. For example, the non-volatile semiconductor memory 20 stores firmware (system program) 20a.

For example, the non-volatile semiconductor memory 20 has a memory cell array in which a plurality of memory cells is arranged in a matrix. Each memory cell may store multiple values using, for example, the upper page and the lower page. The non-volatile semiconductor memory 20 includes the plurality of memory chips 11-1 to 11-8 (see FIG. 1B). Each of the memory chips 11-1 to 11-8 is formed by arranging a plurality of blocks which are the units of data erase. In the non-volatile semiconductor memory 20, the writing and reading of data are performed for each page. The block includes a plurality of pages.

The RAM 40 is a random access memory (RAM) which temporarily stores data and may be, for example, a volatile RAM, such as a DRAM (Dynamic Random Access Memory) or an SRAM (Static Random Access Memory), or a non-volatile RAM such as a FeRAM (Ferroelectric Random Access Memory), a MRAM (Magnetoresistive Random Access Memory), a PRAM (Phase Change Random Access Memory), or a ReRAM (Resistance Random Access Memory). The RAM 40 may be included in the memory controller 50.

For example, the RAM 40 functions as a buffer when signals (for example, commands or data) are transmitted to or received from the host apparatus 100 or functions as a work area of various controllers. For example, the RAM 40 includes a cache memory (CM) 40a which functions as an intermediate buffer between the interface controller 30 and the non-volatile semiconductor memory 20. For example, the RAM 40 stores firmware 40b which is read from the non-volatile semiconductor memory 20 by the IPL 55 when the memory system 1 is turned on.

The memory controller 50 manages and controls the non-volatile semiconductor memory 20 and the RAM 40 and controls the interface controller 30.

For example, the functions of the memory controller 50 are processed by, for example, a processor in the memory controller 50 which executes the firmware 40b stored in the RAM 40 or the firmware 20a stored in the non-volatile semiconductor memory 20 and various hardware circuits. For example, the memory controller 50 controls data transmission between the host apparatus 100 and the non-volatile semiconductor memory 20 in response to various commands, such as a write request, a cache flush request, and a read request from the host apparatus 100, and updates and manages various management tables stored in the RAM 40 and the non-volatile semiconductor memory 20.

The IPL 55 functions as a boot loader which performs various startup processes including, for example, an initialization process when the memory system 1 starts up. For example, the IPL 55 starts when the memory system 1 is turned on and initializes the non-volatile semiconductor memory 20, the RAM 40, the memory controller 50, and the interface controller 30. At that time, the IPL 55 reads the firmware 20a from the non-volatile semiconductor memory 20 and stores it as the firmware 40b in the RAM 40. The IPL 55 may be included, for example, in the memory controller 50.

The ECC control unit 58 performs an error correction process for data read from the non-volatile semiconductor memory 20 and an ECC encoding process for data to be written to the non-volatile semiconductor memory 20.

For example, the memory controller 50 transmits the data read from the non-volatile semiconductor memory 20 to the ECC control unit 58. The ECC control unit 58 performs ECC correction when there is an error in data and transmits the corrected data to the interface controller 30. The interface controller 30 transmits the data (signal) to the host apparatus 100 through the connector 13 and the communication line group CL.

The bus 57 connects the RAM 40, the memory controller 50, the IPL 55, the ECC control unit 58, and the interface controller 30 among each other. In addition, for example, the bus 57 may be connected to the non-volatile semiconductor memory 20 through board lines SL1.

The communication line group CL for communication with the host apparatus 100 is connected to the connector 13. For example, the low-speed serial communication line group CLa, the high-speed serial communication line group CLb, and the communication line group CLc for other purposes are connected to the connector 13.

For example, the connector 13 includes a low-speed serial port unit 13a, a high-speed serial port unit 13b, and a port unit 13c for other purposes. The low-speed serial port unit 13a is a communication port based on, for example, a UART (Universal Asynchronous Receiver Transmitter) standard and includes some of a plurality of ports 14-1 to 14-10 (see FIG. 1B). The high-speed serial port unit 13b is a communication port based on, for example, a PCI (Peripheral Components Interconnect) Express standard, a SATA (Serial Advanced Technology Attachment) standard, or a SAS (Serial Attached SCSI) standard and includes some of the plurality of ports 14-1 to 14-10 (see FIG. 1B). In this embodiment, the high-speed serial port unit 13b is based on the PCI Express standard. The port unit 13c for other purposes is, for example, a power supply port and includes the other ports of the plurality of ports 14-1 to 14-10 (see FIG. 1B).

For example, at least some of the board lines SL are mounted on the printed circuit board 2 and the board lines SL connect the connector 13 and the interface controller 30. For example, the board lines SL include low-speed lines SLa, high-speed lines SLb, and lines SLc for other purposes.

The interface controller 30 transmits and receives signals (for example, commands and data) to and from the host apparatus 100 through the connector 13 and the communication line group CL. That is, the interface controller 30 controls an interface operation of transmitting and receiving signals to and from the host apparatus 100.

For example, the interface controller 30 includes a low-speed interface 30a, a high-speed interface 30b, an interface 30c for other purposes, and a control unit 30d. The low-speed interface 30a is connected to the low-speed serial port unit 13a through the low-speed lines SLa. The high-speed interface 30b is connected to the high-speed serial port 13b through the high-speed lines SLb. The interface 30c for other purposes is connected to the port unit 13c for other purposes through the lines SLc for other purposes. The control unit 30d controls the interface operation of each of the low-speed interface 30a, the high-speed interface 30b, and the interface 30c for other purposes. For example, the control unit 30d uses the low-speed interface 30a, the high-speed interface 30b, and the interface 30c for other purposes in parallel to perform signal transmitting and receiving operations in parallel.

As illustrated in FIG. 3, the host apparatus 100 includes an operating system (OS) 150, an interface driver 120, a memory system control tool 110, and software 140.

The interface driver 120 includes a low-speed driver 120a, a high-speed driver 120b, a driver 120c for other purposes, and a control unit 120d. The low-speed driver 120a is connected to the low-speed serial port unit 13a of the connector 13 through the low-speed serial communication line group CLa. The high-speed driver 120b is connected to the high-speed serial port 13b of the connector 13 through the high-speed serial communication line group CLb. The driver 120c for other purposes is connected to the port unit 13c for other purposes of the connector 13 through the communication line group CLc for other purposes. The control unit 120d controls the operation of each of the low-speed driver 120a, the high-speed driver 120b, and the driver 120c for other purposes. For example, the control unit 120d uses the low-speed driver 120a, the high-speed driver 120b, and the driver 120c for other purposes in parallel to perform the signal transmitting and receiving operations in parallel.

The memory system control tool 110 communicates with the memory system 1 through the interface driver 120 and the communication line group CL to control the memory system 1. For example, the memory system control tool 110 transmits a set operation mode command to the memory system 1 so as to operate in an operation mode, such as a test mode or a normal mode selectively. Then, for example, the memory system 1 switches its operation mode in response to the set operation mode command. For example, when the memory system 1 operates in the normal mode, the memory system control tool 110 may transmit the set operation mode command to the memory system 1 so as to operate in, for example, the test mode. Then, for example, the memory system 1 switches its operation mode in response to the set operation mode command.

The software 140 is software other than the memory system control tool 110 and uses the memory system 1.

As illustrated in FIG. 3, the memory system 1 includes a low-speed communication interface (the low-speed serial port unit 13a and the low-speed interface 30a) in addition to the high-speed communication interface (the high-speed serial port unit 13b and the high-speed interface 30b). The low-speed communication interface has a link rate less than the high-speed communication interface and has a simple communication protocol. Therefore, the low-speed communication interface is simply implemented and the amount of implementation of the low-speed communication interface is smaller than the high-speed communication interface. The low-speed communication interface enables a communication process to be performed only by the IPL 55 and the control unit 30d, without firmware being executed by the memory controller 50. Therefore, using the low-speed communication interface is effective when communication with the host apparatus 100 is performed in a state in which firmware is not stored in a firmware storage area 20b, for example, immediately after the memory system 1 is assembled or when communication with the host apparatus 100 is performed in order to test or recover the memory system 1 in a failure state in which the non-volatile semiconductor memory 20, the RAM 40, the high-speed interface 30b, or the high-speed serial port unit 13b do not operate normally. In addition, the low-speed communication interface can be implemented on the controller CTR at a low cost. The low-speed communication interface can reduce the processing load of the controller CTR because the low-speed communication interface can be simply controlled. Furthermore, the low-speed communication interface can be operated without the limitation of the communication protocol of the high-speed interface 30b. Therefore, while the host apparatus 100 is communicating with the memory system 1 using the high-speed interface, the low-speed communication interface makes it possible to control the memory system 1 using out-of-band management. As a result, it is possible to flexibly control the memory system 1.

Figure 4B:
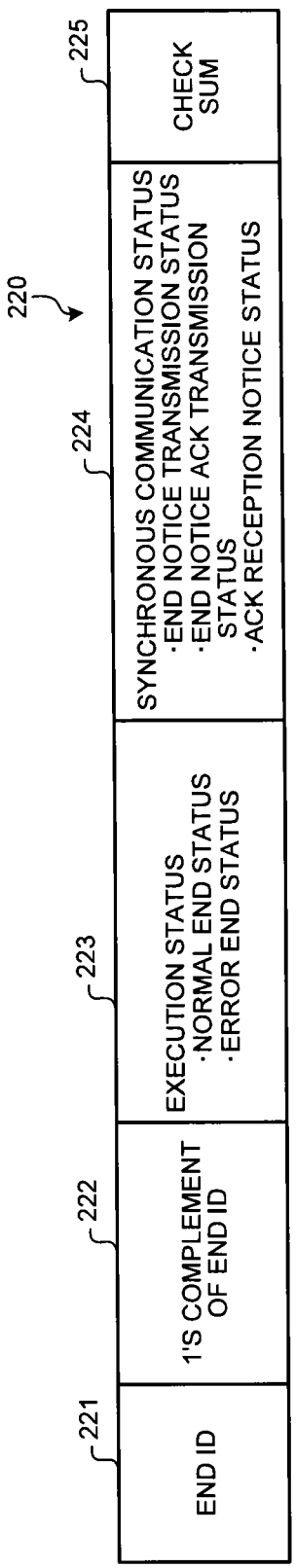

For example, when a UART standard is used as the low-speed serial communication standard, a communication protocol of the low-speed serial communication comprises simple data frame structures as illustrated in FIGS. 4A and 4B. FIGS. 4A and 4B are diagrams illustrating an example of the configuration of a synchronous data frame. FIG. 4A illustrates an example of the configuration of a startup synchronous data frame and FIG. 4B illustrates an example of the configuration of an end synchronous data frame. Next, an example of the configuration of the data frame when a plurality of memory systems 1 is provided in the computer system CS will be described.

The startup synchronous data frame 210 includes the fields of a startup ID 211 indicating the beginning of the startup synchronous data frame 210, the 1's complement 212 of the startup ID, a startup random value 213 which is acquired from a random number generating unit (not illustrated), a synchronous communication status 214 indicating the status of the host memory system during startup, and a check sum 215 for checking whether there is an error in the data of the startup synchronous data frame 210.

The synchronous communication status 214 indicates the status of the host memory system. In this embodiment, a startup notice transmission status, a startup notice ACK transmission status, and an ACK reception notice status are provided as the status. A flag is raised in each status to indicate the current status. The startup notice transmission status indicates whether the startup synchronous data frame 210 in which a flag is raised the 'startup notice transmission status' is transmitted to the opposite memory system after power is turned on. The startup notice ACK transmission status indicates whether the startup synchronous data frame 210 in which a flag is raised in the 'startup notice ACK transmission status', which is a response to the reception of the startup synchronous data frame 210, after the startup synchronous data frame 210 in which a flag is raised in the 'startup notice ACK transmission status' is received. The ACK reception notification status indicates whether the startup synchronous data frame 210 in which a flag is raised in the 'ACK reception notification status' indicating the reception of the startup synchronous data frame 210 in which a flag is raised in the 'startup notice ACK transmission status' from the opposite memory system is transmitted.

The end synchronous data frame 220 includes the fields of an end ID 221 indicating the beginning of the end synchronous data frame 220, the 1's complement 222 of the end ID, an execution status 223 indicating the diagnosis result of a diagnosis unit (not illustrated), a synchronous communication status 224 indicating the status of the host SSD when the system ends, and a check sum 225 for checking whether there is an error in the data of the end synchronous data frame 220.

The execution status 223 indicates the end status of the self-diagnosis of the diagnosis unit. In this embodiment, it is assumed that a normal end status and an error end status are provided as the status and a flag is raised in each status to indicate the current status. For the normal end status, a flag is raised when the diagnosis of the diagnosis unit ends normally. For the error end status, a flag is raised when the diagnosis of the diagnosis unit ends abnormally. The synchronous communication status 224 is the same as the synchronous communication status 214 in the startup synchronous data frame 210 except that the name of the synchronous communication status 224 is partially different from that of the synchronous communication status 214.

In the memory system 1 illustrated in FIG. 3, the low-speed communication interface (the low-speed serial port unit 13a and the low-speed interface 30a) has a simple communication protocol, can be simply implemented at a low cost, can be simply controlled, and can reduce the processing load. Therefore, the low-speed communication interface is used to transmit and receive simple commands or data related to the simple commands.

For example, a SSD manufacturer initializes the memory system 1 when the computer system CS is manufactured before the shipment of the memory system 1. The manufacturer connects the memory system 1 to a manufacturing apparatus or a tester apparatus equivalent to the host apparatus 100 via the communication line group CL. In this case, if the high-speed communication interface (the high-speed serial port unit 13b and the high-speed interface 30b) is used for the initialization, an additional high-capacity ROM (Read Only Memory) having a large amount of program code to control the high-speed interface 30b needs to be mounted in the memory system 1.

In contrast, if the low-speed communication interface is used for the initialization, an additional high-capacity ROM need not be mounted in the memory system 1 and it is possible to reduce the costs of the memory system 1.

For example, the memory system 1 receives firmware through the low-speed communication interface and the firmware is installed in the memory system 1 (for example, in the non-volatile semiconductor memory 20). For example, the memory system 1 transmits a reply message indicating the completion of installation to the host apparatus 100 through the low-speed communication interface.

For example, the memory system 1 receives initial configuration parameters through the low-speed communication interface and the parameters are set in the memory system 1 (for example, in the non-volatile semiconductor memory 20) to optimize the operation of the memory system 1. The configuration parameters may be voltages such as the write voltage, read voltage, and erase voltage applied to each memory cell in the non-volatile semiconductor memory 20. The configuration parameters may be I/O delay timings such as a DQ delay, a DQS delay and a data strobe point delay used for interfaces of NAND MEMORY 20 and RAM MEMORY 40.

For example, the memory system 1 transmits a notice indicating the completion of setting to the host apparatus 100 through the low-speed communication interface.

Alternatively, for example, it is considered that, after the computer system CS is shipped (when the computer system CS is used), the host apparatus 100 performs out-of-band management to manage the memory system 1. In this case, supposing that the high-speed communication interface (the high-speed serial port unit 13b and the high-speed interface 30b) is used to transmit and receive data and commands for out-of-band management, the band for transmitting and receiving data and commands for a normal operation is limited by the data and commands for out-of-band management. As a result, the transmission rate of the data and commands for a normal operation is likely to be reduced.

In contrast, if the low-speed communication interface is used to transmit and receive the data and commands for out-of-band management, the band (the band used by the high-speed communication interface) for transmitting and receiving the data and commands for a normal operation is not limited. Therefore, the transmission rate of the data and commands for a normal operation can be improved. For example, the memory system 1 receives a temperature acquisition command to acquire the internal temperature of the memory system 1 through the low-speed communication interface and notifies the controller CTR in the memory system 1 of the reception of the temperature acquisition command. For example, the memory system 1 transmits temperature data, which is a response, from the controller CTR to the host apparatus 100 through the low-speed communication interface.

As described above, the connector 13 illustrated in FIG. 3 needs to be based on the form factor standard of the memory system 1 (for example, the 2.5-inch form factor, the SFF-8639 form factor, the NGFF form factor, or the form factor designated by the manufacturer of the computer system CS). In the low-speed serial port unit 13a, the number of usable ports is limited by the standard of the memory system 1. For example, in the low-speed serial port unit 13a, the number of usable transmitting ports and receiving ports is limited to a pair of the transmitting port and the receiving port by restrictions in the standard of the memory system 1.

In the low-speed interface 30a of the controller CTR illustrated in FIG. 3, plural types of low-speed serial communication interfaces may be needed to be provided due to hardware restrictions.

For example, when the controller chip 12 is configured such that UART communication (hereinafter, referred to as UART0 communication) using the bump B0 and the bump B1 illustrated in FIG. 2 is performed to transmit and receive data and commands for out-of-band management after the computer system CS is shipped (when the computer system CS is used) and UART communication (hereinafter, referred to as UART1 communication) using the bump B2 and the bump B3 illustrated in FIG. 2 is performed to transmit and receive data and commands for initialization before the computer system CS is shipped (when the computer system CS is manufactured) and the controller CTR is configured such that the bump B0 outputs three values High, Low, and High-Z as an output φUART0-Tx and the bump B2 outputs two values High and Low as an output φUART1-Tx, both an interface for the UART0 communication and an interface for the UART1 communication need to be provided in the low-speed interface 30a.

Alternatively, for example, when the memory controller 50 illustrated in FIG. 3 supports only the UART0 communication and the IPL 55 supports only the UART1 communication, both the interface for the UART0 communication and the interface for the UART1 communication need to be provided in the low-speed interface 30a.

However, when plural types of low-speed serial communication interfaces in the low-speed interface 30a are simply connected so as to share a pair of the transmitting port and the receiving port in the low-speed serial port unit 13a, signals output from plural types of low-speed serial communication interfaces are mixed, for example, during the transmission of the signals, which makes it difficult to transmit an appropriate signal. For example, in a case in which the bump B2 can output only two values and the bump B0 and the bump B2 share the same transmitting port, a current flows to the transmitting port when the bump B2 outputs a value High and a current flows out from the transmitting port when the bump B2 outputs a value Low. This is because the bump B2 outputs only either one of the two values High or Low even while a signal is being output from the bump B0. As a result, the output voltage from the bump B0 is likely to vary and there is the possibility that the output voltage will not be appropriately transmitted to the host apparatus 110.

In the first embodiment, to address the above-described problems, the following structure is provided in order to appropriately transmit and receive signals while plural types of low-speed serial communication interfaces share a pair of the transmitting port and the receiving port.

Figure 5:
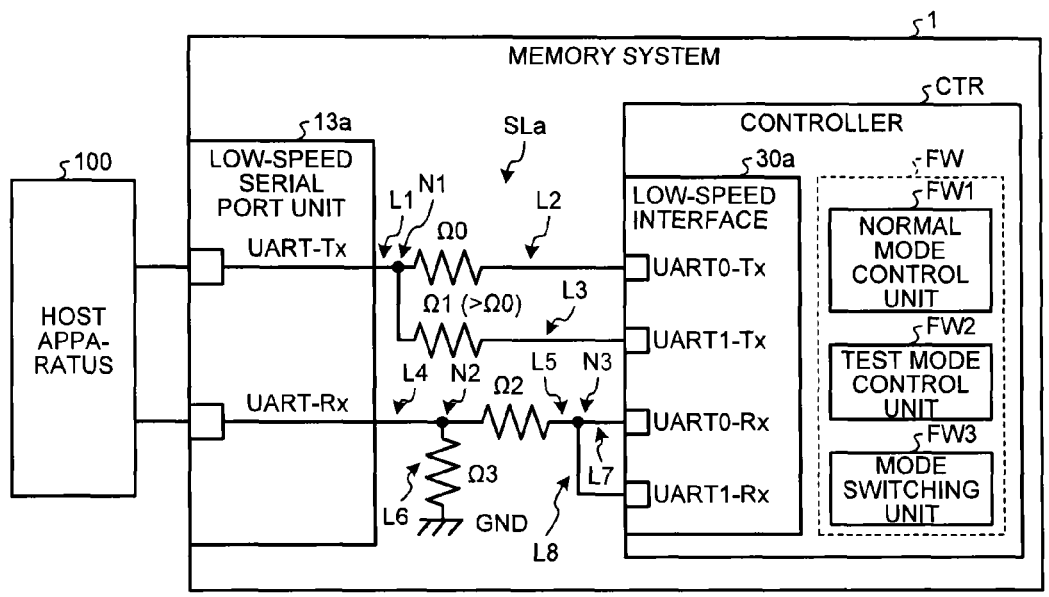
FIG. 5 is a diagram illustrating the structure of the memory system according to the first embodiment.

Specifically, the memory system 1 is configured as illustrated in FIG. 5. FIG. 5 is a diagram illustrating a structure related to the low-speed communication interface (the low-speed serial port unit 13a and the low-speed interface 30a) in the memory system 1.

The memory system 1 includes the low-speed serial port unit 13a, the controller CTR, and the low-speed lines SLa as the structure related to the low-speed communication interface.

The low-speed serial port unit 13a includes a transmitting port UART-Tx as the usable transmitting port and includes a receiving port UART-Rx as the usable receiving port.

The controller CTR includes the low-speed interface 30a and a mode control unit FW. The mode control unit FW includes a normal mode control unit FW1, a test mode control unit FW2, and a mode switching unit FW3.

The low-speed interface 30a includes a first output interface UART0-Tx, a second output interface UART1-Tx, a first input interface UART0-Rx, and a second input interface UART1-Rx.

The first output interface UART0-Tx is an interface for outputting a first signal selected from a plurality of first signals. The plurality of first signals includes a first voltage, a second voltage, and high impedance. The second voltage is lower than the first voltage. The first voltage is, for example, a high-level (for example, Vdd level) voltage. The second voltage is, for example, a low-level (for example, ground level) voltage. For example, the first output interface UART0-Tx is a UART0 communication output interface which outputs three values High, Low, and High-Z.

The second output interface UART1-Tx is an interface for outputting a second signal selected from a plurality of second signals. The plurality of second signals includes a third voltage and a fourth voltage. The fourth voltage is lower than the third voltage. The third voltage is, for example, a high-level (for example, Vdd level) voltage. The fourth voltage is, for example, a low-level (for example, ground level) voltage. For example, the second output interface UART1-Tx is a UART1 communication output interface which outputs two values High and Low.

The first input interface UART0-Rx is an interface for receiving the first signal selected from a plurality of first signals. For example, the first input interface UART0-Rx is a UART0 communication input interface which outputs three values High, Low, and High-Z.

The second input interface UART1-Rx is an interface for outputting the second signal selected from a plurality of second signals. For example, the second output interface UART1-Rx is a UART1 communication input interface which outputs two values High and Low.

The normal mode control unit FW1, the test mode control unit FW2, and the mode switching unit FW3 may be embedded in, for example, the controller CTR as hardware (for example, as circuits). Alternatively, the normal mode control unit FW1, the test mode control unit FW2, and the mode switching unit FW3 may be implemented in, for example, the controller CTR as software (for example, as function modules which are developed in the RAM 40 collectively or sequentially along with the progress of a process by the controller CTR). Alternatively, for each of the normal mode control unit FW1, the test mode control unit FW2, and the mode switching unit FW3, some of the functions may be embedded in the controller CTR as hardware and the other functions may be implemented in the controller CTR as software. For example, the normal mode control unit FW1 may be implemented in the memory controller 50. For example, the test mode control unit FW2 may be implemented in the IPL 55.

Figures 7, 8:
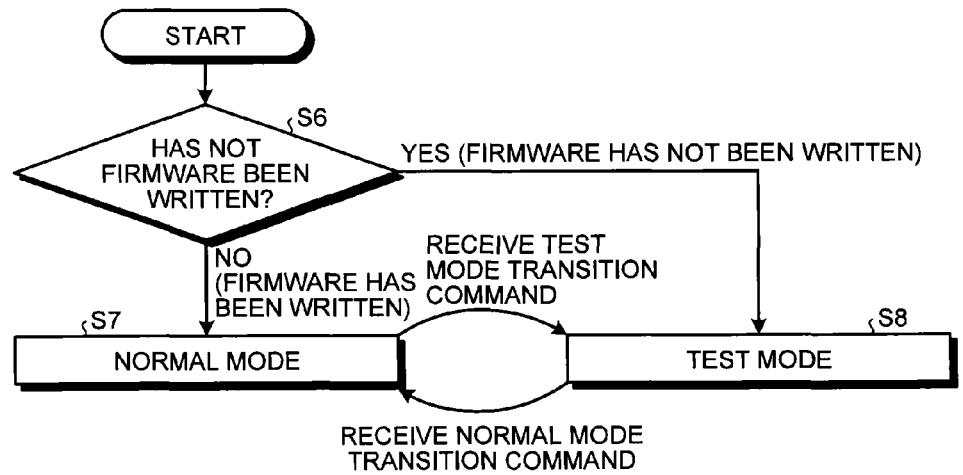
FIG. 7 is a diagram illustrating the operation of the memory system according to the first embodiment.
FIG. 8 is a state transition diagram related to the operation mode of a controller CTR.

The mode switching unit FW3 controls the operation mode of the controller CTR. For example, the mode switching unit FW3 switches the operation mode of the controller CTR to the normal mode and selectively gives a control right to the normal mode control unit FW1 of the normal mode control unit FW1 and the test mode control unit FW2. In addition, the mode switching unit FW3 switches, for example, the operation mode of the controller CTR to the test mode and selectively gives a control right to the test mode control unit FW2 of the normal mode control unit FW1 and the test mode control unit FW2. FIG. 8 is a state transition diagram related to the operation mode of the controller CTR.

For example, when the firmware 20a is read from the firmware storage area 20b (see FIG. 3) of the non-volatile semiconductor memory 20 during the startup of the controller CTR, the mode switching unit FW3 automatically selects the normal mode and selectively gives a control right to the normal mode control unit FW1 (Step S7).

For example, when a test mode transition command is received from the host apparatus 100 in the normal mode, the mode switching unit FW3 selects the test mode in response to the test mode transition command and selectively gives a control right to the test mode control unit FW2 (Step S8).

For example, if the firmware 20a has not been written to the non-volatile semiconductor memory 20 (particularly the firmware storage area 20b) when or after the controller CTR starts up ('Yes' in Step S6 of FIG. 8), the mode switching unit FW3 automatically selects the test mode and selectively gives a control right to the test mode control unit FW2 (Step S8).

For example, if the firmware 20a has been written to the non-volatile semiconductor memory 20 (particularly the firmware storage area 20b) when or after the controller CTR starts up ('No' in Step S6 of FIG. 8), the mode switching unit FW3 automatically selects the normal mode and selectively gives a control right to the normal mode control unit FW1 (Step S7).

The normal mode control unit FW1 controls the interface operation of the controller CTR in the normal mode. That is, the normal mode control unit FW1 performs control such that a low-speed interface operation is performed by a structure for UART0 communication in the low-speed interface 30a in the normal mode. For example, the normal mode control unit FW1 controls the first output interface UART0-Tx and the first input interface UART0-Rx in the normal mode.

For example, when a normal mode transition command is received from the host apparatus 100 in the test mode, the mode switching unit FW3 selects the normal mode in response to the normal mode transition command and selectively gives a control right to the normal mode control unit FW1 (Step S7).

For example, when the control right is given, the normal mode control unit FW1 recognizes a transition in the operation mode to the normal mode. When recognizing the transition in the operation mode to the normal mode, the normal mode control unit FW1 performs control such that the first signal output from the first output interface UART0-Tx is supplied as a signal to be transmitted to the transmitting port in the normal mode (first mode). Alternatively, the normal mode control unit FW1 performs control such that the first signal input from the first input interface UART0-Rx is selected as an input signal to the controller CTR in the normal mode. It is preferable that the normal mode control unit FW1 control the low-speed interface 30a and the high-speed interface 30b in parallel in order to perform communication using the low-speed interface and communication using the high-speed interface in parallel in the normal mode.

In the test mode, the test mode control unit FW2 controls the interface operation of the controller CTR. That is, the test mode control unit FW2 performs control such that a low-speed interface operation is performed by a structure for UART1 communication in the low-speed interface 30a in the test mode. For example, the test mode control unit FW2 controls the second output interface UART1-Tx and the second input interface UART1-Rx in the test mode. Preferably, the test mode control unit FW2 does not have the control function of the high-speed interface 30b in order to reduce the amount of mounting of the test mode control unit FW2 and simplify the mounting of test mode control unit FW2.

For example, when the control right is given, the test mode control unit FW2 recognizes a transition in the operation mode to the test mode. When recognizing the transition in the operation mode to the test mode, the test mode control unit FW2 performs control such that the second signal output from the second output interface UART1-Tx is supplied as the signal to be transmitted to the transmitting port in the test mode (second mode). Alternatively, the test mode control unit FW2 performs control such that the second signal input from the second input interface UART1-Rx is selected as the input signal to the controller CTR in the test mode.

For example, at least some of the low-speed lines SLa are mounted on the printed circuit board 2 (see FIGS. 1A, 1B). The low-speed lines SLa connect the low-speed serial port unit 13a and the low-speed interface 30a. For example, the low-speed lines SLa connect the transmitting port UART-Tx of the low-speed serial port unit 13a to the first output interface UART0-Tx of the low-speed interface 30a through a first resistor $\Omega 0$. In addition, for example, the low-speed lines SLa connect the transmitting port UART-Tx of the low-speed serial port unit 13a to the second output interface UART1-Tx of the low-speed interface 30a through a second resistor $\Omega 1$. The resistance value of the second resistor $\Omega 1$ is greater than that of the first resistor $\Omega 0$. For example, the low-speed lines SLa connect the receiving port UART-Rx of the low-speed serial port unit 13a to the first input interface UART0-Rx and the second input interface UART1-Rx of the low-speed interface 30a through a third resistor $\Omega 2$.

Specifically, the low-speed lines SLa include lines L1 to L8, nodes N1 to N3, the first resistor $\Omega 0$, the second resistor $\Omega 1$, the third resistor $\Omega 2$, and a fourth resistor $\Omega 3$.

The line L1 connects the transmitting port UART-Tx and the node N1. The line L2 connects the node N1 and the first output interface UART0-Tx. The line L3 connects the node N1 and the second output interface UART1-Tx.

The first resistor $\Omega 0$ is provided on the line L2. The second resistor $\Omega 1$ is provided on the line L3. The first resistor $\Omega 0$ and the second resistor $\Omega 1$ may be, for example, resistive elements which are mounted on the printed circuit board 2 (see FIGS. 1A, 1B). The resistance value of the second resistor $\Omega 1$ is greater than that of the first resistor $\Omega 0$.

For example, the resistance value of the second resistor $\Omega 1$ is greater than that of the first resistor $\Omega 0$ such that the first signal output from the first output interface UART0-Tx can be supplied to the transmitting port UART-Tx when the fixed-level second signal is output from the second output interface UART1-Tx in the normal mode (first mode).

That is, the resistance value of the second resistor $\Omega 1$ is greater than that of the first resistor $\Omega 0$ such that the first voltage and/or the second voltage (for example, a signal changed between the high level and the low level) output from the first output interface UART0-Tx can be supplied to the transmitting port UART-Tx when the third voltage (for example, a high-level voltage) is steadily output from the second output interface UART1-Tx in the normal mode (first mode).

For example, the resistance value of the second resistor $\Omega 1$ is about ten times more than that of the first resistor $\Omega 0$. For example, when the resistance value of the first resistor $\Omega 0$ is 100 ($\Omega$), the resistance value of the second resistor $\Omega 1$ can be 1 (k$\Omega$).

The line L4 connects the receiving port UART-Rx and the node N2. The line L5 connects the node N2 and the node N3. The line L6 connects the node N2 and ground potential GND. The line L7 connects the node N3 and the first input interface UART0-Rx. The line L8 connects the node N3 and the second input interface UART1-Rx.

The third resistor $\Omega 2$ is provided on the line L5. The fourth resistor $\Omega 3$ is provided on the line L6. In this way, the potential of the node N2 is pulled down to the ground potential GND through the fourth resistor $\Omega 3$.

Figure 6:
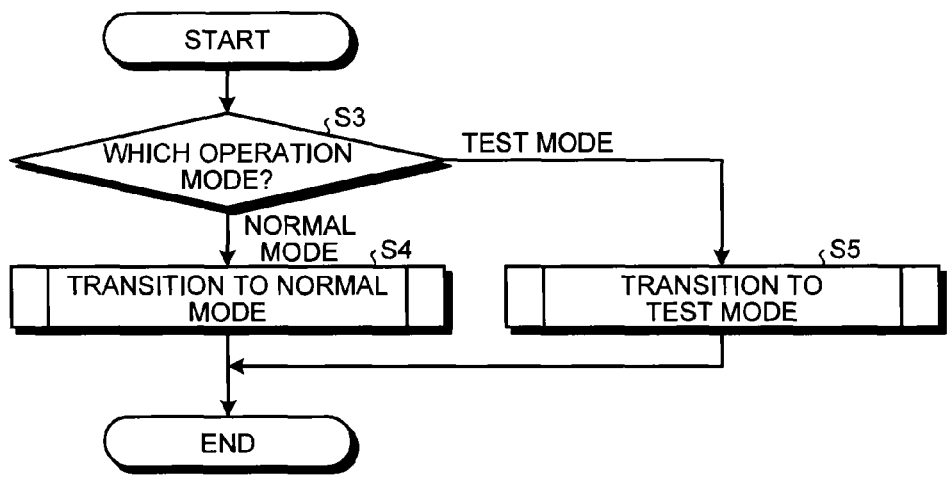
FIG. 6 is a flowchart illustrating a transition in the operation mode of the memory system according to the first embodiment.

Next, the operation of the memory system 1 will be described with reference to FIGS. 6 and 7. FIG. 6 is a flowchart illustrating a transition in the operation mode of the memory system 1. FIG. 7 is a diagram illustrating the operation of the memory system 1.

In Step S3, the controller CTR determines the operation mode to be performed.

For example, when the firmware 20a is read from the firmware storage area 20b of the non-volatile semiconductor memory 20 at the time the controller CTR starts up, the controller CTR determines that an operation needs to be performed in the normal mode and the process proceeds to Step S4. Alternatively, for example, when a test mode transition command is received from the host apparatus 100 in the normal mode, the controller CTR determines that an operation needs to be performed in the test mode and the process proceeds to Step S5. Alternatively, for example, if the firmware 20a has not been written to the non-volatile semiconductor memory 20 (particularly the firmware storage area 20b) when or after the controller CTR starts up, the controller CTR determines that an operation needs to be performed in the test mode and the process proceeds to Step S5.

In Step S4, the controller CTR performs a transition to the normal mode.

For example, when a signal is transmitted after the operation mode is changed to the normal mode, the controller CTR outputs the first voltage and/or the second voltage (for example, a signal changed between the high level and the low level) from the first output interface UART0-Tx and steadily outputs the third voltage (for example, a high-level voltage) from the second output interface UART1-Tx. For example, the controller CTR uses an output φUART0-Tx from the first output interface UART0-Tx as a signal which changes between the high level and the low level and is to be transmitted, with an output φUART1-Tx from the second output interface UART1-Tx pulled up to the high level (see FIG. 7).

In this case, the resistance value of the second resistor Ω1 is greater than that of the first resistor Ω0 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx in the normal mode (first mode). In this way, in the normal mode (first mode), the drivability of the output φUART0-Tx from the first output interface UART0-Tx is larger than the drivability of the output φUART1-Tx from the second output interface UART1-Tx, and the output φUART0-Tx from the first output interface UART0-Tx is supplied as the signal to be transmitted to the transmitting port UART-Tx. Then, the transmitting port UART-Tx transmits the signal to be transmitted to the host apparatus 100.

Alternatively, for example, when the controller CTR receives a signal, the received signal (for example, a signal transitions between the high level and the low level) is input to the first input interface UART0-Rx and the second input interface UART1-Rx. Then, the controller CTR receives an input φUART0-Rx to the first input interface UART0-Rx as the input signal to the controller CTR and ignores an input φUART1-Rx to the second input interface UART1-Rx (see FIG. 7). That is, the controller CTR performs control such that the first signal (φUART0-Rx) input from the first input interface UART0-Rx is selected as the input signal to the controller CTR.

In Step S5, the controller CTR performs a transition to the test mode.

For example, when a signal is transmitted after the operation mode has transitioned to the test mode, the controller CTR outputs the third voltage and/or the fourth voltage (for example, a signal transitions between the high level and the low level) from the second output interface UART1-Tx and outputs high impedance from the first output interface UART0-Tx. For example, the controller CTR uses the output φUART1-Tx from the second output interface UART1-Tx as the signal which transitions between the high level and the low level and is to be transmitted, with the output φUART0-Tx from the first output interface UART0-Tx set to high impedance (see FIG. 7).

In this case, the output φUART1-Tx from the second output interface UART1-Tx is supplied as the signal to be transmitted to the transmitting port UART-Tx. Then, the transmitting port UART-Tx transmits the signal to be transmitted to the host apparatus 100.

Alternatively, for example, when the controller CTR receives a signal, the received signal (for example, a signal transitions between the high level and the low level) is input to the first input interface UART0-Rx and the second input interface UART1-Rx. Then, the controller CTR receives the input φUART1-Rx to the second input interface UART1-Rx as the input signal to the controller CTR and ignores the input φUART0-Rx to the first input interface UART0-Rx (see FIG. 7). That is, the controller CTR performs control such that the second signal (φUART1-Rx) input from the second input interface UART1-Rx is selected as the input signal to the controller CTR.

Figure 9:
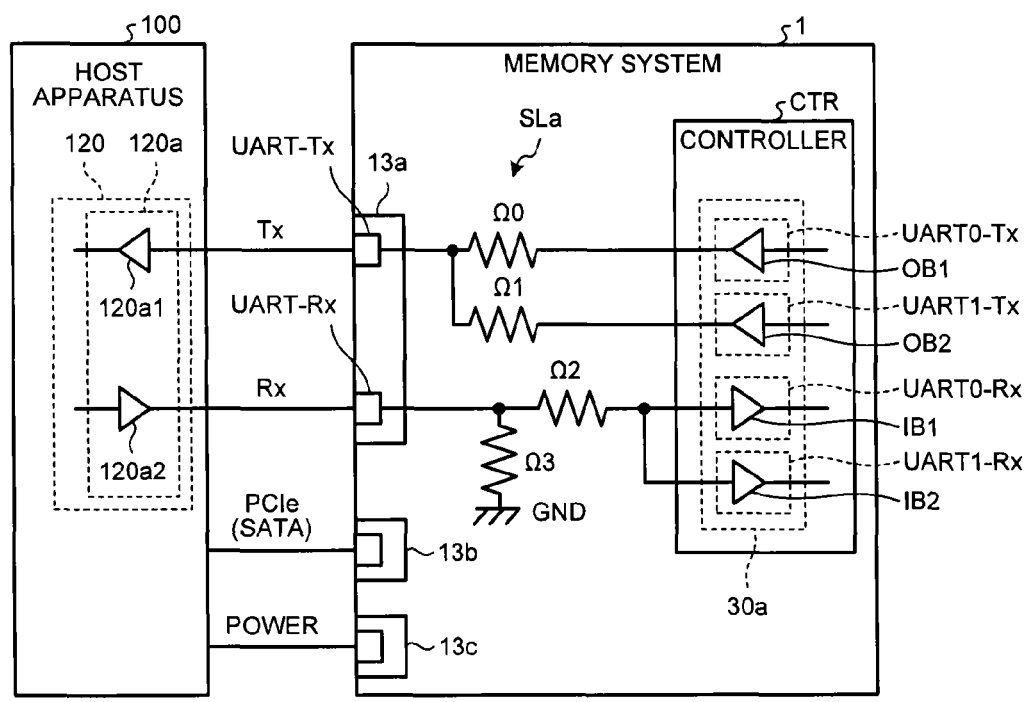
FIG. 9 is a diagram illustrating the structures of a first output interface, a second output interface, a first input interface, and a second input interface in the first embodiment.

Next, the structure of the first output interface UART0-Tx, the second output interface UART1-Tx, the first input interface UART0-Rx, and the second input interface UART1-Tx will be described with reference to FIG. 9. FIG. 9 is a diagram illustrating the structure of the first output interface UART0-Tx, the second output interface UART1-Tx, the first input interface UART0-Rx, and the second input interface UART1-Rx.

In the low-speed interface 30a, the first output interface UART0-Tx includes a first output buffer OB1. When a signal is received from the normal mode control unit FW1 (see FIG. 5), the first output buffer OB1 supplies a signal corresponding to the received signal as the output φUART0-Tx to the transmitting port UART-Tx through the low-speed lines SLa.

The second output interface UART1-Tx includes a second output buffer OB2. When a signal is received from the test mode control unit FW2, the second output buffer OB2 supplies a signal corresponding to the received signal as the output φUART1-Tx to the transmitting port UART-Tx through the low-speed lines SLa.

The first input interface UART0-Rx includes a first input buffer IB1. The first input buffer IB1 receives a signal from the receiving port UART-Rx through the low-speed lines Sla and transmits a signal corresponding to the received signal as the input φUART0-Rx to the normal mode control unit FW1.

The second input interface UART1-Rx includes a second input buffer IB2. The second input buffer IB2 receives a signal from the receiving port UART-Rx through the low-speed line Sla and transmits a signal corresponding to the received signal as the input φUART1-Rx to the test mode control unit FW2.

The low-speed driver 120a (see FIG. 3) of the interface driver 120 includes a receiving driver 120a1 and a transmitting driver 120a2. The receiving driver 120a1 is connected to the transmitting port UART-Tx of the low-speed serial port unit 13a through the communication line Tx. The transmitting driver 120a2 is connected to the receiving port UART-Rx of the low-speed serial port unit 13a through the communication line Rx.

For example, the signal which is transmitted from the transmitting port UART-Tx to the host apparatus 100 is received by the receiving driver 120a1 of the host apparatus 100. For example, the signal which is transmitted from the transmitting driver 120a2 of the host apparatus 100 to the memory system 1 is received by the receiving port UART-Rx of the memory system 1.

Figure 10:
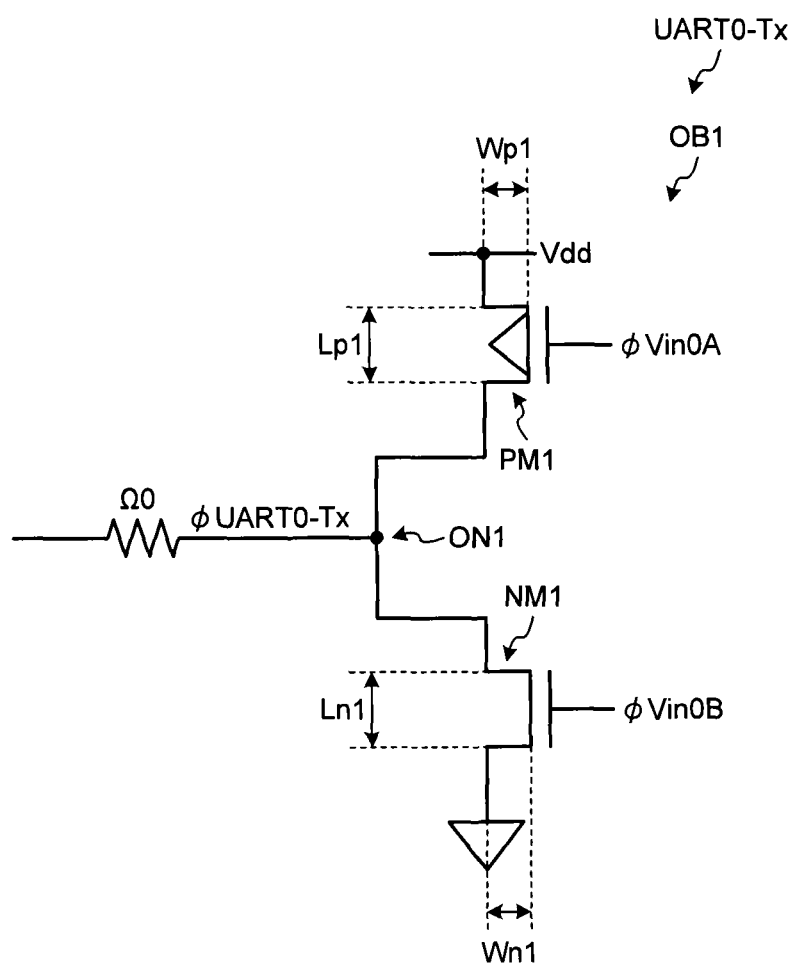
FIG. 10 is a diagram illustrating the structure of the first output interface in the first embodiment.

Next, the internal structure of the first output interface UART0-Tx will be described with reference to FIG. 10. FIG. 10 is a diagram illustrating the internal structure of the first output interface UART0-Tx.

The first output interface UART0-Tx includes the first output buffer OB1. As illustrated in FIG. 10, the first output buffer OB1 includes a first PMOS transistor PM1 and a first NMOS transistor NM1.

The first PMOS transistor PM1 includes, for example, a source connected to a power supply potential Vdd, a drain connected to an output node ON1, and a gate connected to the normal mode control unit FW1. For example, the first PMOS transistor PM1 has a channel length Lp1 and a channel width Wp1. The first PMOS transistor PM1 receives a control signal φVin0A from the normal mode control unit FW1 through the gate.

The first NMOS transistor NM1 includes, for example, a source connected to the ground potential GND, a drain connected to the output node ON1, and a gate connected to the normal mode control unit FW1. For example, the first NMOS transistor NM1 has a channel length Ln1 and a channel width Wn1. The first NMOS transistor NM1 receives a control signal φVin0B from the normal mode control unit FW1 through the gate.

Figures 11, 12:
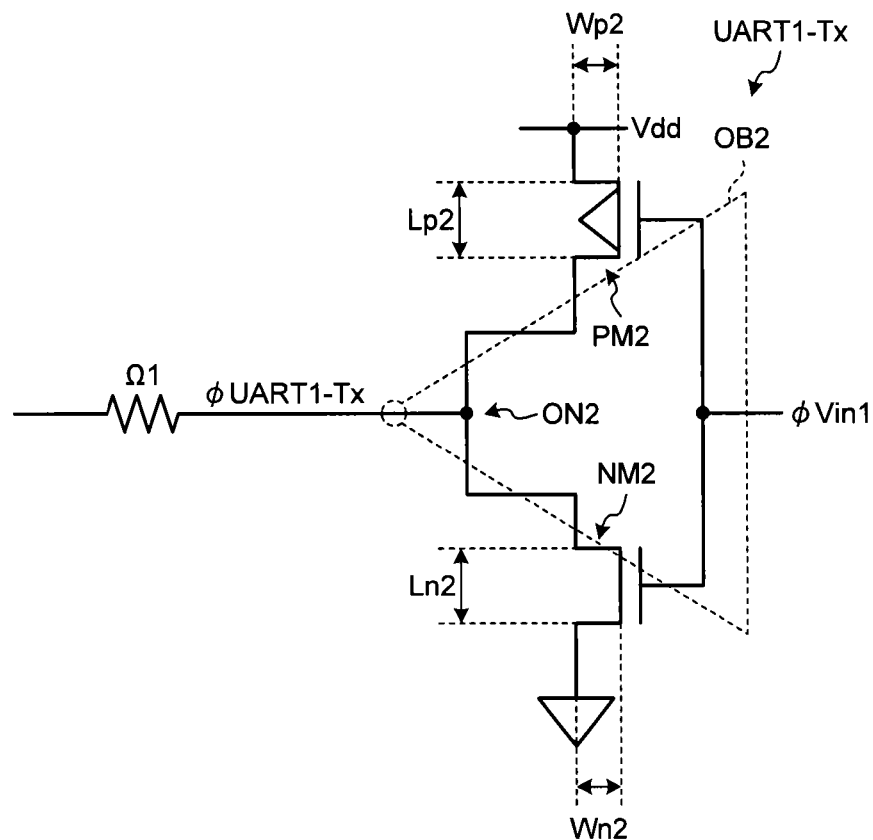
FIG. 11 is a diagram illustrating the operation of the first output interface in the first embodiment.
FIG. 12 is a diagram illustrating the structure of the second output interface in the first embodiment.

Next, the operation of the first output interface UART0-Tx will be described with reference to FIG. 11. FIG. 11 is a diagram illustrating the operation of the first output interface UART0-Tx.

As illustrated in FIG. 11, for example, when both the control signals φVin0A and φVin0B are at the high level, the first PMOS transistor PM1 is turned off and the first NMOS transistor NM1 is turned on. Then, the voltage of the output node ON1 becomes the second voltage (for example, a low-level voltage). That is, when the first PMOS transistor PM1 is turned off and the first NMOS transistor NM1 is turned on, the first output interface UART0-Tx outputs the second voltage (for example, a low-level voltage) as the output φUART0-Tx.

For example, when both the control signals φVin0A and φVin0B are at the low level, the first PMOS transistor PM1 is turned on and the first NMOS transistor NM1 is turned off. Then, the voltage of the output node ON1 becomes the first voltage (for example, a high-level voltage). That is, when the first PMOS transistor PM1 is turned on and the first NMOS transistor NM1 is turned off, the first output interface UART0-Tx outputs the first voltage (for example, a high-level voltage) as the output φUART0-Tx.

For example, when the control signal φVin0A is at the high level and the control signal φVin0B is at the low level, the first PMOS transistor PM1 is turned off and the first NMOS transistor NM1 is turned off. Then, the output node ON1 is set to high impedance. That is, when the first PMOS transistor PM1 is turned off and the first NMOS transistor NM1 is turned off, the first output interface UART0-Tx outputs high impedance as the output φUART0-Tx.

Next, the internal structure of the second output interface UART1-Tx will be described with reference to FIG. 12. FIG. 12 is a diagram illustrating the internal structure of the second output interface UART1-Tx.

The second output interface UART1-Tx includes the second output buffer OB2. As illustrated in FIG. 12, the second output buffer OB2 includes a second PMOS transistor PM2 and a second NMOS transistor NM2.

The second PMOS transistor PM2 includes, for example, a source connected to the power supply potential Vdd, a drain connected to an output node ON2, and a gate connected to the test mode control unit FW2. For example, the second PMOS transistor PM2 has a channel length Lp2 and a channel width Wp2. The second PMOS transistor PM2 receives a control signal φVin1 from the test mode control unit FW2 through the gate.

The dimension (=W/L, W: a channel width and L: a channel length) of the second PMOS transistor PM2 may be equivalent to those of the first PMOS transistor PM1 (see FIG. 10). For example, the channel length Lp2 of the second PMOS transistor PM2 may be equivalent to the channel length Lp1 of the first PMOS transistor PM1 (see FIG. 10). For example, the channel width Wp2 of the second PMOS transistor PM2 may be equivalent to the channel width Wp1 of the first PMOS transistor PM1 (see FIG. 10).

The second NMOS transistor NM2 includes, for example, a source connected to the ground potential GND, a drain connected to the output node ON2, and a gate connected to the test mode control unit FW2. For example, the second NMOS transistor NM2 has a channel length Ln2 and a channel width Wn2. The second NMOS transistor NM2 receives the control signal φVin1 from the test mode control unit FW2 through the gate.

The dimension (=W/L, W: a channel width and L: a channel length) of the second NMOS transistor NM2 may be equivalent to those of the first NMOS transistor NM1 (see FIG. 10). For example, the channel length Ln2 of the second NMOS transistor NM2 may be equivalent to the channel length Ln1 of the first NMOS transistor NM1 (see FIG. 10). For example, the channel width Wn2 of the second NMOS transistor NM2 may be equivalent to the channel width Wn1 of the first NMOS transistor NM1 (see FIG. 10).

Figures 13, 14:
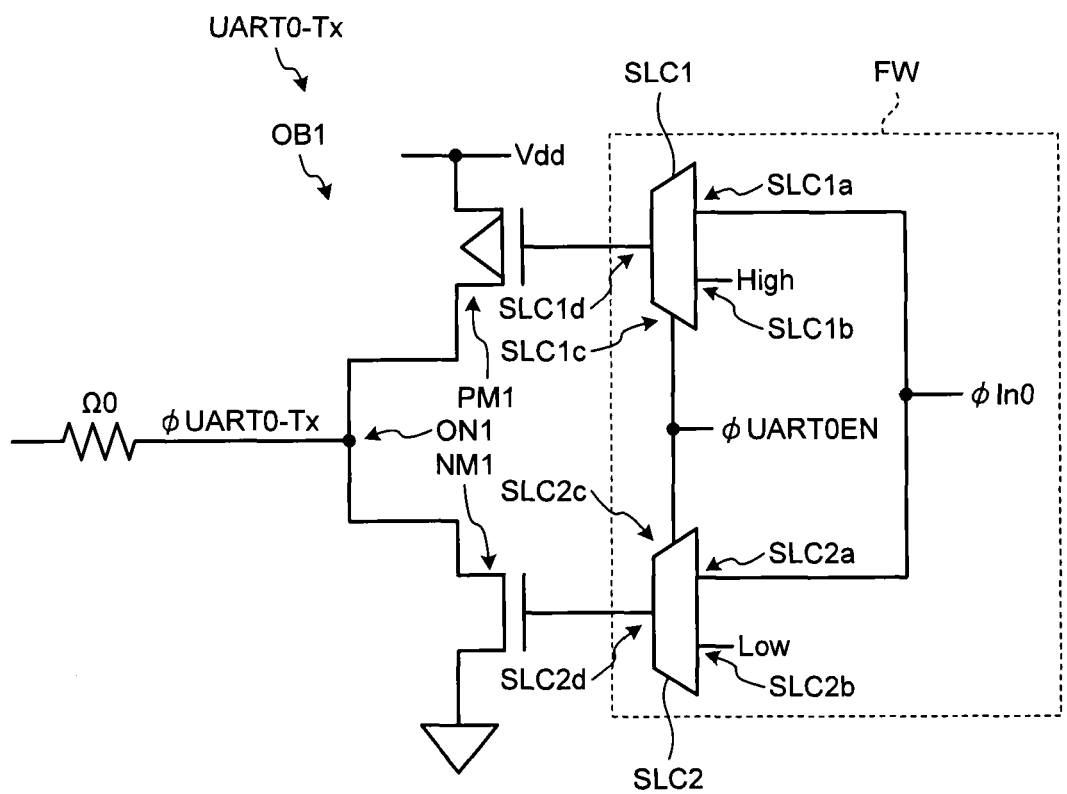
FIG. 13 is a diagram illustrating the operation of the second output interface in the first embodiment.
FIG. 14 is a diagram illustrating the structure of a mode control unit in the first embodiment.

Next, the operation of the second output interface UART1-Tx will be described with reference to FIG. 13. FIG. 13 is a diagram illustrating the operation of the second output interface UART1-Tx.

As illustrated in FIG. 13, for example, when the control signal φVin1 is at the high level, the second PMOS transistor PM2 is turned off and the second NMOS transistor NM2 is turned on. Then, the voltage of the output node ON2 becomes the fourth voltage (for example, a low-level voltage). That is, when the second PMOS transistor PM2 is turned off and the second NMOS transistor NM2 is turned on, the second output interface UART1-Tx outputs the fourth voltage (for example, a low-level voltage) as the output φUART1-Tx.

For example, when the control signal φVin1 is at the low level, the second PMOS transistor PM2 is turned on and the second NMOS transistor NM2 is turned off. Then, the voltage of the output node ON2 becomes the third voltage (for example, a high-level voltage). That is, when the second PMOS transistor PM2 is turned on and the second NMOS transistor NM2 is turned off, the second output interface UART1-Tx outputs the third voltage (for example, a high-level voltage) as the output φUART1-Tx.

Next, a structure for controlling the first output interface UART0-Tx in the mode control unit FW will be described with reference to FIG. 14. FIG. 14 is a diagram illustrating the structure for controlling the first output interface UART0-Tx in the mode control unit FW.

The mode control unit FW includes, for example, a selector SLC1 and a selector SLC2 as the structure for controlling the first output interface UART0-Tx.

The selector SLC1 receives a transmission control signal φIn0 using an input terminal SLC1 a, receives a voltage fixed to the high level using an input terminal SLC1 b, and receives a control signal φUART0EN using a control terminal SLC1 c.

For example, when an active-level (for example, high-level) control signal φUART0EN is received, the selector SLC1 selects the input terminal SLC1 a and supplies the transmission control signal φIn0 as the control signal φVin0 A (see FIG. 10) to the first PMOS transistor PM1.

For example, when a non-active-level (for example, low-level) control signal φUART0EN is received, the selector SLC1 selects the input terminal SLC1 b and supplies a voltage fixed to the high level as the control signal φVin0 A (see FIG. 10) to the first PMOS transistor PM1.

The selector SLC2 receives the transmission control signal φIn0 using an input terminal SLC2 a, receives a voltage fixed to the low level using an input terminal SLC2 b, and receives the control signal φUART0EN using a control terminal SLC2 c.

For example, when an active-level control signal φUART0EN is received, the selector SLC2 selects the input terminal SLC2 a and supplies the transmission control signal φIn0 as the control signal φVin0 B (see FIG. 10) to the first NMOS transistor NM1.

For example, when a non-active-level control signal φUART0EN is received, the selector SLC2 selects the input terminal SLC2 b and supplies a voltage fixed to the low level as the control signal φVin0 B (see FIG. 10) to the first NMOS transistor NM1.

Figure 15:
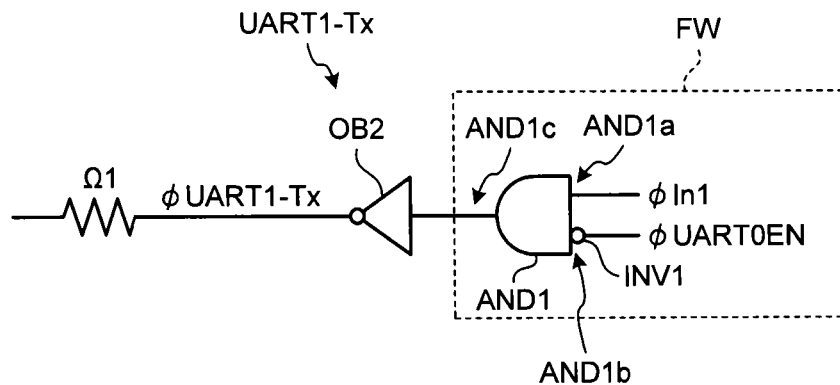
FIG. 15 is a diagram illustrating the structure of the mode control unit in the first embodiment.

Next, a structure for controlling the second output interface UART1-Tx in the mode control unit FW will be described with reference to FIG. 15. FIG. 15 is a diagram illustrating the structure for controlling the second output interface UART1-Tx in the mode control unit FW.

The mode control unit FW includes, for example, an AND gate AND1 and an inverter INV1 as the structure for controlling the second output interface UART1-Tx.

The inverter INV1 logically inverts the control signal φUART0EN to generate a control signal φUART0EN⁻ and supplies the control signal φUART0EN⁻ to the AND gate AND1. A signal common to the structure illustrated in FIG. 14 and the structure illustrated in FIG. 15 may be used as the control signal φUART0EN.

The AND gate AND1 receives a transmission control signal φIn1 using an input terminal AND1a, receives the control signal φUART0EN⁻ using an input terminal AND1b, calculates the logical product of the transmission control signal φIn1 and the control signal φUART0EN⁻, and outputs the calculation result from the output terminal AND1c.

For example, when an active-level (for example, high-level) control signal φUART0EN⁻ is received, the AND gate AND1 supplies the transmission control signal φIn1 as the control signal φVin1 (see FIG. 12) to the second PMOS transistor PM2 and the second NMOS transistor NM2, respectively.

For example, when a non-active-level (for example, low-level) control signal φUART0EN⁻ is received, the AND gate AND1 supplies a voltage fixed to the low level as the control signal φVin1 (see FIG. 12) to the second PMOS transistor PM2 and the second NMOS transistor NM2, respectively.

Figure 16:
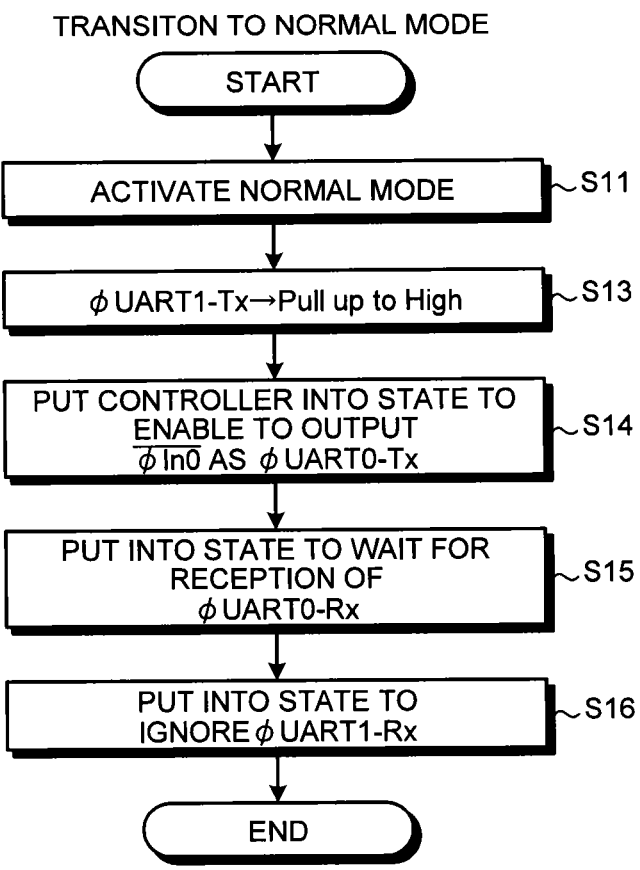
FIG. 16 is a flowchart illustrating a transition in the operation mode to the normal mode in the first embodiment.

Next, the operation (Step S4 in FIG. 6) in the normal mode will be described in detail with reference to FIG. 16. FIG. 16 is a flowchart illustrating a transition to the normal mode in the controller CTR.

In Step S11, the controller CTR activates the normal mode. For example, the mode control unit FW changes the control signal φUART0EN to an active level (for example, a high level) and gives a control right to the normal mode control unit FW1.

In Step S13, the controller CTR pulls up the output φUART1-Tx from the second output interface UART1-Tx to the high level. For example, the normal mode control unit FW1 controls the second output interface UART1-Tx such that the output φUART1-Tx from the second output interface UART1-Tx is pulled up to the high level.

For example, since the control signal φUART0EN⁻ changes to a non-active level (for example, a low level), the AND gate AND1 (see FIG. 15) supplies a voltage fixed to the low level as the control signal φVin1 (see FIG. 12) to the second PMOS transistor PM2 and the second NMOS transistor NM2. Then, the second PMOS transistor PM2 and the second NMOS transistor NM2 logically invert the voltage fixed to the low level to generate a voltage fixed to the high level and output the voltage fixed to the high level as the output φUART1-Tx.

In Step S14, the controller CTR is put into a state in which the controller CTR can supply the output φUART0-Tx from the first output interface UART0-Tx as the signal to be transmitted from the first output interface UART0-Tx to the transmitting port UART-Tx through the low-speed line SLa. For example, the normal mode control unit FW1 controls the first output interface UART0-Tx such that a signal φIn0⁻ obtained by logically inverting the transmission control signal φIn0 can be output as the output φUART0-Tx from the first output interface UART0-Tx.

For example, the selector SLC1 (see FIG. 14) selects the input terminal SLC1 a and supplies the transmission control signal φIn0 as the control signal φVin0 A (see FIG. 10) to the first PMOS transistor PM1. The selector SLC2 (see FIG. 14) selects the input terminal SLC2 a and supplies the transmission control signal φIn0 as the control signal φVin0 B (see FIG. 10) to the first NMOS transistor NM1. Then, the first PMOS transistor PM1 and the first NMOS transistor NM1 logically invert the transmission control signal φIn0 to generate the signal φIn0⁻ and output the signal φIn0⁻ as the output φUART0-Tx.

In Step S15, the controller CTR is put into a state (a state waiting for reception) in which the controller CTR can receive the input φUART0-Rx to the first input interface UART0-Rx as the input signal to the controller CTR.

In Step S16, the controller CTR is put into a state (an ignoring state) in which the controller CTR can ignore the input φUART1-Rx to the second input interface UART1-Rx.

Figure 17:
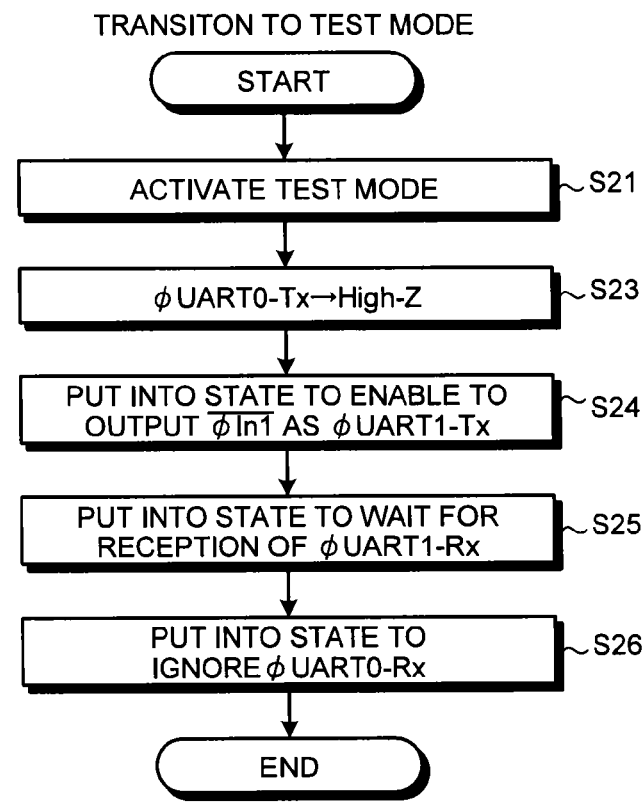
FIG. 17 is a flowchart illustrating a transition in the operation mode to the test mode in the first embodiment.

Next, the operation in the test mode (Step S5 in FIG. 6) will be described in detail with reference to FIG. 17. FIG. 17 is a flowchart illustrating a transition in the operation mode to the test mode in the controller CTR.

In Step S21, the controller CTR activates the test mode. For example, the mode control unit FW changes the control signal φUART0EN to a non-active level (for example, a low level) and gives a control right to the test mode control unit FW2.

In Step S23, the controller CTR sets the output φUART0-Tx from the first output interface UART0-Tx to high impedance. For example, the test mode control unit FW2 controls the first output interface UART0-Tx such that the output φUART0-Tx from the first output interface UART0-Tx is set to high impedance.

For example, the selector SLC1 (see FIG. 14) selects the input terminal SLC1 b and supplies a voltage fixed to the high level as the control signal φVin0 A (see FIG. 10) to the first PMOS transistor PM1. The selector SLC2 (see FIG. 14) selects the input terminal SLC2 b and supplies a voltage fixed to the low level as the control signal φVin0 B (see FIG. 10) to the first NMOS transistor NM1. Then, the first PMOS transistor PM1 and the first NMOS transistor NM1 are both turned off such that the output node ON1 is set to high impedance and outputs the high impedance as the output φUART0-Tx.

In Step S24, the controller CTR is put into a state in which the controller CTR can supply the output φUART1-Tx from the second output interface UART1-Tx as the signal to be transmitted from the second output interface UART1-Tx to the transmitting port UART-Tx through the low-speed line SLa. For example, the test mode control unit FW2 controls the second output interface UART1-Tx such that the signal φIn1⁻ obtained by logically inverting the transmission control signal φIn1 to be transmitted can be output as the output φUART1-Tx from the second output interface UART1-Tx.

For example, since the control signal φUART0EN⁻ changes to an active level (for example, a high level), the AND gate AND1 (see FIG. 15) supplies the transmission control signal φIn1 as the control signal φVin1 (see FIG. 12) to the second PMOS transistor PM2 and the second NMOS transistor NM2, respectively. Then, the second PMOS transistor PM2 and the second NMOS transistor NM2 logically invert the transmission control signal φIn1 to generate the signal φIn1⁻ and output the signal φIn1⁻ as the output φUART1-Tx.

In Step S25, the controller CTR is put into a state (a state waiting for reception) in which the controller CTR can receive the input φUART1-Rx to the second input interface UART1-Rx as the input signal to the controller CTR.

In Step S26, the controller CTR is put into a state (an ignoring state) in which the controller CTR can ignore the input φUART0-Rx to the first input interface UART0-Rx.

As such, in the memory system 1 according to the first embodiment, the first output interface UART0-Tx of the low-speed interface 30a in the controller CTR is connected to the transmitting port UART-Tx of the low-speed serial port unit 13a through the first resistor Ω0. In addition, the second output interface UART1-Tx of the low-speed interface 30a in the controller CTR is connected to the transmitting port UART-Tx of the low-speed serial port unit 13a through the second resistor Ω1. That is, the first output interface UART0-Tx and the second output interface UART1-Tx of the controller CTR share the transmitting port UART-Tx of the connector 13.

In this case, the resistance value of the second resistor Ω1 is greater than that of the first resistor Ω0. For example, the resistance value of the second resistor Ω1 is greater than that of the first resistor Ω0 such that the first signal output from the first output interface UART0-Tx can be supplied to the transmitting port UART-Tx when the fixed-level second signal is output from the second output interface UART1-Tx in the normal mode (first mode). That is, the resistance value of the second resistor Ω1 is greater than that of the first resistor Ω0 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx in the normal mode (first mode).

With this arrangements, for example, in the normal mode (first mode), the drivability of the output φUART0-Tx from the first output interface UART0-Tx is larger than the drivability of the output φUART1-Tx from the second output interface UART1-Tx, and the output φUART0-Tx from the first output interface UART0-Tx can be supplied as the signal to be transmitted to the transmitting port UART-Tx. That is, when a signal is transmitted, it is possible to prevent the signals output from the first output interface UART0-Tx and the second output interface UART1-Tx from being mixed up and transmit an appropriate signal. In other words, it is possible to reduce the number of transmitting ports UART-Tx (the number of pins) required to transmit an appropriate signal (for example, to 1).

In the first embodiment, the controller CTR outputs the first signal which is selected from a plurality of first signals including high impedance from the first output interface UART0-Tx and outputs the second signal which is selected from a plurality of second signals without including high impedance from the second output interface UART1-Tx. Therefore, when the output φUART1-Tx from the second output interface UART1-Tx is to be supplied as the signal to be transmitted to the transmitting port UART-Tx, the output φUART0-Tx from the first output interface UART0-Tx is set to high impedance and it is possible to supply the output φUART1-Tx from the second output interface UART1-Tx as the signal to be transmitted to the transmitting port UART-Tx. That is, when a signal is transmitted, it is possible to prevent the signals output from the first output interface UART0-Tx and the second output interface UART1-Tx from being mixed up and transmit an appropriate signal.

In the first embodiment, the controller CTR supplies the first signal output from the first output interface UART0-Tx as the signal to be transmitted to the transmitting port UART-Tx in the normal mode (first mode) and supplies the second signal output from the second output interface UART1-Tx as the signal to be transmitted to the transmitting port UART-Tx in the test mode (second mode). Therefore, it is possible to transmit an appropriate signal in each operation mode.

In the first embodiment, the first input interface UART0-Rx and the second input interface UART1-Rx of the controller CTR share the receiving port UART-Rx of the connector 13. In this case, in the normal mode (first mode), the controller CTR receives the value input to the first input interface UART0-Rx as the received signal and ignores the value input to the second input interface UART1-Rx. In the test mode (second mode), the controller CTR receives the value input to the second input interface UART1-Rx as the received signal and ignores the value input to the first input interface UART0-Rx. Therefore, it is possible to receive and process an appropriate signal in each operation mode.

When a signal is received and processed, it is possible to prevent he signals received by the first input interface UART0-Rx and the second input interface UART1-Rx from being mixed up and receive and process an appropriate signal. In other words, it is possible to reduce the number of receiving ports UART-Rx (the number of pins) required to receive and process an appropriate signal (for example, to 1).

In the memory system 1 according to the first embodiment, the resistance value of the second resistor Ω1 is greater than that of the first resistor Ω0 such that the first signal output from the first output interface UART0-Tx can be supplied to the transmitting port UART-Tx when the fixed-level second signal is output from the second output interface UART1-Tx in the normal mode (first mode). Therefore, in the normal mode (first mode), it is possible to supply the output φUART0-Tx from the first output interface UART0-Tx as the signal to be transmitted to the transmitting port UART-Tx.

In the first embodiment, in the normal mode (first mode), the controller CTR outputs the first voltage and/or the second voltage (for example, a signal transitions between the high level and the low level) from the first output interface UART0-Tx and steadily outputs the third voltage (for example, a high-level voltage) from the second output interface UART1-Tx. In the test mode (second mode), the controller CTR outputs high impedance from the first output interface UART0-Tx and outputs the third voltage and/or the fourth voltage (for example, a signal transitions between the high level and the low level) from the second output interface UART1-Tx. Therefore, it is possible to supply the first signal output from the first output interface UART0-Tx as the signal to be transmitted to the transmitting port UART-Tx in the normal mode (first mode) and supply the second signal output from the second output interface UART1-Tx as the signal to be transmitted to the transmitting port UART-Tx in the test mode (second mode).

In the memory system 1 according to the first embodiment, the resistance value of the second resistor Ω1 is greater than that of the first resistor Ω0 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx in the normal mode (first mode). Therefore, in the normal mode (first mode), the output ϕUART0-Tx from the first output interface UART0-Tx can be supplied as the signal to be transmitted to the transmitting port UART-Tx.

In the first embodiment, in the normal mode (first mode), the controller CTR supplies the first voltage and/or the second voltage (for example, a signal transitions between the high level and the low level) output from the first output interface UART0-Tx as the signal to be transmitted to the transmitting port UART-Tx. In addition, in the test mode (second mode), the controller CTR supplies the third voltage and/or the fourth voltage (for example, a signal transitions between the high level and the low level) output from the second output interface UART1-Tx as the signal to be transmitted to the transmitting port UART-Tx. Therefore, it is possible to transmit an appropriate signal in each operation mode.

In the first embodiment, the first output interface UART0-Tx includes the first output buffer OB1 including the first PMOS transistor PM1 and the first NMOS transistor NM1. The first output interface UART0-Tx outputs the first voltage (for example, a high-level voltage) when the first PMOS transistor PM1 is turned on and the first NMOS transistor NM1 is turned off, outputs the second voltage (for example, a low-level voltage) when the first PMOS transistor PM1 is turned off and the first NMOS transistor NM1 is turned on, and outputs high impedance when the first PMOS transistor PM1 is turned off and the first NMOS transistor NM1 is turned off. Therefore, it is possible to achieve the first output interface UART0-Tx which can output the first voltage and/or the second voltage (for example, a signal transitions between the high level and the low level) in the normal mode (first mode) and can output high impedance in the test mode (second mode) with a simple structure.

In the first embodiment, the second output interface UART1-Tx includes the second output buffer OB2 including the second PMOS transistor PM2 and the second NMOS transistor NM2. The second output interface UART1-Tx outputs the third voltage (for example, a high-level voltage) when the second PMOS transistor PM2 is turned on and the second NMOS transistor NM2 is turned off and outputs the fourth voltage (for example, a low-level voltage) when the second PMOS transistor PM2 is turned off and the second NMOS transistor NM2 is turned on. Therefore, it is possible to achieve the second output interface UART1-Tx which can steadily output the third voltage (for example, a high-level voltage) in the normal mode (first mode) and can output the third voltage and/or the fourth voltage (for example, a signal transitions between the high level and the low level) in the test mode (second mode) with a simple structure.

In the first embodiment, the mode control unit FW of the controller CTR controls the first PMOS transistor PM1 and the first NMOS transistor NM1 of the first output interface UART0-Tx such that the first voltage and/or the second voltage (for example, a signal transitions between the high level and the low level) is output in the normal mode (first mode) and high impedance is output in the test mode (second mode). In addition, the mode control unit FW of the controller CTR controls the second PMOS transistor PM2 and the second NMOS transistor NM2 of the second output interface UART1-Tx such that the third voltage (for example, a high-level voltage) is steadily output in the normal mode (first mode) and third voltage and/or the fourth voltage (for example, a signal transitions between the high level and the low level) is output in the test mode (second mode). Therefore, for example, even when the dimension (=W/L, W: a channel width and L: a channel length) of the second PMOS transistor PM2 is equivalent to the dimension of the first PMOS transistor PM1 (see FIG. 10) and the dimension of the second NMOS transistor NM2 is equivalent to the dimension of the first NMOS transistor NM1 (see FIG. 10), the first output interface UART0-Tx and the second output interface UART1-Tx can perform the above-mentioned different operations.

Here, suppose a case where the controller CTR is refined (the specifications of the controller CTR are changed) such that the first signal selected from a plurality of first signals including high impedance is output from the first output interface UART0-Tx and the second signal selected from a plurality of second signals including high impedance is output from the second output interface UART1-Tx. In this case, even when the first resistor Ω0 and the second resistor Ω1 are not provided, the output ϕUART0-Tx from the first output interface UART0-Tx is set to high impedance and it is possible to supply the output ϕUART1-Tx from the second output interface UART1-Tx as the signal to be transmitted to the transmitting port UART-Tx. In addition, the output ϕUART1-Tx from the second output interface UART1-Tx is set to high impedance and it is possible to supply the output ϕUART0-Tx from the first output interface UART0-Tx as the signal to be transmitted to the transmitting port UART-Tx.

However, in this case, for example, it is necessary to remake a mask pattern for manufacturing the controller chip. Therefore, the manufacturing costs of the controller CTR are likely to increase and a development time (TAT) is delayed by the time required for the refinement of the mask, the verification of the design, or tape-out (TO).

In contrast, in the first embodiment, the controller CTR outputs the first signal which is selected from a plurality of first signals including high impedance from the first output interface UART0-Tx and outputs the second signal which is selected from a plurality of second signals without including high impedance from the second output interface UART1-Tx, as described above. That is, it is possible to achieve the controller CTR (for example, the mode control unit FW) by, for example, changing firmware while using the existing hardware of the controller CTR (without defining the controller HW). Therefore, it is possible to reduce the number of transmitting ports UART-Tx (the number of pins) required to transmit an appropriate signal (for example, to 1) at a lower cost and a shorter development time (TAT) than those when the hardware of the controller is refined.

It should be noted that the mode switching unit FW3 may automatically select the normal mode instead of the test mode if the firmware 20a has not been written to the non-volatile semiconductor memory 20 (particularly the firmware storage area 20b) when or after the controller CTR starts up ('Yes' in Step S6 of FIG. 8). In this case, the mode switching unit FW3 selectively gives a control right to the normal mode control unit FW1 (Step S7). The mode switching unit FW3 may automatically select the test mode instead of the normal mode if the firmware 20a has been written to the non-volatile semiconductor memory 20 (particularly the firmware storage area 20b) when or after the controller CTR starts up ('No' in Step S6 of FIG. 8). In this case, the mode switching unit FW3 selectively gives a control right to the test mode control unit FW2 (Step S8).

Alternatively, the memory system 1 may include a ROM which stores default firmware. In this case, for example, if the firmware 20a has not been written to the non-volatile semiconductor memory 20 (particularly the firmware storage area 20b) when or after the controller CTR starts up ('Yes' in Step S6 of FIG. 8), the mode switching unit FW3 reads the default firmware from the ROM, stores the default firmware in the firmware storage area 20b of the non-volatile semiconductor memory 20, automatically selects the test mode, and selectively gives a control right to the test mode control unit FW2 (Step S8).

(Second Embodiment)

Next, a memory system according to a second embodiment will be described. Hereinafter, the second embodiment will be described with an emphasis on the difference from the first embodiment.

In the first embodiment, the controller CTR pulls up the output φUART1-Tx from the second output interface UART1-Tx to the third voltage (for example, a high-level voltage) in the normal mode (first mode). However, in the second embodiment, the controller CTR pulls down the output φUART1-Tx from the second output interface UART1-Tx to the fourth voltage (for example, a low-level voltage) in the normal mode (first mode).

Figure 18:
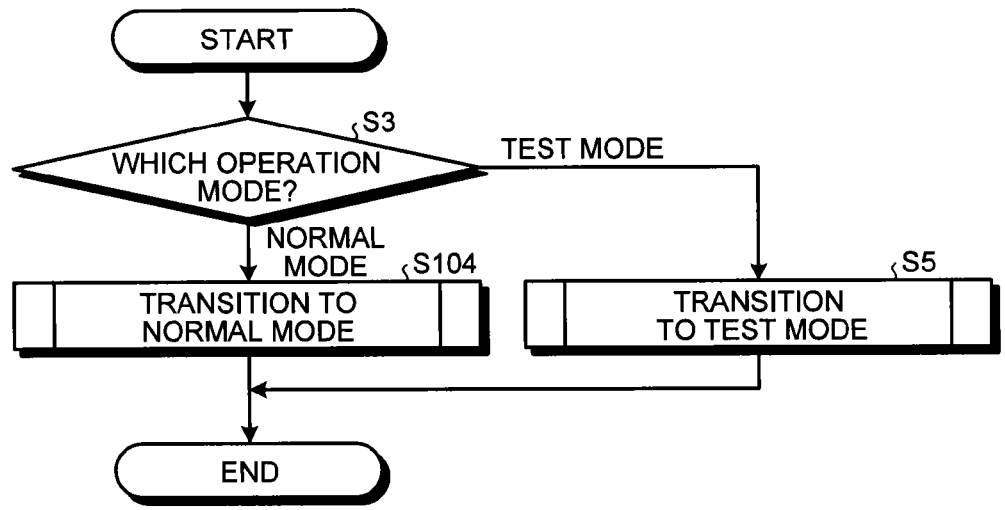
FIG. 18 is a flowchart illustrating a transition in the operation mode of a memory system according to a second embodiment.
Figures 19, 20:
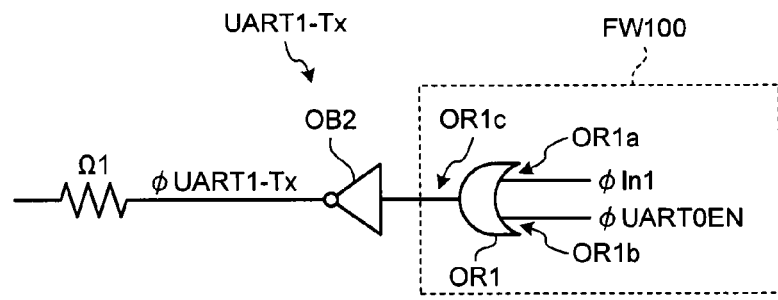
FIG. 19 is a diagram illustrating the operation of the memory system according to the second embodiment.
FIG. 20 is a diagram illustrating the structure of a mode control unit in the second embodiment.

Specifically, the operation of a memory system 1 differs from that of the memory system 1 according to the first embodiment in the following points, as illustrated in FIGS. 18 and 19. FIG. 18 is a flowchart illustrating a transition in the operation mode of the memory system 1. FIG. 19 is a diagram illustrating the operation of the memory system 1.

In the second embodiment, Step S104 is performed instead of Step S4 (see FIG. 6).

In Step S104, for example, when a signal is transmitted, the controller CTR outputs the first voltage and/or the second voltage (for example, a signal transitions between the high level and the low level) from the first output interface UART0-Tx and steadily outputs the fourth voltage (for example, a low-level voltage) from the second output interface UART1-Tx. For example, the controller CTR uses the output φUART0-Tx from the first output interface UART0-Tx as a signal which transitions between the high level and the low level and is to be transmitted, with the output φUART1-Tx from the second output interface UART1-Tx pulled down to the low level (see FIG. 19).

A structure for controlling the second output interface UART1-Tx in a mode control unit FW100 differs from that in the first embodiment in the following points, as illustrated in FIG. 20. FIG. 20 is a diagram illustrating the structure for controlling the second output interface UART1-Tx in the mode control unit FW100.

The mode control unit FW100 includes, for example, an OR gate OR1 as the structure for controlling the second output interface UART1-Tx.

The OR gate OR1 receives a transmission control signal φIn1 using an input terminal OR1a, receives a control signal φUART0EN using an input terminal OR1b, calculates the logical sum of the transmission control signal φIn1 and the control signal φUART0EN, and outputs the calculation result from an output terminal OR1c.

For example, when an active-level (for example, high-level) control signal φUART0EN is received, the OR gate OR1 supplies a voltage fixed to the high level as a control signal φVin1 (see FIG. 12) to a second PMOS transistor PM2 and a second NMOS transistor NM2, respectively.

For example, when a non-active-level (for example, low-level) control signal φUART0EN is received, the OR gate OR1 supplies the transmission control signal φIn1 as the control signal φVin1 (see FIG. 12) to the second PMOS transistor PM2 and the second NMOS transistor NM2, respectively.

Figure 21:
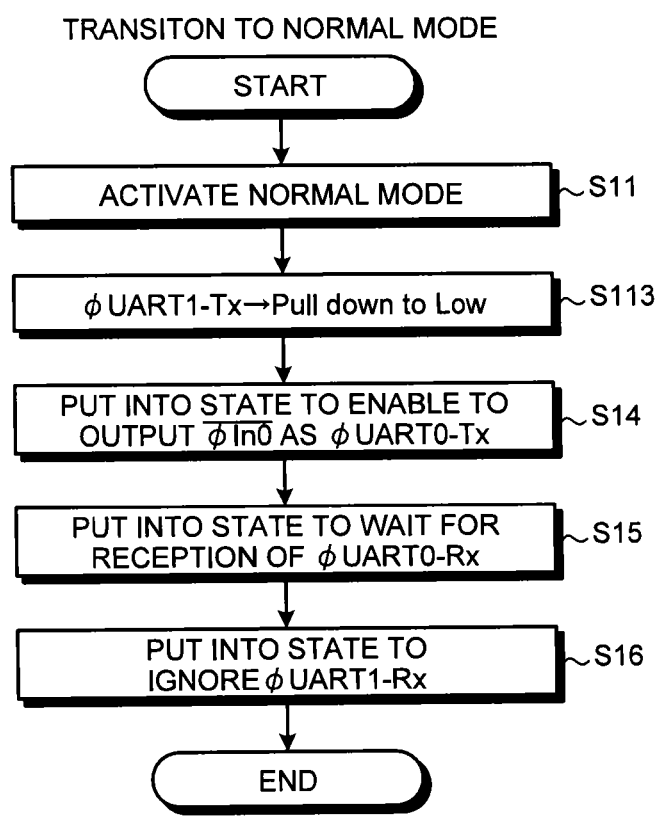
FIG. 21 is a flowchart illustrating a transition in the operation mode to the normal mode in the second embodiment.

In addition, the details of an operation (Step S104 in FIG. 18) in the normal mode differ from those of the operation in the first embodiment in the following points, as illustrated in FIG. 21. FIG. 21 is a flowchart illustrating a transition in the operation mode to the normal mode in the controller CTR.

In the second embodiment, Step S113 is performed instead of Step S13 (see FIG. 16).

In Step S113, the mode control unit FW100 pulls down the output φUART1-Tx from the second output interface UART1-Tx to the low level. For example, the mode control unit FW100 controls the second output interface UART1-Tx such that the output φUART1-Tx from the second output interface UART1-Tx is pulled down to the low level.

For example, since the control signal φUART0EN changes to an active level (for example, a high level), the OR gate OR1 (see FIG. 20) supplies a voltage fixed to the high level as the control signal φVin1 (see FIG. 12) to the second PMOS transistor PM2 and the second NMOS transistor NM2. Then, the second PMOS transistor PM2 and the second NMOS transistor NM2 logically invert the voltage fixed to the high level to generate a voltage fixed to the low level and output the voltage fixed to the low level as the output φUART1-Tx.

The resistance value of a second resistor Ω1 is greater than that of a first resistor Ω0 such that the first voltage and/or the second voltage (for example, a signal transitions between the high level and the low level) output from the first output interface UART0-Tx can be supplied to the transmitting port UART-Tx when the fourth voltage (for example, a low-level voltage) is steadily output from the second output interface UART1-Tx in the normal mode (first mode).

As described above, in the memory system 1 according to the second embodiment, in the normal mode (first mode), the mode control unit FW100 of the controller CTR outputs the first voltage and/or the second voltage (for example, a signal transitions between the high level and the low level) from the first output interface UART0-Tx and steadily outputs the fourth voltage (for example, a low-level voltage) from the second output interface UART1-Tx. In the test mode (second mode), the mode control unit FW100 of the controller CTR outputs high impedance from the first output interface UART0-Tx and outputs the third voltage and/or the fourth voltage (for example, a signal transitions between the high level and the low level) from the second output interface UART1-Tx. Therefore, in the normal mode (first mode), the first signal output from the first output interface UART0-Tx can be supplied as the signal to be transmitted to the transmitting port UART-Tx. In the test mode (second mode), the second signal output from the second output interface UART1-Tx can be supplied as the signal to be transmitted to the transmitting port UART-Tx.

In the memory system 1 according to the second embodiment, the resistance value of the second resistor $\Omega1$ is greater than that of the first resistor $\Omega0$ such that the first voltage and/or the second voltage (for example, a signal transitions between the high level and the low level) output from the first output interface UART0-Tx can be supplied to the transmitting port UART-Tx when the fourth voltage (for example, a high-level voltage) is steadily output from the second output interface UART1-Tx in the normal mode (first mode). Therefore, in the normal mode (first mode), the output φUART0-Tx from the first output interface UART0-Tx can be supplied as the signal to be transmitted to the transmitting port UART-Tx.

In the second embodiment, the second output interface UART1-Tx includes a second output buffer OB2 including a second PMOS transistor PM2 and a second NMOS transistor NM2. The second output interface UART1-Tx outputs the third voltage (for example, a high-level voltage) when the second PMOS transistor PM2 is turned on and the second NMOS transistor NM2 is turned off and outputs the fourth voltage (for example, a low-level voltage) when the second PMOS transistor PM2 is turned off and the second NMOS transistor NM2 is turned on. Therefore, it is possible to achieve the second output interface UART1-Tx which can steadily output the fourth voltage (for example, a low-level voltage) in the normal mode (first mode) and can output the third voltage and/or the fourth voltage (for example, a signal transitions between the high level and the low level) in the test mode (second mode) with a simple structure.

In the second embodiment, the mode control unit FW100 controls the first PMOS transistor PM1 and the first NMOS transistor NM1 of the first output interface UART0-Tx such that the first voltage and/or the second voltage (for example, a signal transitions between the high level and the low level) is output in the normal mode (first mode) and high impedance is output in the test mode (second mode). In addition, the mode control unit FW100 controls the second PMOS transistor PM2 and the second NMOS transistor NM2 of the second output interface UART1-Tx such that the fourth voltage (for example, a low-level voltage) is steadily output in the normal mode (first mode) and the third voltage and/or the fourth voltage (for example, a signal transitions between the high level and the low level) is output in the test mode (second mode). Therefore, for example, even when the dimension (=W/L, W: a channel width and L: a channel length) of the second PMOS transistor PM2 is equivalent to the dimension of the first PMOS transistor PM1 (see FIG. 10) and the dimension of the second NMOS transistor NM2 are equivalent to the dimension of the first NMOS transistor NM1 (see FIG. 10), the first output interface UART0-Tx and the second output interface UART1-Tx can perform the above-mentioned different operations.

(Third Embodiment)

Next, a memory system 300 according to a third embodiment will be described. The third embodiment will be described with an emphasis on the difference from the first embodiment.

In the first embodiment, an example in which the low-speed interface 30a of the controller CTR includes one output interface for UART communication which outputs three values (for example, High, Low, and High-Z) has been described. However, in the third embodiment, a case in which a low-speed interface 330a of a controller CTR300 includes a plurality of output interfaces for UART communication which output three values will be described.

Figure 22:
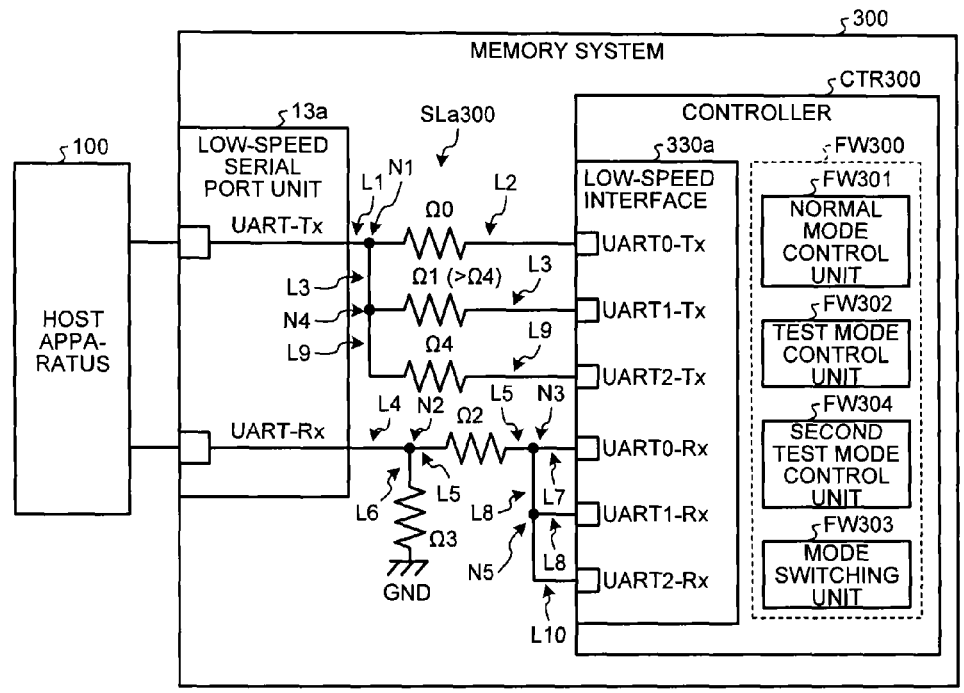
FIG. 22 is a diagram illustrating the structure of a memory system according to a third embodiment.

Specifically, the memory system 300 includes a low-speed serial port unit 13a, the controller CTR300, and a low-speed line SLa300 as a structure related to a low-speed communication interface, as illustrated in FIG. 22. FIG. 22 is a diagram illustrating the structure of the memory system 300.

The controller CTR300 includes a low-speed interface 330a instead of the low-speed interface 30a (see FIG. 5) and includes a mode control unit FW300 instead of the mode control unit FW (see FIG. 5). The mode control unit FW300 includes a normal mode control unit FW301, a test mode control unit FW302, a second test mode control unit FW304, and a mode switching unit FW303.

The low-speed interface 330a further includes a third output interface UART2-Tx and a third input interface UART2-Rx.

The third output interface UART2-Tx is an interface for outputting a third value selected from a plurality of third values. The plurality of third values include a fifth voltage, a sixth voltage, and high impedance. The sixth voltage is lower than the fifth voltage. The fifth voltage is, for example, a high-level (for example, Vdd level) voltage. The sixth voltage is, for example, a low-level (for example, ground level) voltage. For example, the third output interface UART2-Tx is an output interface for UART2 communication which outputs three values High, Low, and High-Z.

The third input interface UART2-Rx is an interface for receiving the third value selected from a plurality of third values. For example, the third input interface UART2-Rx is an input interface for UART2 communication which outputs three values High, Low, and High-Z.

The mode control unit FW300 differs from that in the first embodiment in the content of the operation. For example, when receiving a set operation mode command (second test mode transition command) to instruct an operation in the second test mode, the mode control unit FW300 switches the test mode of the controller CTR to the second test mode. In the second test mode, UART2 communication is performed.

For example, the low-speed line SLa300 connects a transmitting port UART-Tx of the low-speed serial port unit 13a to the third output interface UART2-Tx of the low-speed interface 30a through a fifth resistor $\Omega4$. The resistance value of a second resistor $\Omega1$ is greater than that of the fifth resistor $\Omega4$. In addition, for example, the low-speed line SLa300 connects a receiving port UART-Rx of the low-speed serial port unit 13a to a first input interface UART0-Rx, a second input interface UART1-Rx, and the third input interface UART2-Rx of the low-speed interface 30a through a third resistor $\Omega2$.

More specifically, the low-speed line SLa300 further includes lines L9 and L10, nodes N4 and N5, and the fifth resistor $\Omega4$.

The line L9 connects the node N4 and the third output interface UART2-Tx. The line L10 connects the node N5 and the third input interface UART1-Rx.

The fifth resistor $\Omega4$ is provided on the line L9. The fifth resistor $\Omega4$ may be, for example, a resistive element which is mounted on a printed circuit board 2 (see FIG. 1). The resistance value of the second resistor $\Omega1$ is greater than that of the first resistor $\Omega0$ and is also greater than that of the fifth resistor $\Omega4$.

For example, the resistance value of the second resistor $\Omega1$ is greater than that of the first resistor $\Omega0$ such that the first signal output from the first output interface UART0-Tx can be supplied to the transmitting port UART-Tx when the fixed-level second signal is output from the second output interface UART1-Tx and high impedance is output from the third output interface UART2-Tx in the normal mode (first mode).

That is, the resistance value of the second resistor Ω1 is greater than that of the first resistor Ω0 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx and high impedance is output from the third output interface UART2 -Tx in the normal mode (first mode).

For example, the resistance value of the second resistor Ω1 is about ten times more than that of the first resistor Ω0. For example, when the resistance value of the first resistor Ω0 is 100 (Ω), the resistance value of the second resistor Ω1 can be 1 (kΩ).

For example, the resistance value of the second resistor Ω1 is greater than that of the fifth resistor Ω4 such that the third value output from the third output interface UART2-Tx can be supplied to the transmitting port UART-Tx when the fixed-level second signal is output from the second output interface UART1-Tx and high impedance is output from the first output interface UART0-Tx in the second test mode (third mode).

That is, the resistance value of the second resistor Ω1 is greater than that of the fifth resistor Ω4 such that the fifth voltage and/or the sixth voltage (for example, a signal transitions between the high level and the low level) output from the third output interface UART2-Tx can be supplied to the transmitting port UART-Tx when the third voltage (for example, a high-level voltage) is steadily output from the second output interface UART2-Tx and high impedance is output from the first output interface UART0 -Tx in the second test mode (third mode).

For example, the resistance value of the second resistor Ω1 is about ten times more than that of the fifth resistor Ω4. For example, when the resistance value of the fifth resistor Ω4 is 100 (Ω), the resistance value of the second resistor Ω1 can be 1 (kΩ).

Figure 23:
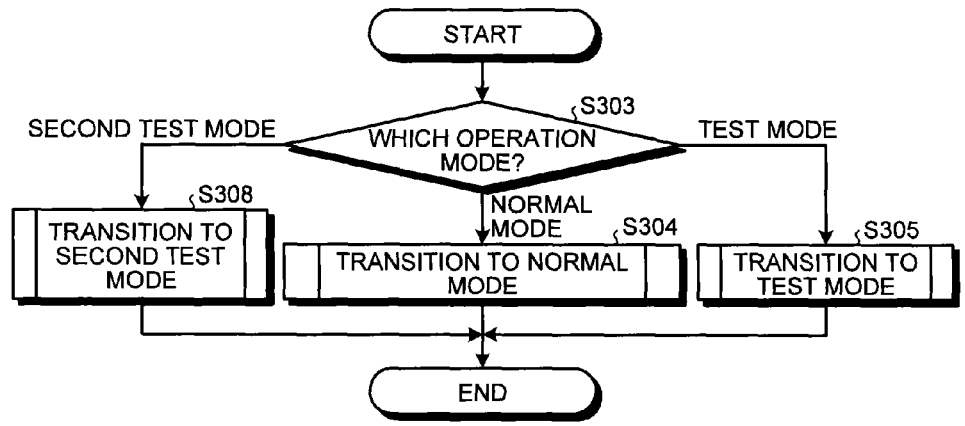
FIG. 23 is a flowchart illustrating a transition in the operation mode of the memory system according to the third embodiment.

The operation of the memory system 300 differs from that in the first embodiment in the following points as illustrated in FIGS. 23 and 24. FIG. 23 is a flowchart illustrating a transition in the operation mode of the memory system 300. FIG. 24 is a diagram illustrating the operation of the memory system 300.

Figure 25:
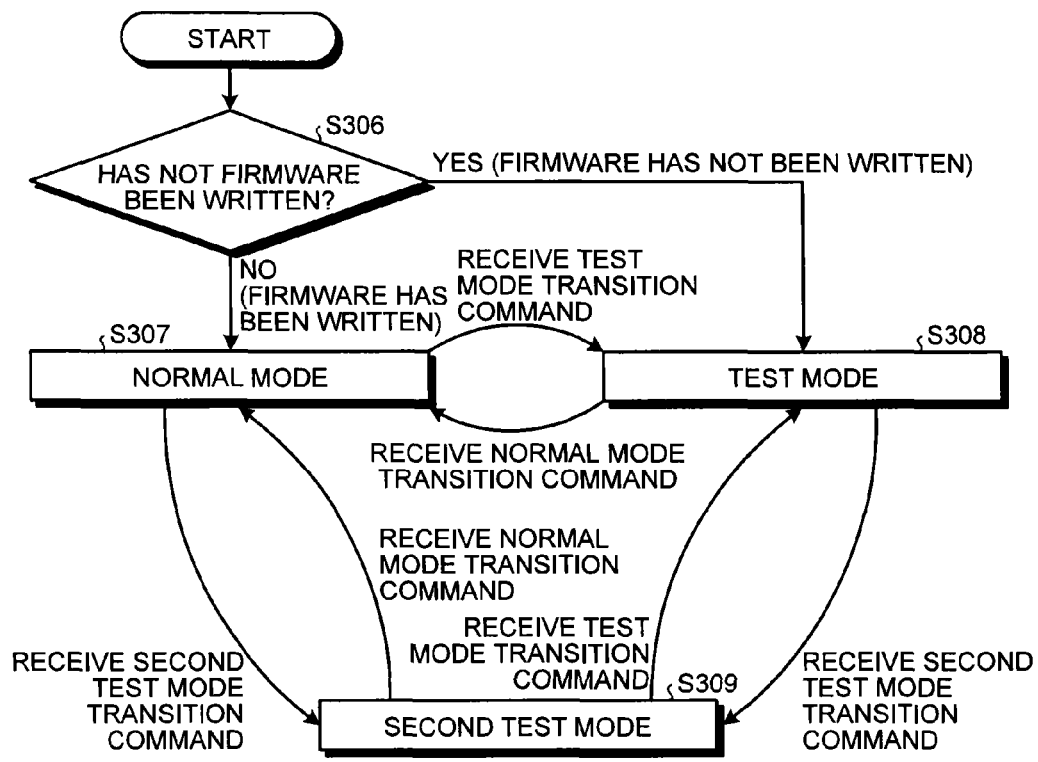
FIG. 25 is a state transition diagram illustrating the operation mode of a controller CTR300.

In Step S303, the controller CTR300 determines the operation mode to be performed. For example, the controller CTR300 determines a transition in the operation mode as illustrated in FIG. 25. FIG. 25 is a diagram illustrating a transition in the operation mode of the controller CTR300.

For example, when firmware 20a is read from a firmware storage area 20b of a non-volatile semiconductor memory 20 at the time the controller CTR300 starts up, the controller CTR300 determines that an operation needs to be performed in the normal mode (Step S307) and the process proceeds to Step S304. Alternatively, for example, when a test mode transition command is received from a host apparatus 100 in the normal mode, the controller CTR300 determines that an operation needs to be performed in the test mode (Step S308) and the process proceeds to Step S305. Alternatively, for example, if the firmware 20a has not been written to the non-volatile semiconductor memory 20 (particularly the firmware storage area 20b) when or after the controller CTR300 starts up ('Yes' in Step S306), the controller CTR300 determines that an operation needs to be performed in the test mode (Step S308) and the process proceeds to Step S305. Alternatively, for example, if the firmware 20a has been written to the non-volatile semiconductor memory (particularly the firmware storage area 20b) when or after the controller CTR300 starts up ('No' in Step S306), the controller CTR300 determines that an operation needs to be performed in the normal mode (Step S307) and the process proceeds to Step S304. Alternatively, for example, when a second test mode transition command is received from the host apparatus 100 in the normal mode, the controller CTR300 determines that an operation needs to be performed in the second test mode (Step S309) and the process proceeds to Step S308.

In Step S304, the controller CTR300 performs a transition to the normal mode.

For example, when a signal is received after the operation mode is switched to the normal mode, the controller CTR300 outputs the first voltage and/or the second voltage (for example, a signal transitions between the high level and the low level) from the first output interface UART0-Tx, steadily outputs a third voltage (for example, a high-level voltage) from the second output interface UART1-Tx, and outputs high impedance from the third output interface UART2-Tx. For example, the controller CTR300 pulls up an output φUART1-Tx from the second output interface UART1-Tx to the high level and uses an output φUART0-Tx from the first output interface UART0-Tx as a signal which transitions between the high level and the low level and is to be transmitted, with an output φUART2-Tx from the third output interface UART2-Tx set to high impedance (see FIG. 24).

In this case, the resistance value of the second resistor Ω1 is greater than that of the first resistor Ω0 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx and high impedance is output from the third output interface UART2-Tx in the normal mode (first mode). Therefore, in the normal mode (first mode), the drivability of an output φUART0-Tx from the first output interface UART0-Tx is larger than the drivability of the output φUART1-Tx from the second output interface UART1-Tx, and the output φUART0-Tx from the first output interface UART0-Tx is supplied as a signal to be transmitted to the transmitting port UART-Tx. Then, the transmitting port UART-Tx transmits the signal to be transmitted to the host apparatus 100.

Alternatively, for example, when the controller CTR300 receives a signal, the received signal (for example, a signal transitions between the high level and the low level) is input to the first input interface UART0-Rx, the second input interface UART1-Rx, and the third input interface UART2-Rx. Then, the controller CTR300 receives an input φUART0-Rx to the first input interface UART0-Rx as an input signal to the controller CTR300, ignores an input φUART1-Rx to the second input interface UART1-Rx, and ignores an input φUART2-Rx to the third input interface UART2-Rx (see FIG. 24). That is, the controller CTR300 performs control such that the first signal (φUART0-Rx) input from the first input interface UART0-Rx is selected as the input signal to the controller CTR300.

In Step S305, the controller CTR300 performs a transition to the test mode.

For example, when a signal is transmitted after the operation mode is switched to the test mode, the controller CTR300 outputs the third voltage and/or the fourth voltage (for example, a signal transitions between the high level and the low level) from the second output interface UART1-Tx, outputs high impedance from the first output interface UART0-Tx, and outputs high impedance from the third output interface UART2-Tx. For example, the controller CTR300 sets the output φUART0-Tx from the first output interface UART0-Tx to high impedance and uses the output φUART1-Tx from the second output interface UART1-Tx as a signal which transitions between the high level and the low level and is to be transmitted, with the output φUART2-Tx from the third output interface UART2-Tx set to high impedance (see FIG. 24).

In this case, the output φUART1-Tx from the second output interface UART1-Tx is supplied as the signal to be transmitted to the transmitting port UART-Tx. Then, the transmitting port UART-Tx transmits the signal to be transmitted to the host apparatus 100.

Alternatively, for example, when the controller CTR300 receives a signal, the received signal (for example, a signal transitions between the high level and the low level) is input to the first input interface UART0-Rx, the second input interface UART1-Rx, and the third input interface UART2-Rx. Then, the controller CTR300 receives the input φUART1-Rx to the second input interface UART1-Rx as the input signal to the controller CTR300, ignores the input φUART0-Rx to the first input interface UART0-Rx, and ignores the input φUART2-Rx to the third input interface UART2-Rx (see FIG. 24). That is, the controller CTR300 performs control such that the second signal (φUART1-Rx) input from the second input interface UART1-Rx is selected as the input signal to the controller CTR300.

In Step S308, the controller CTR300 performs a transition to the second test mode.

For example, when a signal is transmitted after the operation mode is switched to the second test mode, the controller CTR300 outputs the fifth voltage and/or the sixth voltage (for example, a signal transitions between the high level and the low level) from the third output interface UART2-Tx, steadily outputs the third voltage (for example, a high-level voltage) from the second output interface UART1-Tx, and outputs high impedance from the first output interface UART0-Tx. For example, the controller CTR300 pulls up the output φUART1-Tx from the second output interface UART1-Tx to the high level and uses the output φUART2-Tx from the third output interface UART2-Tx as the signal which transitions between the high level and the low level and is to be transmitted, with the output φUART0-Tx from the first output interface UART0-Tx set to the high impedance (see FIG. 24).

In this case, the resistance value of the second resistor Ω1 is greater than that of the fifth resistor Ω4 such that the fifth voltage and/or the sixth voltage (for example, a signal transitions between the high level and the low level) output from the third output interface UART2-Tx can be supplied to the transmitting port UART-Tx when the third voltage (for example, a high-level voltage) is steadily output from the second output interface UART1-Tx and high impedance is output from the first output interface UART0-Tx in the second test mode (third mode). Therefore, in the second test mode (third mode), the drivability of the output φUART2-Tx from the third output interface UART2-Tx is larger than the drivability of the output φUART1-Tx from the second output interface UART1-Tx, and the output φUART2-Tx from the third output interface UART2-Tx is supplied as the signal to be transmitted to the transmitting port UART-Tx. Then, the transmitting port UART-Tx transmits the signal to be transmitted to the host apparatus 100.

Alternatively, for example, when the controller CTR300 receives a signal, the received signal (for example, a signal transitions between the high level and the low level) is input to the first input interface UART0-Rx, the second input interface UART1-Rx, and the third input interface UART2-Rx, respectively. Then, the controller CTR300 receives the input φUART2-Rx to the third input interface UART2-Rx as an input signal to the controller CTR, ignores the input φUART0-Rx to the first input interface UART0-Rx, and ignores the input φUART1-Rx to the second input interface UART1-Rx (see FIG. 24). That is, the controller CTR300 performs control such that the third value (φUART2-Rx) input from the third input interface UART2-Rx as the input signal to the controller CTR300.

Figure 26:
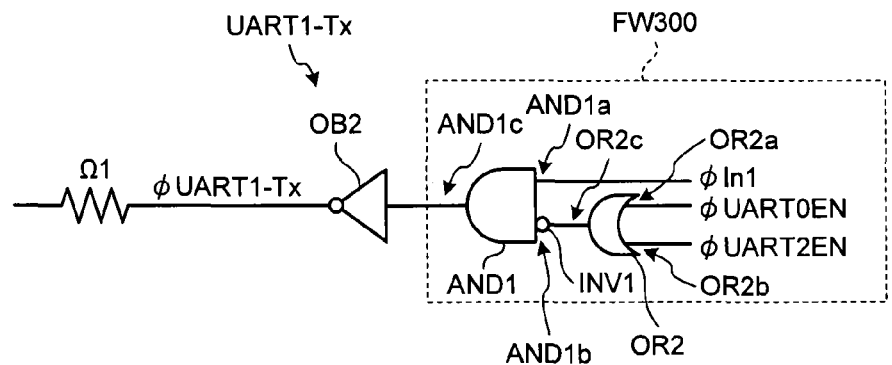
FIG. 26 is a diagram illustrating the structure of a mode control unit in the third embodiment.

A structure for controlling the second output interface UART1-Tx in the mode control unit FW300 differs from that in the first embodiment in the following points, as illustrated in FIG. 26. FIG. 26 is a diagram illustrating the structure for controlling the second output interface UART1-Tx in the mode control unit FW300.

The mode control unit FW300 further includes, for example, an OR gate OR2 as the structure for controlling the second output interface UART1-Tx, as compared to the structure illustrated in FIG. 15. The OR gate OR2 receives a control signal φUART0EN using an input terminal OR2a, receives a control signal φUART2 EN using an input terminal OR2b, calculates the logical sum of the control signal φUART0EN and the control signal φUART2EN, and supplies the calculation result (φUART0EN+φUART2EN) from an output terminal OR2c to an inverter INV1. The inverter INV1 logically inverts the control signal (φUART0EN+φUART2EN) to generate a control signal (φUART0EN+φUART2EN)⁻, and supplies the control signal (φUART0EN+φUART2EN)⁻ to an AND gate AND1.

Figure 27:
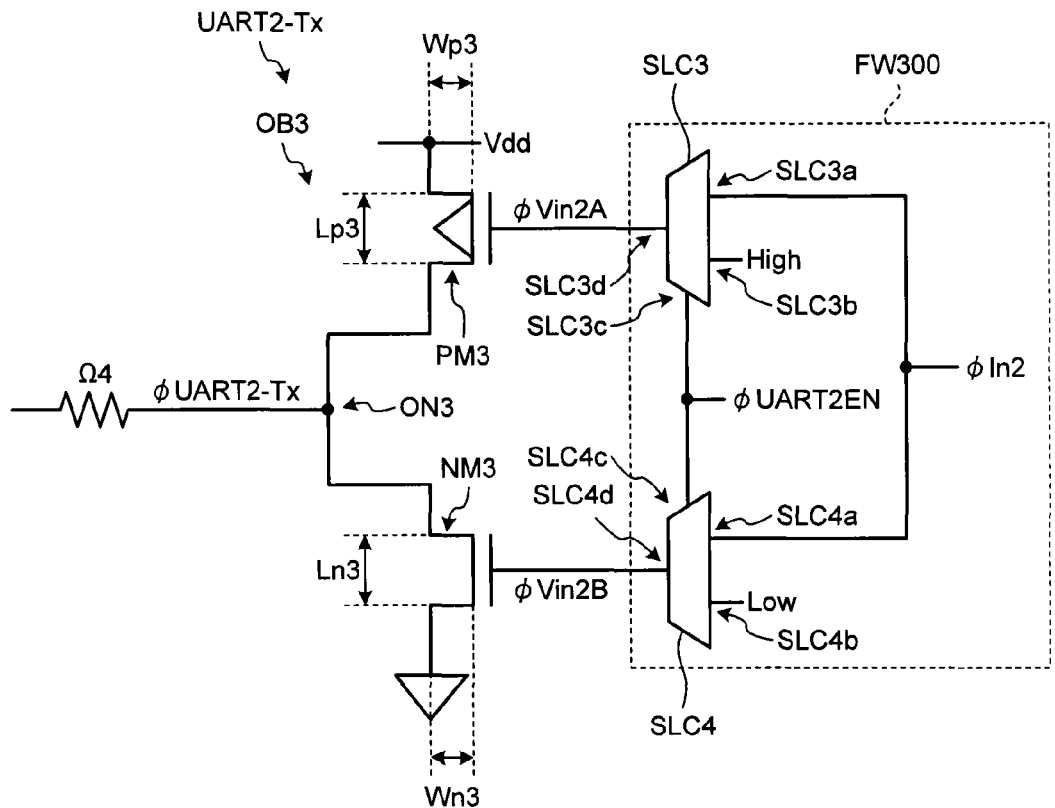
FIG. 27 is a diagram illustrating the structure of a third output interface and the mode control unit in the third embodiment.

A structure for controlling the third output interface UART2-Tx in the mode control unit FW300 differs from that in the first embodiment in the following points, as illustrated in FIG. 27. FIG. 27 is a diagram illustrating the structure for controlling the structure for controlling the third output interface UART2-Tx in the mode control unit FW300.

The mode control unit FW300 includes, for example, a selector SLC3 and a selector SLC4 as the structure for controlling the third output interface UART2-Tx.

The selector SLC3 receives a signal φIn2 to be transmitted using an input terminal SLC3a, receives a voltage fixed to the high level using an input terminal SLC3b, and receives the control signal φUART2EN using a control terminal SLC3c.

For example, when an active-level (for example, high-level) control signal φUART2EN is received, the selector SLC3 selects the input terminal SLC3a and supplies the signal φIn2 as a control signal φVin2A to the third PMOS transistor PM3.

For example, when a non-active-level (for example, low-level) control signal φUART2EN is received, the selector SLC3 selects the input terminal SLC3b and supplies a voltage fixed to the high level as the control signal φVin2A to the third PMOS transistor PM3.

The selector SLC4 receives the signal φIn2 to be transmitted using an input terminal SLC4a, receives a voltage fixed to the low level using an input terminal SLC4b, and receives the control signal φUART2EN using a control terminal SLC4c.

For example, when the active-level control signal φUART2EN is received, the selector SLC4 selects the input terminal SLC4a and supplies the signal φIn2 as a control signal φVin2B to the third NMOS transistor NM3.

For example, when the non-active-level control signal φUART2EN is received, the selector SLC4 selects the input terminal SLC4b and supplies a voltage fixed to the low level as the control signal φVin2B to the third NMOS transistor NM3.

The internal structure of the third output interface UART2-Tx is the same as the internal structure (see FIG. 10) of the first output interface UART0-Tx, as illustrated in FIG. 27. For example, the third output interface UART2-Tx includes a third output buffer OB3. The third output buffer OB3 includes a third PMOS transistor PM3 and a third NMOS transistor NM3, as illustrated in FIG. 27.

Figure 28:
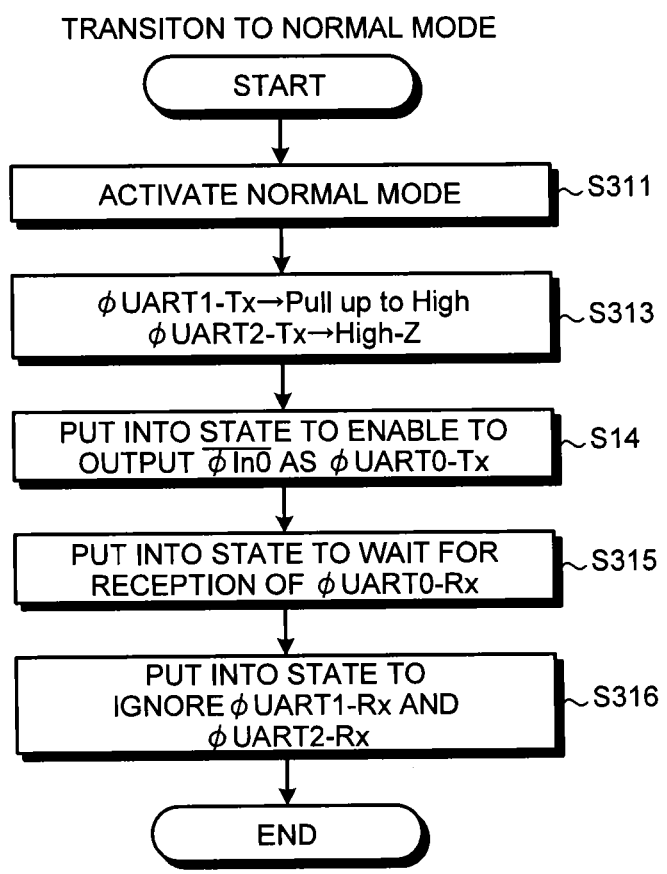
FIG. 28 is a flowchart illustrating a transition in the operation mode to the normal mode in the third embodiment.

The details of a transition in the operation mode to the normal mode (Step S304 in FIG. 23) differ from those in the first embodiment in the following points, as illustrated in FIG. 28. FIG. 28 is a flowchart illustrating the operation of the controller CTR300 in the normal mode.

In Step S311, the controller CTR300 activates the normal mode. For example, the mode control unit FW300 transitions the control signal φUART0EN to an active level (for example, a high level), transitions the control signal φUART2EN to a non-active level (for example, a low level), and gives a control right to the normal mode control unit FW301.

In Step S313, the normal mode control unit FW301 pulls up the output φUART1-Tx from the second output interface UART1-Tx to the high level and sets the output φUART2-Tx from the third output interface UART2-Tx to high impedance. For example, the normal mode control unit FW301 controls the second output interface UART1-Tx and the third output interface UART2-Tx such that the output φUART1-Tx from the second output interface UART1-Tx is pulled up to the high level and the output φUART2-Tx from the third output interface UART2-Tx is set to high impedance.

For example, since the control signal (φUART0EN+ φUART2EN)⁻ transitions to a non-active level (for example, a low level), the AND gate AND1 (see FIG. 26) supplies a voltage fixed to the low level as the control signal φVin1 (see FIG. 12) to the second PMOS transistor PM2 and the second NMOS transistor NM2. Then, the second PMOS transistor PM2 and the second NMOS transistor NM2 logically invert the voltage fixed to the low level to generate a voltage fixed to the high level and output the voltage fixed to the high level as the output φUART1-Tx.

For example, the selector SLC3 (see FIG. 27) selects the input terminal SLC3b and supplies a voltage fixed to the high level as the control signal φVin2A to the third PMOS transistor PM3. The selector SLC4 (see FIG. 27) selects the input terminal SLC4b and a voltage fixed to the low level as the control signal φVin2B to the third NMOS transistor NM3. Then, the third PMOS transistor PM3 and the third NMOS transistor NM3 are both turned off to set the output node ON3 to high impedance and the high impedance is output as the output φUART2-Tx.

In Step S315, the normal mode control unit FW301 is put into a state (a state waiting for reception) in which the controller CTR300 can receive the input φUART0-Rx to the first input interface UART0-Rx as the input signal to the controller CTR300.

In Step S316, the controller CTR300 is put into a state (an ignoring state) in which the controller CTR300 can ignore the input φUART1-Rx to the second input interface UART1-Rx and ignore the input φUART2-Rx to the third input interface UART2-Rx.

The details of a transition in the operation mode to the test mode (Step S305 in FIG. 23) differ from those in the first embodiment, as illustrated in FIG. 29. FIG. 29 is a flowchart illustrating a transition in the operation mode to the test mode in the controller CTR300.

In Step S321, the controller CTR300 activates the test mode. For example, the mode control unit FW300 transitions the control signal φUART0EN to a non-active level (for example, a low level), transitions the control signal φUART2EN to a non-active level (for example, a low level), and gives a control right to the test mode control unit FW302.

In Step S323, the controller CTR300 sets the output φUART0-Tx from the first output interface UART0-Tx to high impedance and sets the output φUART2-Tx from the third output interface UART2-Tx to high impedance. For example, the test mode control unit FW302 controls the first output interface UART0-Tx and the third output interface UART2-Tx such that the output φUART0-Tx from the first output interface UART0-Tx is set to high impedance and the output φUART2-Tx from the third output interface UART2-Tx is set to high impedance.

For example, the selector SLC1 (see FIG. 14) selects the input terminal SLC1b and supplies a voltage fixed to the high level as a control signal φVin0A (see FIG. 10) to the first PMOS transistor PM1 of the first output interface UART0-Tx. The selector SLC2 (see FIG. 14) selects the input terminal SLC2b and supplies a voltage fixed to the low level as a control signal φVin0B (see FIG. 10) to the first NMOS transistor NM1 of the first output interface UART0-Tx. Then, the first PMOS transistor PM1 and the first NMOS transistor NM1 of the first output interface UART0-Tx are both turned off to set the output node ON1 to high impedance and the high impedance is output as the output φUART0-Tx.

For example, the selector SLC3 (see FIG. 27) selects the input terminal SLC3b and supplies a voltage fixed to the high level as the control signal φVin2A (see FIG. 27) to the third PMOS transistor PM3 of the third output interface UART2-Tx. The selector SLC4 (see FIG. 27) selects the input terminal SLC4b and supplies a voltage fixed to the low level as the control signal φVin2B (see FIG. 27) to the third NMOS transistor NM3 of the third output interface UART2-Tx. Then, the third PMOS transistor PM3 and the third NMOS transistor NM3 of the third output interface UART2-Tx are both turned off to set the output node ON3 to high impedance and the high impedance is output as the output φUART2-Tx.

In Step S325, the controller CTR300 is put into a state (a state waiting for reception) in which the controller CTR300 can receive the input φUART1-Rx to the second input interface UART1-Rx as the input signal to the controller CTR.

In Step S326, the controller CTR is put into a state (an ignoring state) in which the controller CTR300 can ignore the input φUART0-Rx to the first input interface UART0-Rx and ignore the input φUART2-Rx to the third input interface UART2-Rx.

The details of a transition in the operation mode to the second test mode (Step S308 in FIG. 23) differ from those in the first embodiment in the following points, as illustrated in FIG. 30. FIG. 30 is a flowchart illustrating a transition in the operation mode to the second test mode in the controller CTR300.

In Step S331, the controller CTR300 activates the second test mode. For example, the mode control unit FW300 make the control signal φUART0EN transition to a non-active level (for example, a low level), the control signal ϕUART2EN transition to an active level (for example, a high level), and gives a control right to the second test mode control unit FW304.

In Step S333, the second test mode control unit FW304 sets the output ϕUART0-Tx from the first output interface UART0-Tx to high impedance and pulls up the output ϕUART1-Tx from the second output interface UART1-Tx to the high level. For example, the second test mode control unit FW304 controls the first output interface UART0-Tx and the second output interface UART1-Tx such that the output ϕUART0-Tx from the first output interface UART0-Tx is set to high impedance and the output ϕUART1-Tx from the second output interface UART1-Tx is pulled up to the high level.

For example, the selector SLC1 (see FIG. 14) selects the input terminal SLC1 b and supplies a voltage fixed to the high level as the control signal ϕVin0 A (see FIG. 10) to the first PMOS transistor PM1 of the first output interface UART0-Tx. The selector SLC2 (see FIG. 14) selects the input terminal SLC2 b and supplies a voltage fixed to the low level as the control signal ϕVin0 B (see FIG. 10) to the first NMOS transistor NM1 of the first output interface UART0-Tx. Then, the first PMOS transistor PM1 and the first NMOS transistor NM1 of the first output interface UART0-Tx are both turned off to set the output node ON1 to high impedance and the high impedance is output as the output ϕUART0-Tx.

For example, since the control signal (ϕUART0EN+ϕUART2EN)⁻ transitions to a non-active level (for example, a low level), the AND gate AND1 (see FIG. 26) supplies a voltage fixed to the low level as the control signal ϕVin1 (see FIG. 12) to the second PMOS transistor PM2 and the second NMOS transistor NM2. Then, the second PMOS transistor PM2 and the second NMOS transistor NM2 logically invert the voltage fixed to the low level to generate a voltage fixed to the high level and output the voltage fixed to the high level as the output ϕUART1-Tx.

In Step S334, the second test mode control unit FW304 can supply the output ϕUART2-Tx from the third output interface UART2-Tx as the signal to be transmitted from the third output interface UART2-Tx to the transmitting port UART-Tx through the low-speed line SLa. For example, the second test mode control unit FW304 controls the third output interface UART2-Tx such that a signal ϕIn2⁻ obtained by logically inverting the signal ϕIn2 to be transmitted can be output as the output ϕUART0-Tx from the third output interface UART2-Tx.

For example, the selector SLC3 (see FIG. 27) selects the input terminal SLC3a and supplies the signal ϕIn2 as the control signal ϕVin2A (see FIG. 27) to the third PMOS transistor PM3. The selector SLC4 (see FIG. 27) selects the input terminal SLC4a and supplies the signal ϕIn2 as the control signal ϕVin2B (see FIG. 27) to the third NMOS transistor NM3. Then, the third PMOS transistor PM3 and the third NMOS transistor NM3 logically invert the signal ϕIn2 to generate the signal ϕIn2⁻ and output the signal ϕIn2⁻ as the output ϕUART2-Tx.

In Step S335, the second test mode control unit FW304 is put into a state (a state waiting for reception) in which the controller CTR300 can receive the input ϕUART2-Rx to the third input interface UART2-Rx as the input signal to the controller CTR.

In Step S336, the second test mode control unit FW304 is put into a state (an ignoring state) in which the controller CTR300 can ignore the input ϕUART0-Rx to the first input interface UART0-Rx and ignore the input ϕUART1-Rx to the second input interface UART1-Rx.

As such, in the memory system 300 according to the third embodiment, the first output interface UART0-Tx of the low-speed interface 330a in the controller CTR300 is connected to the transmitting port UART-Tx of the low-speed serial port unit 13a through the first resistor Ω0. The second output interface UART1-Tx of the low-speed interface 330a in the controller CTR300 is connected to the transmitting port UART-Tx of the low-speed serial port unit 13a through the second resistor Ω1. The third output interface UART2-Tx of the low-speed interface 330a in the controller CTR300 is connected to the transmitting port UART-Tx of the low-speed serial port unit 13a through the fifth resistor Ω4. That is, the first output interface UART0-Tx, the second output interface UART1-Tx, and the third output interface UART2-Tx of the controller CTR300 share the transmitting port UART-Tx of the connector 13.

In this case, the resistance value of the second resistor Ω1 is greater than that of the first resistor Ω0. For example, the resistance value of the second resistor Ω1 is greater than that of the first resistor Ω0 such that the first signal output from the first output interface UART0-Tx can be supplied to the transmitting port UART-Tx when the fixed-level second signal is output from the second output interface UART1-Tx and the third value (high impedance) is output from the third output interface UART2-Tx in the normal mode (first mode). That is, the resistance value of the second resistor Ω1 is greater than the resistance value of the first resistor Ω0 such that the fifth voltage and/or the sixth voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx and high impedance is output from the third output interface UART2-Tx in the normal mode (first mode).

In addition, the resistance value of the second resistor Ω1 is greater than that of the fifth resistor Ω4. For example, the resistance value of the second resistor Ω1 is greater than that of the fifth resistor Ω4 such that the third value output from the third output interface UART0-Tx can be supplied to the transmitting port UART-Tx when the first signal (high impedance) is output from the first output interface UART0-Tx and a fixed-level second signal is output from the second output interface UART1-Tx in the second test mode (third mode). That is, the resistance value of the second resistor Ω1 is greater than that of the fifth resistor Ω4 such that the fifth voltage and/or the sixth voltage (for example, a signal transitions between the high level and the low level) output from the third output interface UART2-Tx can be supplied to the transmitting port UART-Tx when high impedance is output from the first output interface UART0-Tx and the third voltage (for example, a high-level voltage) is steadily output from the second output interface UART1-Tx in the second test mode (third mode).

Therefore, for example, in the normal mode (first mode), the drivability of the output ϕUART0-Tx from the first output interface UART0-Tx is larger than the drivability of the output ϕUART1-Tx from the second output interface UART1-Tx and the output ϕUART0-Tx from the first output interface UART0-Tx can be supplied as the signal to be transmitted to the transmitting port UART-Tx. In addition, for example, in the second test mode (third mode), the drivability of the output ϕUART2-Tx from the third output interface UART2-Tx is larger than the drivability of the output ϕUART1-Tx from the second output interface UART1-Tx and the output ϕUART0-Tx from the third output interface UART2-Tx can be supplied as the signal to be transmitted to the transmitting port UART-Tx. That is, when a signal is transmitted, it is possible to prevent the signals output from the first output interface UART0-Tx, the second output interface UART1-Tx, and the third output interface UART2-Tx from being mixed up and thus transmit an appropriate signal. In other words, when the low-speed interface 330a of the controller CTR300 includes a plurality of output interfaces which output three values, it is possible to reduce the number of transmitting ports UART-Tx (the number of pins) required to transmit an appropriate signal (for example, to 1).

In the third embodiment, the controller CTR300 outputs the first signal which is selected from a plurality of first signals including high impedance from the first output interface UART0-Tx, outputs the second signal which is selected from a plurality of second signals without including high impedance from the second output interface UART1-Tx, and outputs the third value which is selected from a plurality of third values including high impedance from the third output interface UART2-Tx. Therefore, when the output φUART1-Tx from the second output interface UART1-Tx is to be transmitted as the signal to be transmitted to the transmitting port UART-Tx, the output φUART0-Tx from the first output interface UART0-Tx and the output φUART2-Tx from the third output interface UART2-Tx are each set to high impedance, which makes it possible to supply the output φUART1-Tx from the second output interface UART1-Tx as the signal to be transmitted to the transmitting port UART-Tx. That is, when a signal is transmitted, it is possible to prevent the signals output from the first output interface UART0-Tx and the second output interface UART1-Tx from being mixed up and thus transmit an appropriate signal.

In the third embodiment, the controller CTR300 supplies the first signal output from the first output interface UART0-Tx as the signal to be transmitted to the transmitting port UART-Tx in the normal mode (first mode), supplies the second signal output from the second output interface UART1-Tx as the signal to be transmitted to the transmitting port UART-Tx in the test mode (second mode), and supplies the third value output from the third output interface UART2-Tx as the signal to be transmitted to the transmitting port UART-Tx in the second test mode (third mode). Therefore, it is possible to transmit an appropriate signal in each operation mode.

In the third embodiment, in the normal mode (first mode), the controller CTR300 receives the value input to the first input interface UART0-Rx as the received signal and ignores the value input to the second input interface UART1-Rx and the value input to the third input interface UART2-Rx. In the test mode (second mode), the controller CTR300 receives the value input to the second input interface UART1-Rx as the received signal and ignores the value input to the first input interface UART0-Rx and the value input to the third input interface UART2-Rx. In the second test mode (third mode), the controller CTR300 receives the value input to the third input interface UART2-Rx as the received signal and ignores the value input to the first input interface UART0-Rx and the value input to the second input interface UART1-Rx. Therefore, it is possible to receive and process an appropriate signal in each operation mode.

Therefore, when a signal is received and processed, it is possible to prevent the signals received by the first input interface UART0-Rx, the second input interface UART1-Rx, and the third input interface UART2-Rx from being mixed up and thus receive and process an appropriate signal. In other words, it is possible to reduce the number of receiving ports UART-Rx (the number of pins) required to receive and process an appropriate signal (for example, to 1).

In the memory system 300 according to the third embodiment, the resistance value of the second resistor $\Omega 1$ is greater than that of the first resistor $\Omega 0$ such that the first signal output from the first output interface UART0-Tx can be supplied to the transmitting port UART-Tx when the fixed-level second signal is output from the second output interface UART1-Tx and the third value (high impedance) is output from the third output interface UART2-Tx in the normal mode (first mode). In addition, the resistance value of the second resistor $\Omega 1$ is greater than that of the fifth resistor $\Omega 4$ such that the third value output from the third output interface UART2-Tx can be supplied to the transmitting port UART-Tx when the first signal (high impedance) is output from the first output interface UART0-Tx and the fixed-level second signal is output from the second output interface UART1-Tx in the second test mode (third mode). Therefore, the output φUART0-Tx from the first output interface UART0-Tx can be supplied as the signal to be transmitted to the transmitting port UART-Tx in the normal mode (first mode) and the output φUART2-Tx from the third output interface UART2-Tx can be supplied as the signal to be transmitted to the transmitting port UART-Tx in the second test mode (third mode).

In the third embodiment, in the normal mode (first mode), the controller CTR300 outputs the first voltage and/or the second voltage (for example, a signal transitions between the high level and the low level) from the first output interface UART0-Tx, steadily outputs the third voltage (for example, a high-level voltage) from the second output interface UART1-Tx, and outputs high impedance from the third output interface UART2-Tx. In the test mode (second mode), the controller CTR300 outputs high impedance from the first output interface UART0-Tx, outputs the third voltage and/or the fourth voltage (for example, a signal transitions between the high level and the low level) from the second output interface UART1-Tx, and outputs high impedance from the third output interface UART2-Tx. In the second test mode (third mode), the controller CTR300 outputs high impedance from the first output interface UART0-Tx, steadily outputs the third voltage (for example, a high-level voltage) from the second output interface UART1-Tx, and outputs the fifth voltage and/or the sixth voltage (for example, a signal transitions between the high level and the low level) from the third output interface UART2-Tx. Therefore, in the normal mode (first mode), the first signal output from the first output interface UART0-Tx can be supplied as the signal to be transmitted to the transmitting port UART-Tx. In the test mode (second mode), the second signal output from the second output interface UART1-Tx can be supplied as the signal to be transmitted to the transmitting port UART-Tx. In the second test mode (third mode), the third value output from the third output interface UART2-Tx can be supplied as the signal to be transmitted to the transmitting port UART-Tx.

In the memory system 300 according to the third embodiment, the resistance value of the second resistor $\Omega 1$ is greater than that of the first resistor $\Omega 0$ such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx and high impedance is output from the third output interface UART2-Tx in the normal mode (first mode). In addition, the resistance value of the second resistor Ω1 is greater than that of the fifth resistor Ω4 such that the fifth voltage and/or the sixth voltage (for example, a signal transitions between the high level and the low level) output from the third output interface UART2-Tx can be supplied to the transmitting port UART-Tx when high impedance is output from the first output interface UART0-Tx and the third voltage (for example, a high-level voltage) is steadily output from the second output interface UART1-Tx in the second test mode (third mode). Therefore, in the normal mode (first mode), the output φUART0-Tx from the first output interface UART0-Tx can be supplied as the signal to be transmitted to the transmitting port UART-Tx. In the second test mode (third mode), the output φUART0-Tx from the third output interface UART2-Tx can be supplied as the signal to be transmitted to the transmitting port UART-Tx.

In the third embodiment, an example in which the low-speed interface 330a of the controller CTR300 includes two output interfaces for UART communication which output three values has been described. However, the third embodiment can also be applied to a case in which the low-speed interface 330a of the controller CTR300 includes three or more output interfaces for UART communication which output three values.

(Fourth Embodiment)

Next, a memory system according to a fourth embodiment will be described. Hereinafter, the fourth embodiment will be described with an emphasis on the difference from the third embodiment.

In the third embodiment, the controller CTR300 pulls up the output φUART1-Tx from the second output interface UART1-Tx to the third voltage (for example, a high-level voltage) in the normal mode (first mode) and the second test mode (third mode). However, in the fourth embodiment, the controller CTR300 pulls down the output φUART1-Tx from the second output interface UART1-Tx to a fourth voltage (for example, a low-level voltage) in the normal mode (first mode) and the second test mode (third mode).

Specifically, the operation of a memory system 300 differs from that in the first embodiment in the following points, as illustrated in FIGS. 31 and 32. FIG. 31 is a flowchart illustrating the operation of the memory system 300. FIG. 32 is a diagram illustrating the operation of the memory system 300.

In the fourth embodiment, Step S404 and Step S408 are performed instead of Step S304 and Step S308 (see FIG. 23).

In Step S404, the controller CTR300 performs a transition to the normal mode.

For example, when a signal is transmitted after the operation mode is switched to the normal mode, the controller CTR300 outputs a first voltage and/or a second voltage (for example, a signal transitions between the high level and the low level) from a first output interface UART0-Tx, steadily outputs a fourth voltage (for example, a low-level voltage) from a second output interface UART1-Tx, and outputs high impedance from a third output interface UART2-Tx. For example, the controller CTR300 pulls down an output φUART1-Tx from the second output interface UART1-Tx to the low level and uses an output φUART0-Tx from the first output interface UART0-Tx as a signal which transitions between the high level and the low level and is to be transmitted, with an output φUART2-Tx from the third output interface UART2-Tx set to high impedance (see FIG. 32).

In this case, the resistance value of a second resistor Ω1 is greater than that of a first resistor Ω0 such that the first voltage and/or the second voltage (for example, a signal transitions between the high level and the low level) output from the first output interface UART0-Tx can be supplied to the transmitting port UART-Tx when the fourth voltage (for example, a low-level voltage) is steadily output from the second output interface UART1-Tx and high impedance is output from the third output interface UART2-Tx in the normal mode (first mode). Therefore, in the normal mode (first mode), the drivability of the output φUART0-Tx from the first output interface UART0-Tx is larger than the drivability of the output φUART1-Tx from the second output interface UART1-Tx, and the output φUART0-Tx from the first output interface UART0-Tx is supplied as the signal to be transmitted to the transmitting port UART-Tx. Then, the transmitting port UART-Tx transmits the signal to be transmitted to a host apparatus 100.

In Step S408, the controller CTR300 performs a transition to the second test mode.

For example, when a signal is transmitted after the operation mode is switched to the second test mode, the controller CTR300 outputs the fifth voltage and/or the sixth voltage (for example, a signal transitions between the high level and the low level) from the third output interface UART2-Tx, steadily outputs the fourth voltage (for example, a low-level voltage) from the second output interface UART1-Tx, and outputs high impedance from the first output interface UART0-Tx. For example, the controller CTR300 pulls down the output φUART1-Tx from the second output interface UART1-Tx to the low level and uses the output φUART2-Tx from the third output interface UART2-Tx as the signal which transitions between the high level and the low level and is to be transmitted, with the output φUART0-Tx from the first output interface UART0-Tx set to high impedance (see FIG. 32).

In this case, the resistance value of the second resistor Ω1 is greater than that of the fifth resistor Ω4 such that the fifth voltage and/or the sixth voltage (for example, a signal transitions between the high level and the low level) output from the third output interface UART2-Tx can be supplied to the transmitting port UART-Tx when the fourth voltage (for example, a low-level voltage) is steadily output from the second output interface UART1-Tx and high impedance is output from the first output interface UART0-Tx in the second test mode (third mode). Therefore, in the second test mode (third mode), the drivability of the output φUART2-Tx from the third output interface UART2-Tx is larger than the drivability of the output φUART1-Tx from the second output interface UART1-Tx, and the output φUART2-Tx from the third output interface UART2-Tx is supplied as the signal to be transmitted to the transmitting port UART-Tx. Then, the transmitting port UART-Tx transmits the signal to be transmitted to the host apparatus 100.

Figure 33:
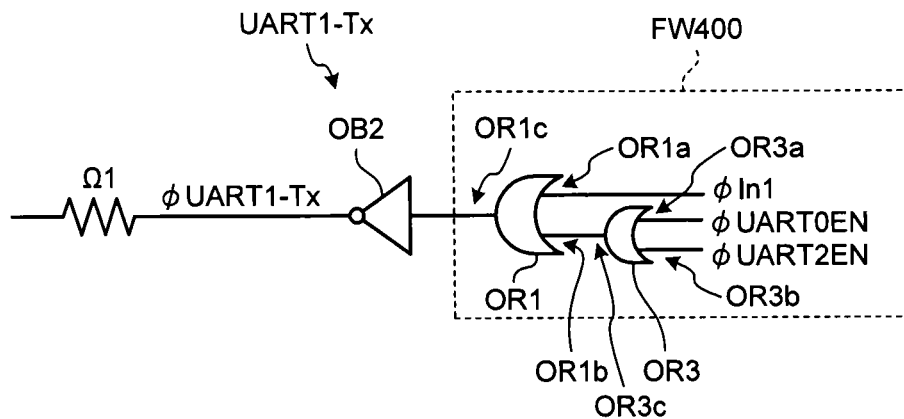
FIG. 33 is a diagram illustrating the structure of a mode control unit in the fourth embodiment.

A structure for controlling the second output interface UART1-Tx in a mode control unit FW400 differs from that in the third embodiment in the following points, as illustrated in FIG. 33. FIG. 33 is a diagram illustrating the structure for controlling the second output interface UART1-Tx in the mode control unit FW400.

The mode control unit FW400 further includes, for example, an OR gate OR3 as the structure for controlling the second output interface UART1-Tx, as compared to the structure illustrated in FIG. 20. The OR gate OR3 receives a control signal φUART0EN using an input terminal OR3a, receives a control signal φUART2EN using an input terminal OR3b, calculates the logical sum of the control signal φUART0EN and the control signal φUART2EN, and supplies the calculation result (φUART0EN+φUART2EN) from an output terminal OR3c to an OR gate OR1. The OR gate OR1 calculates the logical sum of a transmission control signal φIn1 to be transmitted and the control signal (φUART0EN+φUART2EN) and outputs the calculation result.

Figure 34:
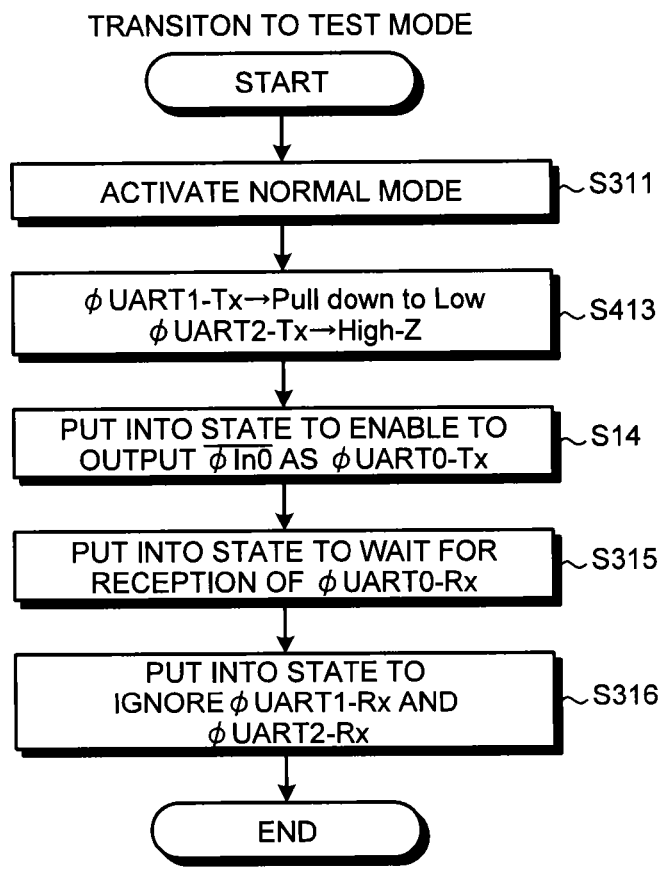
FIG. 34 is a flowchart illustrating a transition in the operation mode to the normal mode in the fourth embodiment.

The details of a transition in the operation mode to the normal mode (Step S404 in FIG. 31) differ from those in the third embodiment in the following points, as illustrated in FIG. 34. FIG. 34 is a flowchart illustrating the operation of the controller CTR300 in the normal mode.

In the fourth embodiment, Step S413 is performed instead of Step S313 (see FIG. 28).

In Step S413, the mode control unit FW400 pulls down the output φUART1-Tx from the second output interface UART1-Tx to the low level and sets the output φUART2-Tx of the third output interface UART2-Tx to high impedance. For example, the mode control unit FW400 controls the second output interface UART1-Tx and the third output interface UART2-Tx such that the output φUART1-Tx from the second output interface UART1-Tx is pulled down to the low level and the output φUART2-Tx from the third output interface UART2-Tx is set to high impedance.

For example, since the control signal (φUART0EN+φUART2EN) changes to an active level (for example, a high level), the OR gate OR1 (see FIG. 33) supplies a voltage fixed to the low level as a control signal φVin1 (see FIG. 12) to a second PMOS transistor PM2 and a second NMOS transistor NM2. Then, the second PMOS transistor PM2 and the second NMOS transistor NM2 logically invert the voltage fixed to the low level to generate a voltage fixed to the high level and the voltage fixed to the high level is output as the output φUART1-Tx.

For example, a selector SLC3 (see FIG. 27) selects an input terminal SLC3b and supplies a voltage fixed to the high level as a control signal φVin2A to a third PMOS transistor PM3. A selector SLC4 (see FIG. 27) selects an input terminal SLC4b and supplies a voltage fixed to the low level as a control signal φVin2B to a third NMOS transistor NM3. Then, the third PMOS transistor PM3 and the third NMOS transistor NM3 are both turned off to set an output node ON3 to high impedance and the high impedance is output as the output φUART2-Tx.

Figure 35:
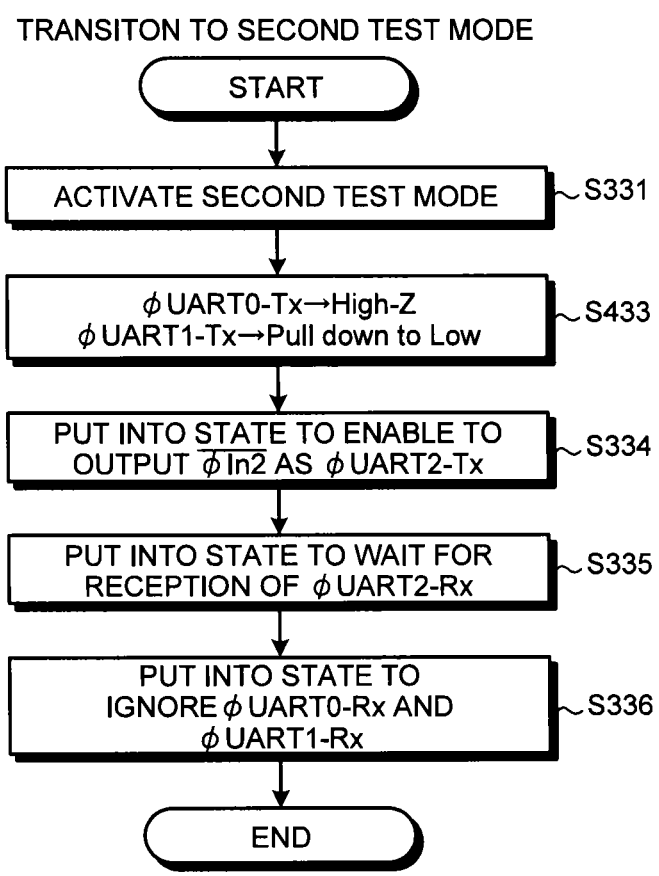
FIG. 35 is a flowchart illustrating a transition in the operation mode to the second test mode in the fourth embodiment.

The details of the operation in the second test mode (Step S408 in FIG. 31) differ from those in the third embodiment in the following points, as illustrated in FIG. 35. FIG. 35 is a flowchart illustrating the operation of the controller CTR300 in the second test mode.

In the fourth embodiment, Step S433 is performed instead of Step S333 (see FIG. 30).

In Step S433, the mode control unit FW400 sets the output φUART0-Tx from the first output interface UART0-Tx to high impedance and pulls down the output φUART1-Tx from the second output interface UART1-Tx to the low level. For example, the mode control unit FW400 controls the first output interface UART0-Tx and the second output interface UART1-Tx such that the output φUART0-Tx from the first output interface UART0-Tx is set to high impedance and the output φUART1-Tx from the second output interface UART1-Tx is pulled down to the low level.

For example, a selector SLC1 (see FIG. 14) selects an input terminal SLC1b and supplies a voltage fixed to the high level as a control signal φVin0 A (see FIG. 10) to a first PMOS transistor PM1 of the first output interface UART0-Tx. A selector SLC2 (see FIG. 14) selects an input terminal SLC2b and supplies a voltage fixed to the low level as a control signal φVin0 B (see FIG. 10) to a first NMOS transistor NM1 of the first output interface UART0-Tx.

Then, the first PMOS transistor PM1 and the first NMOS transistor NM1 of the first output interface UART0-Tx are both turned off to set an output node ON1 to high impedance and the high impedance is output as the output φUART0-Tx.

For example, since the control signal (φUART0EN+φUART2EN) transitions to an active level (for example, a high level), the OR gate OR1 (see FIG. 33) supplies a voltage fixed to the high level as the control signal φVin1 (see FIG. 12) to the second PMOS transistor PM2 and the second NMOS transistor NM2. Then, the second PMOS transistor PM2 and the second NMOS transistor NM2 logically invert the voltage fixed to the high level to generate a voltage fixed to the low level and the voltage fixed to the low level is output as the output φUART1-Tx.

The resistance value of the second resistor Ω1 is greater than that of the first resistor Ω0 such that the first voltage and/or the second voltage (for example, a signal transitions between the high level and the low level) output from the first output interface UART0-Tx can be supplied to the transmitting port UART-Tx when the fourth voltage (for example, a low-level voltage) is steadily output from the second output interface UART1-Tx and high impedance is output from the third output interface UART2-Tx in the normal mode (first mode).

In addition, the resistance value of the second resistor Ω1 is greater than that of the fifth resistor Ω4 such that the fifth voltage and/or the sixth voltage (for example, a signal transitions between the high level and the low level) output from the third output interface UART2-Tx can be supplied to the transmitting port UART-Tx when the fourth voltage (for example, a low-level voltage) is steadily output from the second output interface UART1-Tx and high impedance is output from the first output interface UART0-Tx in the second test mode (third mode).

As described above, in the memory system 300 according to the fourth embodiment, in the normal mode (first mode), the controller CTR300 outputs the first voltage and/or the second voltage (for example, a signal transitions between the high level and the low level) from the first output interface UART0-Tx, steadily outputs the fourth voltage (for example, a low-level voltage) from the second output interface UART1-Tx, and outputs high impedance from the third output interface UART2-Tx. In the test mode (second mode), the controller CTR300 outputs high impedance from the first output interface UART0-Tx, outputs the third voltage and/or the fourth voltage (for example, a signal transitions between the high level and the low level) from the second output interface UART1-Tx, and outputs high impedance from the third output interface UART2-Tx. In the second test mode (third mode), the controller CTR300 outputs high impedance from the first output interface UART0-Tx, steadily outputs the fourth voltage (for example, a low-level voltage) from the second output interface UART1-Tx, and outputs the fifth voltage and/or the sixth voltage (for example, a signal transitions between the high level and the low level) from the third output interface UART2-Tx. Therefore, in the normal mode (first mode), the first signal output from the first output interface UART0-Tx can be supplied as the signal to be transmitted to the transmitting port UART-Tx. In the test mode (second mode), the second signal output from the second output interface UART1-Tx can be supplied as the signal to be transmitted to the transmitting port UART-Tx. In the second test mode (third mode), the third value output from the third output interface UART2-Tx can be supplied as the signal to be transmitted to the transmitting port UART-Tx.

In the memory system 300 according to the fourth embodiment, the resistance value of the second resistor Ω1 is greater than that of the first resistor Ω0 such that the first voltage and/or the second voltage (for example, a signal transitions between the high level and the low level) output from the first output interface UART0-Tx can be supplied to the transmitting port UART-Tx when the fourth voltage (for example, a low-level voltage) is steadily output from the second output interface UART1-Tx and high impedance is output from the third output interface UART2-Tx in the normal mode (first mode). In addition, the resistance value of the second resistor Ω1 is greater than that of the fifth resistor Ω4 such that the fifth voltage and/or the sixth voltage (for example, a signal transitions between the high level and the low level) output from the third output interface UART2-Tx can be supplied to the transmitting port UART-Tx when high impedance is output from the first output interface UART0-Tx and the fourth voltage (for example, a low-level voltage) is steadily output from the second output interface UART1-Tx in the second test mode (third mode). Therefore, in the normal mode (first mode), the output φUART0-Tx from the first output interface UART0-Tx can be supplied as the signal to be transmitted to the transmitting port UART-Tx. In the second test mode (third mode), the output φUART0-Tx from the third output interface UART2-Tx can be supplied as the signal to be transmitted to the transmitting port UART-Tx.

(Fifth Embodiment)

Next, a memory system 500 according to a fifth embodiment will be described. Hereinafter, the fifth embodiment will be described with an emphasis on the difference from the first embodiment.

In the first embodiment, the structure of the low-speed line SLa has been conceived in order to reduce the number of transmitting ports for transmitting an appropriate signal. However, in the fifth embodiment, the structure of a low-speed interface 530a is conceived in order to reduce the number of transmitting ports for transmitting an appropriate signal.

Figure 36:
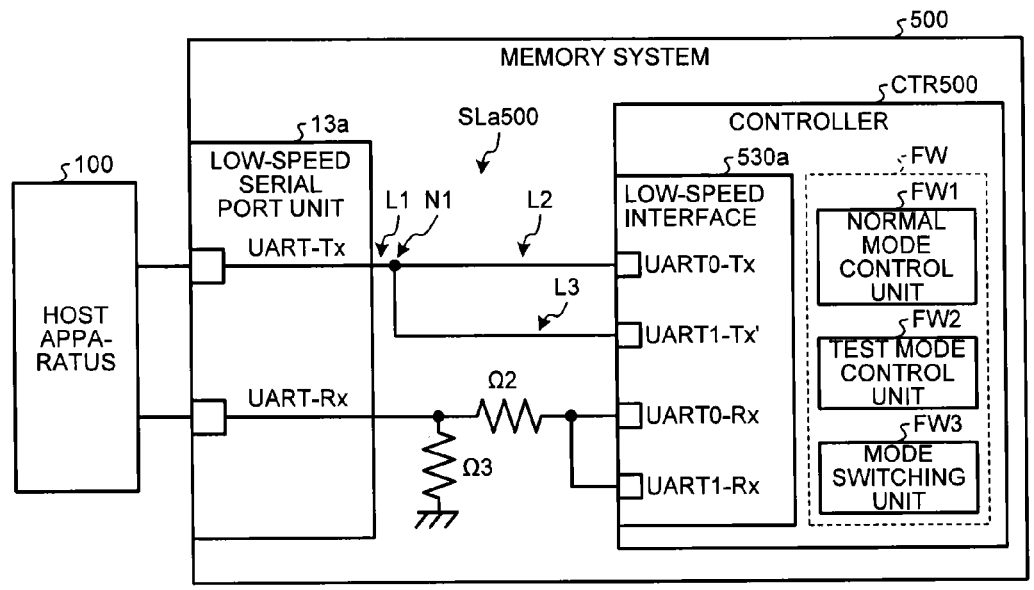
FIG. 36 is a diagram illustrating the structure of a memory system according to a fifth embodiment.

Specifically, the memory system 500 is configured as illustrated in FIG. 36. FIG. 36 is a diagram illustrating a structure related to a low-speed communication interface (a low-speed serial port unit 13a and a low-speed interface 530a) in the memory system 500.

The memory system 500 includes a controller CTR500 and low-speed lines SLa500 as the structure related to the low-speed communication interface, instead of the controller CTR and the low-speed lines SLa (see FIG. 5).

The low-speed lines SLa500 connect a transmitting port UART-Tx of the low-speed serial port unit 13a to a first output interface UART0-Tx of the low-speed interface 530a, without a first resistor Ω0 (see FIG. 5) interposed therebetween. In addition, the low-speed line SLa500 connects the transmitting port UART-Tx of the low-speed serial port unit 13a to a second output interface UART1-Tx' of the low-speed interface 530a, without a second resistor Ω1 (see FIG. 5) interposed therebetween.

Specifically, the low-speed lines SLa500 do not include the first resistor Ω0 and the second resistor Ω1. For example, the first resistor Ω0 is not provided on the line L2. The second resistor Ω1 is not provided on the line L3.

The controller CTR500 includes the low-speed interface 530a, instead of the low-speed interface 30a (see FIG. 5). The low-speed interface 530a includes the second output interface UART1-Tx', instead of the second output interface UART1-Tx (see FIG. 5). The second output interface UART1-Tx' has a different internal structure from that in the first embodiment. For example, the dimension (=W/L, W: a channel width and L: a channel length) of a second PMOS transistor PM2' (see FIGS. 37 and 38) of the second output interface UART1-Tx' is less than the dimension of the first PMOS transistor PM1 (see FIG. 10) of the first output interface UART0-Tx.

For example, the dimension of the second PMOS transistor PM2' is less than the dimension of the first PMOS transistor PM1 such that a first signal output from the first output interface UART0-Tx can be supplied to the transmitting port UART-Tx when a fixed-level second signal is output from the second output interface UART1-Tx' in the normal mode (first mode).

That is, the dimension of the second PMOS transistor PM2' is less than the dimension of the first PMOS transistor PM1 such that a first voltage and/or a second voltage (for example, a signal transitions between the high level and the low level) output from the first output interface UART0-Tx can be supplied to the transmitting port UART-Tx when a third voltage (for example, a high-level voltage) is steadily output from the second output interface UART1-Tx' in the normal mode (first mode).

For example, the dimension of the second PMOS transistor PM2' is less than the dimension of the first PMOS transistor PM1 such that the on-resistance value of the second PMOS transistor PM2' is about ten times more than that of the first PMOS transistor PM1.

Figure 37:
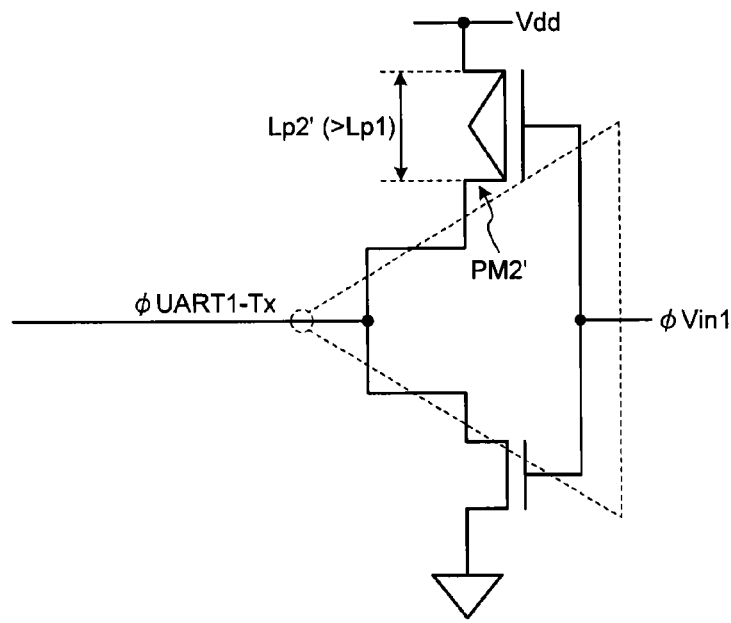
FIG. 37 is a diagram illustrating the structure of a second output interface in the fifth embodiment.

For example, as illustrated in FIG. 37, the second PMOS transistor PM2' is configured such that a channel length Lp2' of the second PMOS transistor PM2' is more than a channel length Lp1 (see FIG. 10) of the first PMOS transistor PM1. Therefore, the dimension of the second PMOS transistor PM2' can be less than the dimension of the first PMOS transistor PM1.

Figure 38:
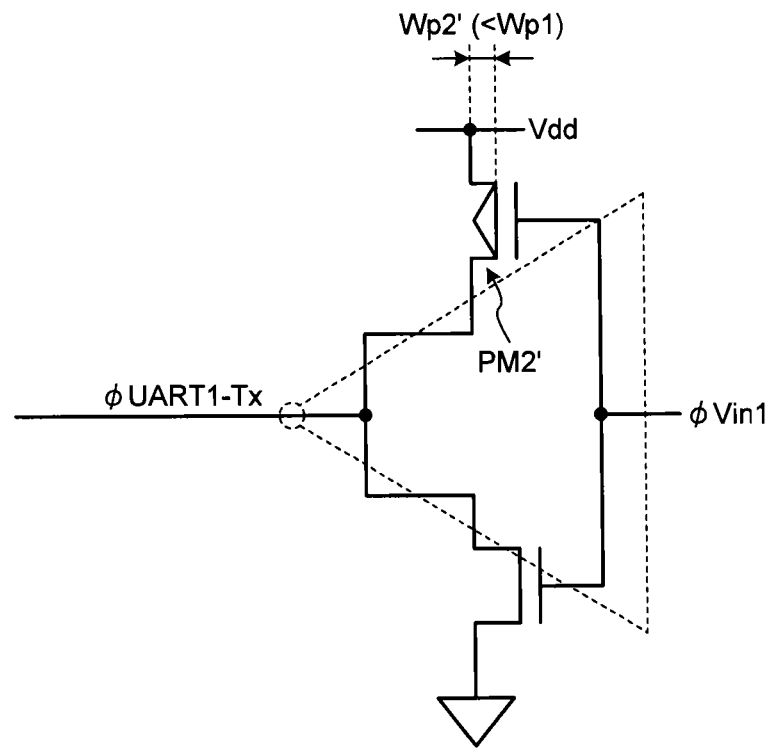
FIG. 38 is a diagram illustrating the structure of the second output interface in the fifth embodiment.

Alternatively, for example, as illustrated in FIG. 38, the second PMOS transistor PM2' is configured such that a channel width Wp2' of the second PMOS transistor PM2' is less than a channel width Wp1 (see FIG. 10) of the first PMOS transistor PM1. Therefore, the dimension of the second PMOS transistor PM2' can be less than the dimension of the first PMOS transistor PM1.

Alternatively, for example, the structures illustrated in FIGS. 37 and 38 are combined with each other to configure the second PMOS transistor PM2' such that the channel length Lp2' of the second PMOS transistor PM2' is more than the channel length Lp1 (see FIG. 10) of the first PMOS transistor PM1 and the channel width Wp2' of the second PMOS transistor PM2' is less than the channel width Wp1 (see FIG. 10) of the first PMOS transistor PM1. Therefore, the dimension of the second PMOS transistor PM2' can be less than the dimension of the first PMOS transistor PM1.

As described above, in the memory system 500 according to the fifth embodiment, the first output interface UART0-Tx of the low-speed interface 530a in the controller CTR500 is connected to the transmitting port UART-Tx of the low-speed serial port unit 13a. In addition, the second output interface UART1-Tx' of the low-speed interface 530a in the controller CTR500 is connected to the transmitting port UART-Tx of the low-speed serial port unit 13a. That is, the first output interface UART0-Tx and the second output interface UART1-Tx' of the controller CTR500 share the transmitting port UART-Tx of a connector 13.

In this case, the dimension (=W/L, W: a channel width and L: a channel length) of the second PMOS transistor PM2' (see FIGS. 37 and 38) of the second output interface UART1-Tx' is less than the dimension of the first PMOS transistor PM1 (see FIG. 10) of the first output interface UART0-Tx. For example, the dimension of the second PMOS transistor PM2' is less than the dimension of the first PMOS transistor PM1 such that the first signal output from the first output interface UART0-Tx can be supplied to the transmitting port UART-Tx when the fixed-level second signal is output from the second output interface UART1-Tx' in the normal mode (first mode). That is, the dimension of the second PMOS transistor PM2' is less than the dimension of the first PMOS transistor PM1 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx' in the normal mode (first mode).

Therefore, for example, in the normal mode (first mode), the drivability of an output φUART0-Tx from the first output interface UART0-Tx is larger than the drivability of an output φUART1-Tx from the second output interface UART1-Tx' and the output φUART0-Tx from the first output interface UART0-Tx can be supplied as the signal to be transmitted to the transmitting port UART-Tx. That is, when a signal is transmitted, it is possible to prevent the signals output from the first output interface UART0-Tx and the second output interface UART1-Tx' from being mixed up and thus transmit an appropriate signal. In other words, it is possible to reduce the number of transmitting ports UART-Tx (the number of pins) required to transmit an appropriate signal (for example, to 1).

In the memory system 500 according to the fifth embodiment, the dimension of the second PMOS transistor PM2' is less than the dimension of the first PMOS transistor PM1 such that the first signal output from the first output interface UART0-Tx can be supplied to the transmitting port UART-Tx when the fixed-level second signal is output from the second output interface UART1-Tx' in the normal mode (first mode). Therefore, in the normal mode (first mode), the output φUART0-Tx from the first output interface UART0-Tx can be supplied as the signal to be transmitted to the transmitting port UART-Tx.

In the memory system 500 according to the fifth embodiment, the dimension of the second PMOS transistor PM2' is less than the dimension of the first PMOS transistor PM1 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx' in the normal mode (first mode). Therefore, in the normal mode (first mode), the output φUART0-Tx from the first output interface UART0-Tx can be supplied as the signal to be transmitted to the transmitting port UART-Tx.

It should be noted that the second output interface UART1-Tx' may be configured such that the dimension of the second PMOS transistor PM2' is less than the dimension of the first PMOS transistor PM1 and the dimension of the second NMOS transistor NM2' is less than the dimension of the first PMOS transistor PM1.

(Sixth Embodiment)

Next, a memory system 500 according to a sixth embodiment will be described. Hereinafter, the sixth embodiment will be described with an emphasis on the difference from the second embodiment.

In the second embodiment, the structure of the low-speed lines SLa has been conceived in order to reduce the number of transmitting ports for transmitting an appropriate signal. However, in the sixth embodiment, the structure of a low-speed interface 530a is conceived in order to reduce the number of transmitting ports for transmitting an appropriate signal.

Specifically, the memory system 500 is configured as illustrated in FIG. 36. FIG. 36 is a diagram illustrating a structure related to a low-speed communication interface (a low-speed serial port unit 13a and a low-speed interface 530a) in the memory system 500.

The memory system 500 includes a controller CTR500 and a low-speed line SLa500 as the structure related to the low-speed communication interface, instead of the controller CTR and the low-speed line SLa (see FIG. 5).

The low-speed line SLa500 connects a transmitting port UART-Tx of the low-speed serial port unit 13a to a first output interface UART0-Tx of the low-speed interface 530a, without a first resistor Ω0 (see FIG. 5) interposed therebetween. In addition, the low-speed line SLa500 connects the transmitting port UART-Tx of the low-speed serial port unit 13a to a second output interface UART1-Tx' of the low-speed interface 530a, without a second resistor Ω1 (see FIG. 5) interposed therebetween.

Specifically, the low-speed lines SLa500 do not include the first resistor Ω0 and the second resistor Ω1. For example, the first resistor Ω0 is not provided on the line L2. The second resistor Ω1 is not provided on the line L3.

The controller CTR500 includes the low-speed interface 530a, instead of the low-speed interface 30a (see FIG. 5). The low-speed interface 530a includes the second output interface UART1-Tx', instead of the second output interface UART1-Tx (see FIG. 5). The second output interface UART1-Tx' has a different internal structure from that in the second embodiment. For example, the dimension (=W/L, W: a channel width and L: a channel length) of a second NMOS transistor NM2' (see FIGS. 39 and 40) of the second output interface UART1-Tx' is less than the dimension of the first NMOS transistor NM1 (see FIG. 10) of the first output interface UART0-Tx.

For example, the dimension of the second NMOS transistor NM2' is less than the dimension of the first NMOS transistor NM1 such that a first signal output from the first output interface UART0-Tx can be supplied to the transmitting port UART-Tx when a fixed-level second signal is output from the second output interface UART1-Tx' in the normal mode (first mode).

That is, the dimension of the second NMOS transistor NM2' is less than the dimension of the first NMOS transistor NM1 such that a first voltage and/or a second voltage (for example, a signal transitions between the high level and the low level) output from the first output interface UART0-Tx can be supplied to the transmitting port UART-Tx when a fourth voltage (for example, a low-level voltage) is steadily output from the second output interface UART1-Tx' in the normal mode (first mode).

For example, the dimension of the second NMOS transistor NM2' is less than the dimension of the first NMOS transistor NM1 such that the on-resistance value of the second NMOS transistor NM2' is about ten times more than that of the first NMOS transistor NM1.

Figure 39:
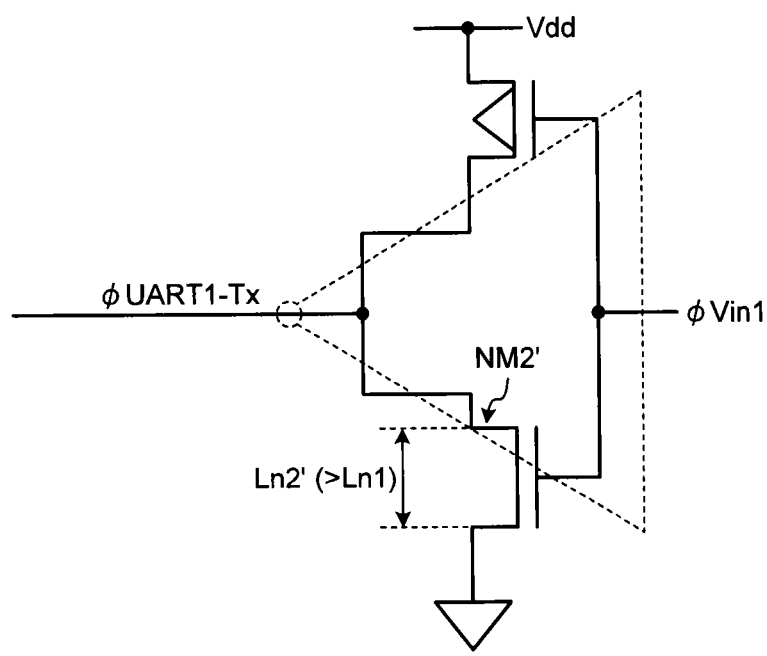
FIG. 39 is a diagram illustrating the structure of a second output interface in a sixth embodiment.

For example, as illustrated in FIG. 39, the second NMOS transistor NM2' is configured such that a channel length Ln2' of the second NMOS transistor NM2' is more than a channel length Ln1 (see FIG. 10) of the first NMOS transistor NM1. Therefore, the dimension of the second NMOS transistor NM2' can be less than the dimension of the first NMOS transistor NM1.

Figure 40:
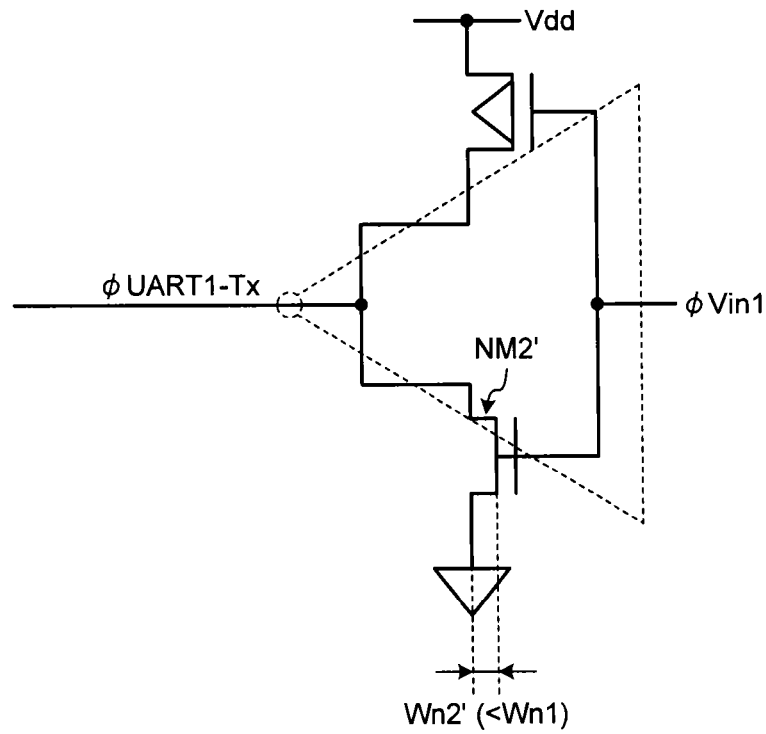
FIG. 40 is a diagram illustrating the structure of the second output interface in the sixth embodiment.

Alternatively, for example, as illustrated in FIG. 40, the second NMOS transistor NM2' is configured such that a channel width Wn2' of the second NMOS transistor NM2' is less than a channel width Wn1 (see FIG. 10) of the first NMOS transistor NM1. Therefore, the dimension of the second NMOS transistor NM2' can be less than the dimension of the first NMOS transistor NM1.

Alternatively, for example, the structures illustrated in FIGS. 39 and 40 are combined with each other to configure the second NMOS transistor NM2' such that the channel length Ln2' of the second NMOS transistor NM2' is more than the channel length Ln1 (see FIG. 10) of the first NMOS transistor NM1 and the channel width Wn2' of the second NMOS transistor NM2' is less than the channel width Wn1 (see FIG. 10) of the first NMOS transistor NM1. Therefore, the dimension of the second NMOS transistor NM2' can be less than the dimension of the first NMOS transistor NM1.

As described above, in the memory system 500 according to the sixth embodiment, the first output interface UART0-Tx f the low-speed interface 530a in the controller CTR500 is connected to the transmitting port UART-Tx of the low-speed serial port unit 13a. In addition, the second output interface UART1-Tx' of the low-speed interface 530a in the controller CTR500 is connected to the transmitting port UART-Tx of the low-speed serial port unit 13a. That is, the first output interface UART0-Tx and the second output interface UART1-Tx' of the controller CTR500 share the transmitting port UART-Tx of a connector 13.

In this case, the dimension (=W/L, W: a channel width and L: a channel length) of a second NMOS transistor NM2' (see FIGS. 39 and 40) of the second output interface UART1-Tx' is less than the dimension of a first NMOS transistor NM1 (see FIG. 10) of the first output interface UART0-Tx. For example, the dimension of the second NMOS transistor NM2' is less than the dimension of the first NMOS transistor NM1 such that the first signal output from the first output interface UART0-Tx can be supplied to the transmitting port UART-Tx when the fixed-level second signal is output from the second output interface UART1-Tx' in the normal mode (first mode). That is, the dimension of the second NMOS transistor NM2' is less than the dimension of the first NMOS transistor NM1 such that the first voltage and/or the second voltage (for example, a signal transitions between the high level and the low level) output from the first output interface UART0-Tx can be supplied to the transmitting port UART-Tx when the fourth voltage (for example, a low-level voltage) is steadily output from the second output interface UART1-Tx' in the normal mode (first mode).

Therefore, for example, in the normal mode (first mode), the drivability of an output ɸUART0-Tx from the first output interface UART0-Tx is larger than the drivability of an output ɸUART1-Tx from the second output interface UART1-Tx' and the output ɸUART0-Tx from the first output interface UART0-Tx can be supplied as the signal to be transmitted to the transmitting port UART-Tx. That is, when a signal is transmitted, it is possible to prevent the signals output from the first output interface UART0-Tx and the second output interface UART1-Tx' from being mixed up and thus transmit an appropriate signal. In other words, it is possible to reduce the number of transmitting ports UART-Tx (the number of pins) required to transmit an appropriate signal (for example, to 1).

In the memory system 500 according to the sixth embodiment, the dimension of the second NMOS transistor NM2' is less than the dimension of the first NMOS transistor NM1 such that the first signal output from the first output interface UART0-Tx can be supplied to the transmitting port UART-Tx when the fixed-level second signal is output from the second output interface UART1-Tx' in the normal mode (first mode). Therefore, in the normal mode (first mode), the output ɸUART0-Tx from the first output interface UART0-Tx can be supplied as the signal to be transmitted to the transmitting port UART-Tx.

In the memory system 500 according to the sixth embodiment, the dimension of the second NMOS transistor NM2' is less than the dimension of the first NMOS transistor NM1 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx' in the normal mode (first mode). Therefore, in the normal mode (first mode), the output ɸUART0-Tx from the first output interface UART0-Tx can be supplied as the signal to be transmitted to the transmitting port UART-Tx.

It should be noted that the second output interface UART1-Tx' may be configured such that the dimension of the second PMOS transistor PM2' is less than the dimension of the first PMOS transistor PM1 and the dimension of the second NMOS transistor NM2' is less than the dimension of the first PMOS transistor PM1.

(Seventh Embodiment)

Next, a memory system 500 according to a seventh embodiment will be described. Hereinafter, the seventh embodiment will be described with an emphasis on the difference from the fifth embodiment.

In the fifth embodiment, the low-speed interface 530a has the same structure for a plurality of operation modes. However, in the seventh embodiment, the structure of the low-speed interface 530a dynamically changes depending on the operation mode.

Figure 41:
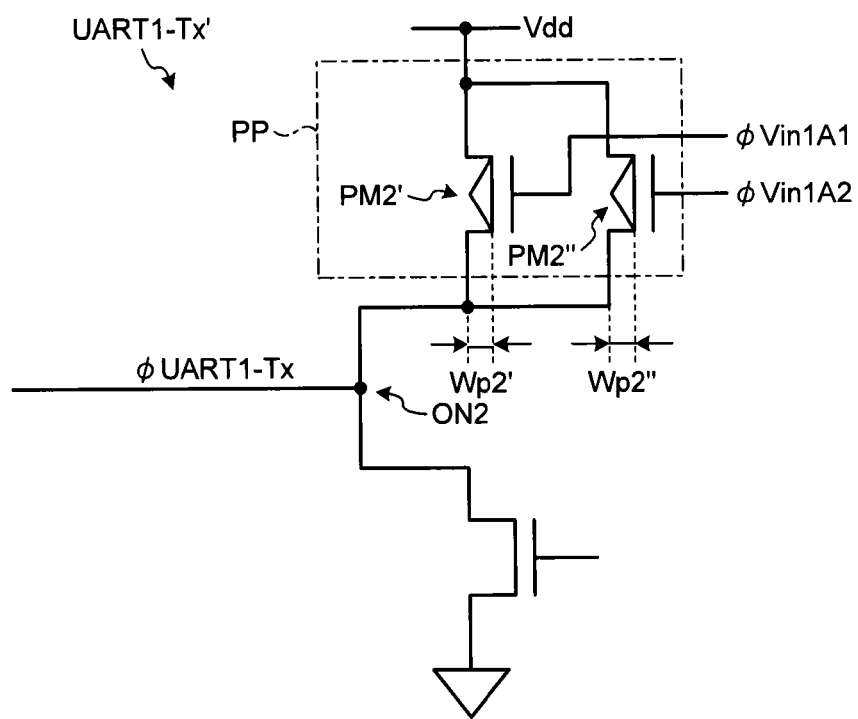
FIG. 41 is a diagram illustrating the structure of a second output interface in a seventh embodiment.

Specifically, in a second output interface UART1-Tx', the equivalent dimension of a P-side portion PP illustrated in FIG. 41 dynamically change depending on the operation mode. For example, in the second output interface UART1-Tx', the equivalent dimension of the P-side portion PP is a first dimension in the normal mode (first mode). In the test mode (second mode), the equivalent dimension of the P-side portion PP is a second dimension more than the first dimension. For example, a controller CTR500 controls the second output interface UART1-Tx' such that the number of second PMOS transistors which are turned on in the normal mode (first mode) is less than the number of second PMOS transistors which are turned on the test mode (second mode).

For example, as illustrated in FIG. 41, the second output interface UART1-Tx' includes a plurality of second PMOS transistors PM2' and PM2". The plurality of second PMOS transistors PM2' and PM2" are connected in parallel between a power supply potential Vdd and an output node ON2. The second PMOS transistors PM2' and PM2" are configured such that the channel widths Wp2' and Wp2" of the second PMOS transistors PM2' and PM2" are respectively less than the channel width Wp1 (see FIG. 10) of the first PMOS transistor PM1.

Figures 42, 43:
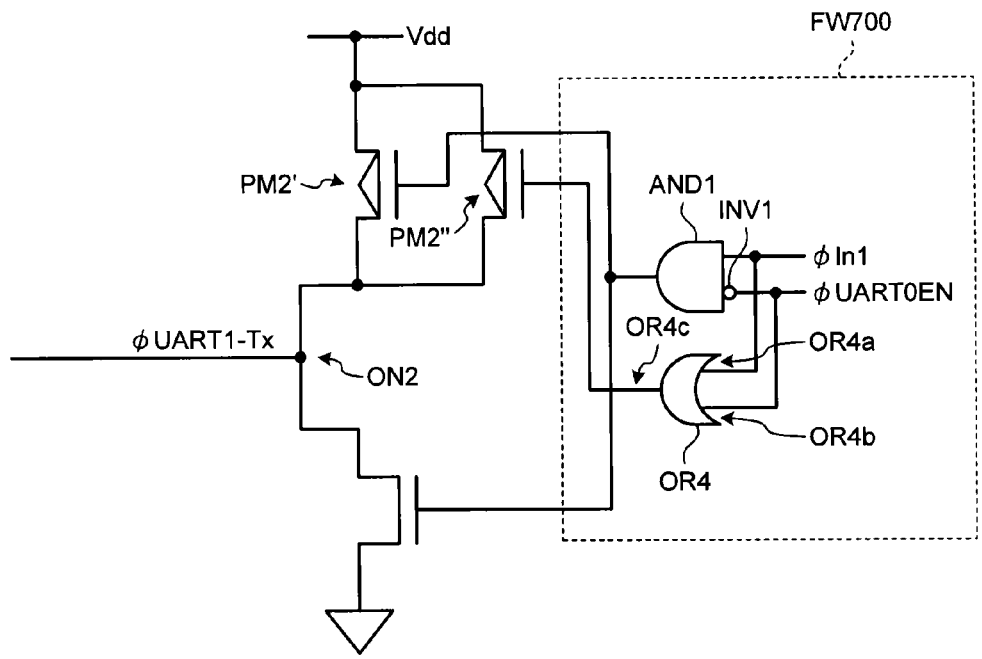
FIG. 42 is a diagram illustrating the operation of the second output interface in the seventh embodiment.
FIG. 43 is a diagram illustrating the structure of a mode control unit in the seventh embodiment.

As illustrated in FIG. 42, in the normal mode (first mode), when a low-level control signal ɸVin1A1 is supplied to the second PMOS transistor PM2' and a high-level control signal ɸVin1A2 is supplied to the second PMOS transistor PM2", the second PMOS transistor PM2' is selectively turned on and the potential of the output node ON2 is pulled up to the high level. In this case, the equivalent dimension of the P-side portion PP may be similar to (e.g., the same as)

that in the fifth embodiment and the equivalent on-resistance value of the P-side portion PP may be similar to (e.g., the same as) that in the fifth embodiment.

In the test mode (second mode), when a transmission control signal φIn1 (see FIG. 43) which is changed between the high level and the low level and is to be transmitted is supplied as control signals Vin1A1 and Vin1A2 to the plurality of second PMOS transistors PM2' and PM2", the plurality of second PMOS transistors PM2' and PM2" are turned on or off at the same time and a signal φIn1⁻ obtained by logically inverting the transmission control signal φIn1 is output from the output node ON2. In this case, the equivalent dimension (for example, the equivalent channel width) of the P-side portion PP can be more than those in the fifth embodiment and the equivalent on-resistance value of the P-side portion PP can be less than that in the fifth embodiment. Therefore, it is possible to increase the equivalent operation speed of the P-side portion PP when the transmission control signal φIn1 is transmitted.

A structure for controlling the second output interface UART1-Tx' in a mode control unit FW700 differs from that in the fifth embodiment in the following points, as illustrated in FIG. 43. FIG. 43 is a diagram illustrating the structure for controlling the second output interface UART1-Tx' in the mode control unit FW700.

The mode control unit FW700 further includes, for example, an OR gate OR4 as the structure for controlling the second output interface UART1-Tx', as compared to the structure illustrated in FIG. 15. The OR gate OR4 receives the transmission control signal φIn1 to be transmitted using an input terminal OR4a, receives a control signal φUART0EN using an input terminal OR4b, calculates the logical sum of the transmission control signal φIn1 and the control signal φUART0EN, and supplies the calculation result from an output terminal OR4c to the second PMOS transistor PM2".

For example, when an active-level (for example, high-level) control signal φUART0EN is received, the OR gate OR4 supplies a voltage fixed to the high level as a control signal φVin1A2 (see FIG. 41) to the second PMOS transistor PM2".

For example, when a non-active-level (for example, low-level) control signal φUART0EN is received, the OR gate OR4 supplies the transmission control signal φIn1 as the control signal φVin1A2 (see FIG. 41) to the second PMOS transistor PM2".

For example, when the control signal φUART0EN is set to the active level (for example, the high level) in the normal mode (first mode) and is set to the non-active level (for example, the low level) in the test mode (second mode), the second output interface UART1-Tx' can perform the above-mentioned operation.

As described above, in the seventh embodiment, in the second output interface UART1-Tx', the equivalent dimension of the P-side portion PP are the first dimension in the normal mode (first mode). In the test mode (second mode), the equivalent dimension of the P-side portion PP are the second dimension more than the first dimension. Therefore, the equivalent dimension of the P-side portion PP in the second output interface UART1-Tx' can be less than those of the first PMOS transistor PM1 in the normal mode (first mode) and can be more than those in the normal mode (first mode) in the test mode (second mode). As a result, an output φUART0-Tx from the first output interface UART0-Tx can be supplied as the signal to be transmitted to the transmitting port UART-Tx in the normal mode (first mode) and it is possible to increase the speed of the signal transmitting operation of the second output interface UART1-Tx' in the test mode (second mode).

(Eighth Embodiment)

Next, a memory system 500 according to an eighth embodiment will be described. Hereinafter, the eighth embodiment will be described with an emphasis on the difference from the sixth embodiment.

In the sixth embodiment, the low-speed interface 530a has the same structure for a plurality of operation modes. However, in the eighth embodiment, the structure of the low-speed interface 530a dynamically changes depending on the operation mode.

Specifically, in a second output interface UART1-Tx', the equivalent dimension of an N-side portion NP illustrated in FIG. 44 dynamically change depending on the operation mode. For example, in the second output interface UART1-Tx', the equivalent dimension of the N-side portion NP is a third dimension in the normal mode (first mode) and the equivalent dimension of a N-side portion NP is a fourth dimension more than the third dimension in the test mode (second mode). For example, a controller CTR500 controls the second output interface UART1-Tx' such that the number of second NMOS transistors which are turned on in the normal mode (first mode) is less than the number of second NMOS transistors which are turned on in the test mode (second mode).

For example, as illustrated in FIG. 44, the second output interface UART1-Tx' includes a plurality of second NMOS transistors NM2' and NM2". The plurality of second NMOS transistors NM2' and NM2" are connected in parallel between a ground potential GND and an output node ON2. The second NMOS transistors NM2' and NM2" are configured such that the channel widths Wn2' and Wn2" of the second NMOS transistors NM2' and NM2" are respectively less than the channel width Wn1 (see FIG. 10) of a first NMOS transistor NM1.

As illustrated in FIG. 45, in the normal mode (first mode), when a high-level control signal φVin1B1 is supplied to the second NMOS transistor NM2' and a low-level control signal φVin1B2 is supplied to the second NMOS transistor NM2", the second NMOS transistor NM2' is selectively turned on to pull down the potential of the output node ON2 to the low level. In this case, the equivalent dimension of the N-side portion NP can be similar to (e.g., the same as) those in the sixth embodiment and the equivalent on-resistance value of the N-side portion NP can be similar to (e.g., the same as) that in the sixth embodiment.

In the test mode (second mode), when a transmission control signal φIn1 (see FIG. 46) which transitions between the high level and the low level and is to be transmitted is supplied as control signals φVin1B1 and φVin1B2 to the plurality of second NMOS transistors NM2' and NM2", the plurality of second NMOS transistors NM2' and NM2" are turned on or off at the same time and a signal φIn1⁻ obtained by logically inverting the transmission control signal φIn1 is output from the output node ON2. In this case, the equivalent dimension (for example, the equivalent channel width) of the N-side portion NP can be more than those in the sixth embodiment and the equivalent on-resistance value of the N-side portion NP can be less than that in the sixth embodiment. Therefore, it is possible to increase the equivalent operation speed of the N-side portion NP when the transmission control signal φIn1 is transmitted.

Figure 46:
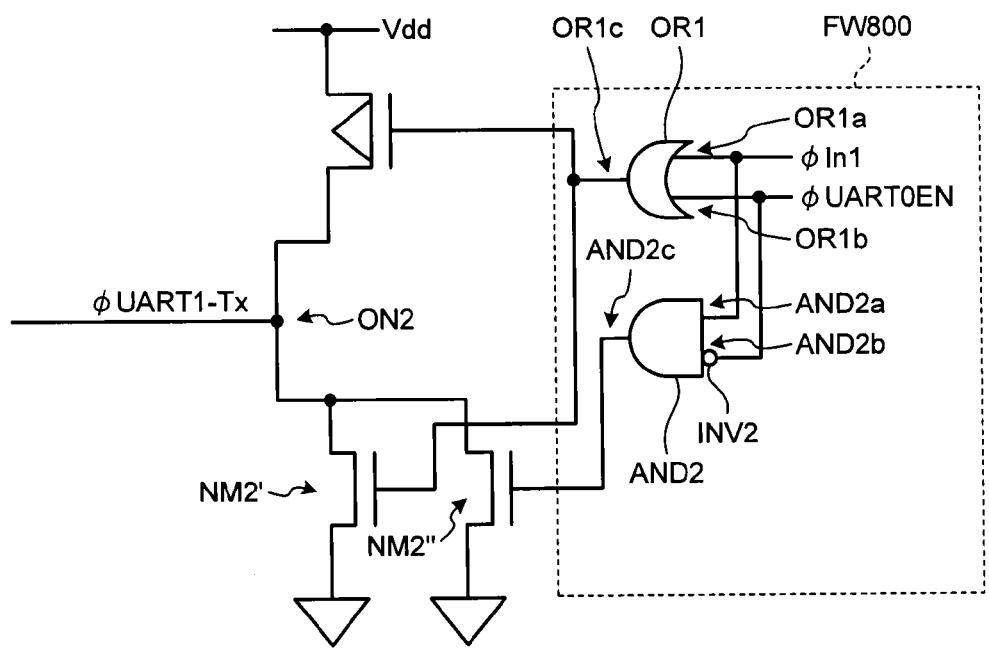
FIG. 46 is a diagram illustrating the structure of a mode control unit in the eighth embodiment.

A structure for controlling the second output interface UART1-Tx' in a mode control unit FW800 differs from that in the sixth embodiment in the following points, as illustrated in FIG. 46. FIG. 46 is a diagram illustrating the structure for controlling the second output interface UART1-Tx' in the mode control unit FW800.

The mode control unit FW800 further includes, for example, an AND gate AND2 and an inverter INV2 as the structure for controlling the second output interface UART1-Tx', as compared to the structure illustrated in FIG. 20.

The inverter INV2 logically inverts a control signal φUART0EN to generate a control signal φUART0EN⁻ and supplies the control signal φUART0EN⁻ to the AND gate AND2.

The AND gate AND2 receives the transmission control signal φIn1 to be transmitted using an input terminal AND2a, receives the control signal φUART0EN⁻ using an input terminal AND2b, calculates the logical sum of the transmission control signal φIn1 and the control signal φUART0EN⁻, and outputs the calculation result from an output terminal AND2c.

For example, when an active-level (for example, high-level) control signal φUART0EN⁻ is received, the AND gate AND2 supplies the transmission control signal φIn1 as a control signal φVinB2 (see FIG. 44) to the second NMOS transistor PM2".

For example, when a non-active-level (for example, low-level) control signal φUART0EN⁻ is received, the AND gate AND2 supplies a voltage fixed to the low level as a control signal φVin1 (see FIG. 12) to the second NMOS transistor PM2".

For example, when the control signal φUART0EN⁻ is set to a non-active level (for example, a low level) in the normal mode (first mode) and is set to an active level (for example, a high level) in the test mode (second mode), the second output interface UART1-Tx' can perform the above-mentioned operation.

As described above, in the eighth embodiment, in the second output interface UART1-Tx', the equivalent dimension of the N-side portion NP are the third dimension in the normal mode (first mode) and are the fourth dimension more than the third dimension in the test mode (second mode). Therefore, in the second output interface UART1-Tx', the equivalent dimension of the N-side portion NP can be less than the dimension of the first NMOS transistor NM1 in the normal mode (first mode). In addition, in the test mode (second mode), the equivalent dimension of the N-side portion NP can be more than those in the normal mode (first mode). As a result, an output φUART0-Tx from the first output interface UART0-Tx can be supplied as the signal to be transmitted to the transmitting port UART-Tx in the normal mode (first mode) and it is possible to increase the speed of the signal transmitting operation of the second output interface UART1-Tx' in the test mode (second mode).

(Ninth Embodiment)

Next, a memory system 900 according to a ninth embodiment will be described. Hereinafter, the ninth embodiment will be described with an emphasis on the difference from the third embodiment.

In the third embodiment, the structure of the low-speed line SLa300 has been conceived in order to reduce the number of transmitting ports for transmitting an appropriate signal. However, in the ninth embodiment, the structure of a low-speed interface 930a is conceived in order to reduce the number of transmitting ports for transmitting an appropriate signal.

Figure 47:
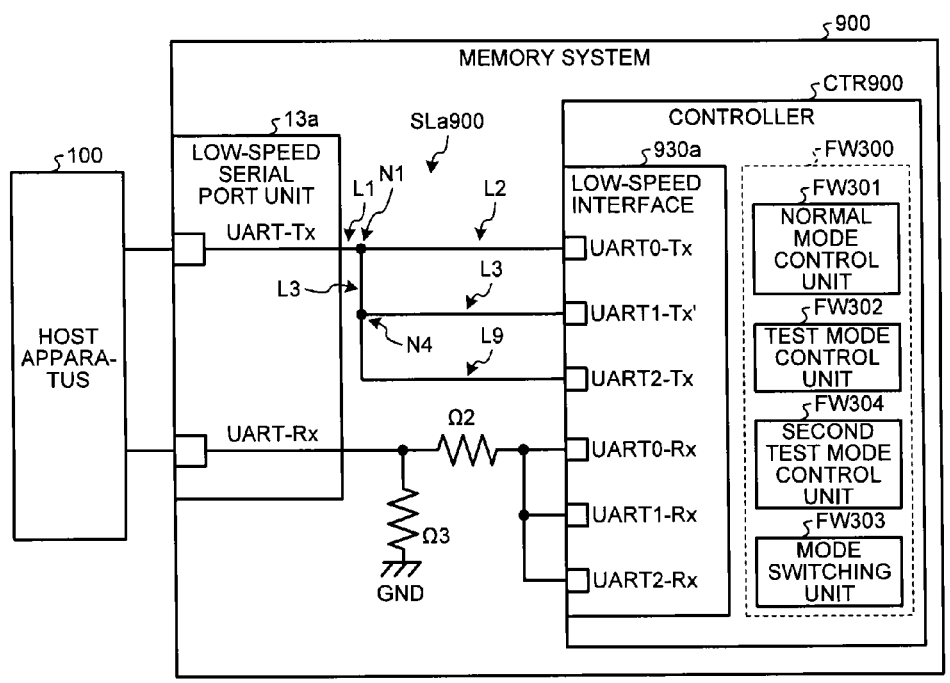
FIG. 47 is a diagram illustrating the structure of memory systems according to a ninth embodiment and a tenth embodiment.

Specifically, the memory system 900 is configured as illustrated in FIG. 47. FIG. 47 is a diagram illustrating a structure related to a low-speed communication interface (a low-speed serial port unit 13a and a low-speed interface 930a) of the memory system 900.

The memory system 900 includes a controller CTR900 and low-speed lines SLa900 as the structure related to the low-speed communication interface, instead of the controller CTR300 and the low-speed lines SLa300 (see FIG. 22).

The low-speed lines SLa900 connect a transmitting port UART-Tx of the low-speed serial port unit 13a to a first output interface UART0-Tx of the low-speed interface 930a, without a first resistor Ω0 (see FIG. 22) interposed therebetween. In addition, the low-speed lines SLa900 connect the transmitting port UART-Tx of the low-speed serial port unit 13a to a second output interface UART1-Tx' of the low-speed interface 930a, without a second resistor Ω1 (see FIG. 22) interposed therebetween. The low-speed lines SLa900 connect the transmitting port UART-Tx of the low-speed serial port unit 13a to the second output interface UART1-Tx' of the low-speed interface 930a, without a fifth resistor Ω4 (see FIG. 22) interposed therebetween.

Specifically, the low-speed lines SLa900 do not include the first resistor Ω0, the second resistor Ω1, and the fifth resistor R4. For example, the first resistor Ω0 is not provided on a line L2. The second resistor Ω1 is not provided on a line L3. The fifth resistor R4 is not provided on a line L9.

The controller CTR900 includes the low-speed interface 930a instead of the low-speed interface 330a (see FIG. 22). The low-speed interface 930a includes the second output interface UART1-Tx' instead of the second output interface UART1-Tx (see FIG. 22). The second output interface UART1-Tx' has a different internal structure from that in the third embodiment.

For example, the dimension (=W/L, W: a channel width and L: a channel length) of a second PMOS transistor PM2' (see FIGS. 37 and 38) of the second output interface UART1-Tx' is less than the dimension of the first PMOS transistor PM1 (see FIG. 10) of the first output interface UART0-Tx and is less than the dimension of the third PMOS transistor PM3 (see FIG. 27) of the third output interface UART2-Tx.

For example, the dimension of the second PMOS transistor PM2' is less than the dimension of the first PMOS transistor PM1 such that a first signal output from the first output interface UART0-Tx can be supplied to the transmitting port UART-Tx when a fixed-level second signal is output from the second output interface UART1-Tx' in the normal mode (first mode).

That is, the dimension of the second PMOS transistor PM2' is less than the dimension of the first PMOS transistor PM1 such that a first voltage and/or a second voltage (for example, a signal transitions between the high level and the low level) output from the first output interface UART0-Tx can be supplied to the transmitting port UART-Tx when a third voltage (for example, a high-level voltage) is steadily output from the second output interface UART1-Tx' in the second test mode (third mode).

For example, the dimension of the second PMOS transistor PM2' is less than the dimension of the first PMOS transistor PM1 such that the on-resistance value of the second PMOS transistor PM2' is about ten times more than that of the first PMOS transistor PM1.

For example, as illustrated in FIG. 37, the second PMOS transistor PM2' is configured such that the channel length Lp2' of the second PMOS transistor PM2' is more than the channel length Lp1 (see FIG. 10) of the first PMOS transistor PM1. Therefore, the dimension of the second PMOS transistor PM2' can be less than those of the first PMOS transistor PM1.

Alternatively, for example, as illustrated in FIG. 38, the second PMOS transistor PM2' is configured such that the channel width Wp2' of the second PMOS transistor PM2' is less than the channel width Wp1 (see FIG. 10) of the first PMOS transistor PM1. Therefore, the dimension of the second PMOS transistor PM2' can be less than those of the first PMOS transistor PM1.

Alternatively, for example, the structures illustrated in FIGS. 37 and 38 are combined with each other to configure the second PMOS transistor PM2' such that the channel length Lp2' of the second PMOS transistor PM2' is more than the channel length Lp1 (see FIG. 10) of the first PMOS transistor PM1 and the channel width Wp2' of the second PMOS transistor PM2' is less than the channel width Wp1 (see FIG. 10) of the first PMOS transistor PM1. Therefore, the dimension of the second PMOS transistor PM2' can be less than those of the first PMOS transistor PM1.

For example, the dimension of the second PMOS transistor PM2' is less than the dimension of the third PMOS transistor PM3 such that a third value output from the third output interface UART2-Tx can be supplied to the transmitting port UART-Tx when the fixed-level second signal is output from the second output interface UART1-Tx' in the second test mode (third mode).

That is, the dimension of the second PMOS transistor PM2' is less than the dimension of the third PMOS transistor PM3 such that a fifth voltage and/or a sixth voltage (for example, a signal transitions between the high level and the low level) output from the third output interface UART2-Tx can be supplied to the transmitting port UART-Tx when high impedance is output from the first output interface UART0-Tx and the third voltage (for example, a high-level voltage) is steadily output from the second output interface UART1-Tx' in the second test mode (third mode).

For example, the dimension of the second PMOS transistor PM2' is less than the dimension of the third PMOS transistor PM3 such that the on-resistance value of the second PMOS transistor PM2' is about ten times more than that of the third PMOS transistor PM3.

For example, as illustrated in FIG. 37, the second PMOS transistor PM2' is configured such that the channel length Lp2' of the second PMOS transistor PM2' is more than the channel length Lp3 (see FIG. 27) of the third PMOS transistor PM3. Therefore, the dimension of the second PMOS transistor PM2' can be less than those of the third PMOS transistor PM3.

Alternatively, for example, as illustrated in FIG. 38, the second PMOS transistor PM2' is configured such that the channel width Wp2' of the second PMOS transistor PM2' is less than the channel width Wp3 (see FIG. 27) of the third PMOS transistor PM3. Therefore, the dimension of the second PMOS transistor PM2' can be less than those of the third PMOS transistor PM3.

Alternatively, for example, the structures illustrated in FIGS. 37 and 38 are combined with each other to configure the second PMOS transistor PM2' such that the channel length Lp2' of the second PMOS transistor PM2' is more than the channel length Lp3 (see FIG. 27) of the third PMOS transistor PM3 and the channel width Wp2' of the second PMOS transistor PM2' is less than the channel width Wp3 (see FIG. 27) of the third PMOS transistor PM3. Therefore, the dimension of the second PMOS transistor PM2' can be less than those of the third PMOS transistor PM3.

As described above, in the memory system 900 according to the ninth embodiment, the first output interface UART0-Tx of the low-speed interface 930a in the controller CTR900 is connected to the transmitting port UART-Tx of the low-speed serial port unit 13a. In addition, the second output interface UART1-Tx' of the low-speed interface 930a in the controller CTR900 is connected to the transmitting port UART-Tx of the low-speed serial port unit 13a. The third output interface UART2-Tx of the low-speed interface 930a in the controller CTR900 is connected to the transmitting port UART-Tx of the low-speed serial port unit 13a. That is, the first output interface UART0-Tx, the second output interface UART1-Tx', and the third output interface UART2-Tx of the controller CTR900 share the transmitting port UART-Tx of a connector 13.

In this case, the dimension (=W/L, W: a channel width and L: a channel length) of the second PMOS transistor PM2' (see FIGS. 37 and 38) of the second output interface UART1-Tx' is less than the dimension of the first PMOS transistor PM1 (see FIG. 10) of the first output interface UART0-Tx and is less than the dimension of the third PMOS transistor PM3 (see FIG. 27) of the third output interface UART2-Tx.

For example, the dimension of the second PMOS transistor PM2' is less than the dimension of the first PMOS transistor PM1 such that the first signal output from the first output interface UART0-Tx can be supplied to the transmitting port UART-Tx when the fixed-level second signal is output from the second output interface UART1-Tx' in the normal mode (first mode). That is, the dimension of the second PMOS transistor PM2' is less than the dimension of the first PMOS transistor PM1 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx' in the normal mode (first mode).

For example, the dimension of the second PMOS transistor PM2' is less than the dimension of the third PMOS transistor PM3 such that the third value output from the third output interface UART2-Tx can be supplied to the transmitting port UART-Tx when the fixed-level second signal is output from the second output interface UART1-Tx' in the second test mode (third mode). That is, the dimension of the second PMOS transistor PM2' is less than the dimension of the third PMOS transistor PM3 such that the third voltage and/or the second voltage (for example, a signal transitions between the high level and the low level) output from the third output interface UART2-Tx can be supplied to the transmitting port UART-Tx when the third voltage (for example, a high-level voltage) is steadily output from the second output interface UART1-Tx' in the second test mode (third mode).

Therefore, for example, in the normal mode (first mode), the drivability of an output φUART0-Tx from the first output interface UART0-Tx is larger than the drivability of an output φUART1-Tx from the second output interface UART1-Tx' and the output φUART0-Tx from the first output interface UART0-Tx can be supplied as the signal to be transmitted to the transmitting port UART-Tx. For example, in the second test mode (third mode), the drivability of an output φUART2-Tx from the third output interface UART2-Tx is larger than the drivability of the output φUART1-Tx from the second output interface UART1-Tx' and the output φUART2-Tx from the third output interface UART2-Tx can be supplied as the signal to be transmitted to the transmitting port UART-Tx. That is, when a signal is transmitted, it is possible to prevent the signals output from the first output interface UART0-Tx, the second output interface UART1-Tx', and the third output interface UART2-Tx from being mixed up and thus transmit an appropriate signal. In other words, it is possible to reduce the number of transmitting ports UART-Tx (the number of pins) required to transmit an appropriate signal (for example, to 1).

In the memory system 900 according to the ninth embodiment, the dimension of the second PMOS transistor PM2' is less than the dimension of the first PMOS transistor PM1 such that the first signal output from the first output interface UART0-Tx can be supplied to the transmitting port UART-Tx when the fixed-level second signal is output from the second output interface UART1-Tx' in the normal mode (first mode). The dimension of the second PMOS transistor PM2' is less than the dimension of the third PMOS transistor PM3 such that the third value output from the third output interface UART2-Tx can be supplied to the transmitting port UART-Tx when the fixed-level second signal is output from the second output interface UART1-Tx' in the second test mode (third mode). Therefore, the output φUART0-Tx from the first output interface UART0-Tx can be supplied as the signal to be transmitted to the transmitting port UART-Tx in the normal mode (first mode) and the output φUART2-Tx from the third output interface UART2-Tx can be supplied as the signal to be transmitted to the transmitting port UART-Tx in the second test mode (third mode).

In the memory system 900 according to the ninth embodiment, the dimension of the second PMOS transistor PM2' is less than the dimension of the first PMOS transistor PM1 such that the first voltage and/or the second voltage (for example, a signal transitions between the high level and the low level) output from the first output interface UART0-Tx can be supplied to the transmitting port UART-Tx when the third voltage (for example, a high-level voltage) is steadily output from the second output interface UART1-Tx' in the normal mode (first mode). In addition, the dimension of the second PMOS transistor PM2' is less than the dimension of the third PMOS transistor PM3 such that the first voltage and/or the second voltage (for example, a signal transitions between the high level and the low level) output from the third output interface UART2-Tx can be supplied to the transmitting port UART-Tx when the third voltage (for example, a high-level voltage) is steadily output from the second output interface UART1-Tx' in the second test mode (third mode). Therefore, the output φUART0-Tx from the first output interface UART0-Tx can be supplied as the signal to be transmitted to the transmitting port UART-Tx in the normal mode (first mode) and the output φUART2-Tx from the third output interface UART2-Tx can be supplied as the signal to be transmitted to the transmitting port UART-Tx in the second test mode (third mode).

(Tenth Embodiment)

Next a memory system 900 according to a tenth embodiment will be described. Hereinafter, the tenth embodiment will be described with an emphasis on the difference from the fourth embodiment.

In the fourth embodiment, the structure of the low-speed line SLa300 has been conceived in order to reduce the number of transmitting ports for transmitting an appropriate signal. However, in the tenth embodiment, the structure of a low-speed interface 930*a* is conceived in order to reduce the number of transmitting ports for transmitting an appropriate signal.

Specifically, the memory system 900 is configured as illustrated in FIG. 47. FIG. 47 is a diagram illustrating a structure related to a low-speed communication interface (a low-speed serial port unit 13*a* and a low-speed interface 930*a*) in the memory system 900.

The memory system 900 includes a controller CTR900 and low-speed lines SLa900 as the structure related to the low-speed communication interface, instead of the controller CTR300 and the low-speed lines SLa300 (see FIG. 22).

The low-speed lines SLa900 connects a transmitting port UART-Tx of the low-speed serial port unit 13*a* to a first output interface UART0-Tx of the low-speed interface 930*a*, without a first resistor Ω0 (see FIG. 22) interposed therebetween. In addition, the low-speed lines SLa900 connect the transmitting port UART-Tx of the low-speed serial port unit 13*a* to a second output interface UART1-Tx' of the low-speed interface 930*a*, without a second resistor Ω1 (see FIG. 22) interposed therebetween. The low-speed lines SLa900 connect the transmitting port UART-Tx of the low-speed serial port unit 13*a* to the second output interface UART1-Tx' of the low-speed interface 930*a*, without a fifth resistor Ω4 (see FIG. 22) interposed therebetween.

Specifically, the low-speed lines SLa900 do not include the first resistor Ω0, the second resistor Ω1, and the fifth resistor R4. For example, the first resistor Ω0 is not provided on a line L2. The second resistor Ω1 is not provided on a line L3. The fifth resistor R4 is not provided on a line L9.

The controller CTR900 includes the low-speed interface 930*a* instead of the low-speed interface 330*a* (see FIG. 22). The low-speed interface 930*a* includes the second output interface UART1-Tx' instead of the second output interface UART1-Tx (see FIG. 22). The second output interface UART1-Tx' has a different internal structure from that in the fourth embodiment.

For example, the dimension (=W/L, W: a channel width and L: a channel length) of a second NMOS transistor NM2' (see FIGS. 39 and 40) of the second output interface UART1-Tx' is less than the dimension of the first NMOS transistor NM1 (see FIG. 10) of the first output interface UART0-Tx and is less than the dimension of the third NMOS transistor NM3 (see FIG. 27) of the third output interface UART2-Tx.

For example, the dimension of the second NMOS transistor NM2' is less than the dimension of the first NMOS transistor NM1 such that a first signal output from the first output interface UART0-Tx can be supplied to the transmitting port UART-Tx when a fixed-level second signal is output from the second output interface UART1-Tx' in the normal mode (first mode).

That is, the dimension of the second NMOS transistor NM2' is less than the dimension of the first NMOS transistor NM1 such that a first voltage and/or a second voltage (for example, a signal transitions between the high level and the low level) output from the first output interface UART0-Tx can be supplied to the transmitting port UART-Tx when a fourth voltage (for example, a low-level voltage) is steadily output from the second output interface UART1-Tx' in the second test mode (third mode).

For example, the dimension of the second NMOS transistor NM2' is less than the dimension of the first NMOS transistor NM1 such that the on-resistance value of the second NMOS transistor NM2' is about ten times more than that of the first NMOS transistor NM1.

For example, as illustrated in FIG. 39, the second NMOS transistor NM2' is configured such that the channel length Ln2' of the second NMOS transistor NM2' is more than the channel length Ln1 (see FIG. 10) of the first NMOS transistor NM1. Therefore, the dimension of the second NMOS transistor NM2' can be less than those of the first NMOS transistor NM1.

Alternatively, for example, as illustrated in FIG. 40, the second NMOS transistor NM2' is configured such that the channel width Wn2' of the second NMOS transistor NM2' is less than the channel width Wn1 (see FIG. 10) of the first NMOS transistor NM1. Therefore, the dimension of the second NMOS transistor NM2' can be less than those of the first NMOS transistor NM1.

Alternatively, for example, the structures illustrated in FIGS. 39 and 40 are combined with each other to configure the second NMOS transistor NM2' such that the channel length Ln2' of the second NMOS transistor NM2' is more than the channel length Ln1 (see FIG. 10) of the first NMOS transistor NM1 and the channel width Wn2' of the second NMOS transistor NM2' is less than the channel width Wn1 (see FIG. 10) of the first NMOS transistor NM1. Therefore, the dimension of the second NMOS transistor NM2' can be less than those of the first NMOS transistor NM1.

For example, the dimension of the second NMOS transistor NM2' is less than the dimension of the third NMOS transistor NM3 such that a third value output from the third output interface UART2-Tx can be supplied to the transmitting port UART-Tx when the fixed-level second signal is output from the second output interface UART1-Tx' in the second test mode (third mode).

That is, the dimension of the second NMOS transistor NM2' is less than the dimension of the third NMOS transistor NM3 such that a fifth voltage and/or a sixth voltage (for example, a signal transitions between the high level and the low level) output from the third output interface UART2-Tx can be supplied to the transmitting port UART-Tx when high impedance is output from the first output interface UART0-Tx and the fourth voltage (for example, a low-level voltage) is steadily output from the second output interface UART1-Tx' in the second test mode (third mode).

For example, the dimension of the second NMOS transistor NM2' is less than the dimension of the third NMOS transistor NM3 such that the on-resistance value of the second NMOS transistor NM2' is about ten times more than that of the third NMOS transistor NM3.

For example, as illustrated in FIG. 39, the second NMOS transistor PM2' is configured such that the channel length Ln2' of the second NMOS transistor NM2' is more than the channel length Ln3 (see FIG. 27) of the third NMOS transistor NM3. Therefore, the dimension of the second NMOS transistor NM2' can be less than those of the third NMOS transistor NM3.

Alternatively, for example, as illustrated in FIG. 40, the second NMOS transistor NM2' is configured such that the channel width Wn2' of the second NMOS transistor NM2' is less than the channel width Wn3 (see FIG. 27) of the third NMOS transistor NM3. Therefore, the dimension of the second NMOS transistor NM2' can be less than those of the third NMOS transistor NM3.

Alternatively, for example, the structures illustrated in FIGS. 39 and 40 are combined with each other to configure the second NMOS transistor NM2' such that the channel length Ln2' of the second NMOS transistor NM2' is more than the channel length Ln3 (see FIG. 27) of the third NMOS transistor NM3 and the channel width Wn2' of the second NMOS transistor NM2' is less than the channel width Wn3 (see FIG. 27) of the third NMOS transistor NM3. Therefore, the dimension of the second NMOS transistor NM2' can be less than those of the third NMOS transistor NM3.

As described above, in the memory system 900 according to the tenth embodiment, the first output interface UART0-Tx of the low-speed interface 930a in the controller CTR900 is connected to the transmitting port UART-Tx of the low-speed serial port unit 13a. In addition, the second output interface UART1-Tx' of the low-speed interface 930a in the controller CTR900 is connected to the transmitting port UART-Tx of the low-speed serial port unit 13a. The third output interface UART2-Tx of the low-speed interface 930a in the controller CTR900 is connected to the transmitting port UART-Tx of the low-speed serial port unit 13a. That is, the first output interface UART0-Tx, the second output interface UART1-Tx', and the third output interface UART2-Tx of the controller CTR900 share the transmitting port UART-Tx of a connector 13.

In this case, the dimension (=W/L, W: a channel width and L: a channel length) of the second NMOS transistor NM2' (see FIGS. 39 and 40) of the second output interface UART1-Tx' is less than the dimension of the first NMOS transistor NM1 (see FIG. 10) of the first output interface UART0-Tx and is less than the dimension of the third NMOS transistor NM3 (see FIG. 27) of the third output interface UART2-Tx.

For example, the dimension of the second NMOS transistor PM2' is less than the dimension of the first NMOS transistor NM1 such that the first signal output from the first output interface UART0-Tx can be supplied to the transmitting port UART-Tx when the fixed-level second signal is output from the second output interface UART1-Tx' in the normal mode (first mode). That is, the dimension of the second NMOS transistor NM2' is less than the dimension of the first NMOS transistor NM1 such that the first voltage and/or the second voltage (for example, a signal transitions between the high level and the low level) output from the first output interface UART0-Tx can be supplied to the transmitting port UART-Tx when the fourth voltage (for example, a low-level voltage) is steadily output from the second output interface UART1-Tx' in the normal mode (first mode).

For example, the dimension of the second NMOS transistor NM2' is less than the dimension of the third NMOS transistor NM3 such that the third value output from the third output interface UART2-Tx can be supplied to the transmitting port UART-Tx when the fixed-level second signal is output from the second output interface UART1-Tx' in the second test mode (third mode). That is, the dimension of the second NMOS transistor NM2' is less than the dimension of the third NMOS transistor NM3 such that the fifth voltage and/or the sixth voltage (for example, a signal transitions between the high level and the low level) output from the third output interface UART2-Tx can be supplied to the transmitting port UART-Tx when the fourth voltage (for example, a low-level voltage) is steadily output from the second output interface UART1-Tx' in the second test mode (third mode).

Therefore, for example, in the normal mode (first mode), the drivability of an output φUART0-Tx from the first output interface UART0-Tx is larger than the drivability of an output φUART1-Tx from the second output interface UART1-Tx', and the output φUART0-Tx from the first output interface UART0-Tx can be supplied as the signal to be transmitted to the transmitting port UART-Tx. For example, in the second test mode (third mode), the drivability of an output φUART2-Tx from the third output interface UART2-Tx is larger than the drivability of the output φUART1-Tx from the second output interface UART1-Tx', and the output φUART2-Tx from the third output interface UART2-Tx can be supplied as the signal to be transmitted to the transmitting port UART-Tx. That is, when a signal is transmitted, it is possible to prevent the signals output from the first output interface UART0-Tx, the second output interface UART1-Tx', and the third output interface UART2-Tx from being mixed up and thus transmit an appropriate signal. In other words, it is possible to reduce the number of transmitting ports UART-Tx (the number of pins) required to transmit an appropriate signal (for example, to 1).

In the memory system 900 according to the tenth embodiment, the dimension of the second NMOS transistor NM2' is less than the dimension of the first NMOS transistor NM1 such that the first signal output from the first output interface UART0-Tx can be supplied to the transmitting port UART-Tx when the fixed-level second signal is output from the second output interface UART1-Tx' in the normal mode (first mode). The dimension of the second NMOS transistor NM2' is less than the dimension of the third NMOS transistor NM3 such that the third value output from the third output interface UART2-Tx can be supplied to the transmitting port UART-Tx when the fixed-level second signal is output from the second output interface UART1-Tx' in the second test mode (third mode). Therefore, the output ϕUART0-Tx from the first output interface UART0-Tx can be supplied as the signal to be transmitted to the transmitting port UART-Tx in the normal mode (first mode) and the output ϕUART2-Tx from the third output interface UART2-Tx can be supplied as the signal to be transmitted to the transmitting port UART-Tx in the second test mode (third mode).

In the memory system 900 according to the tenth embodiment, the dimension of the second NMOS transistor NM2' is less than the dimension of the first NMOS transistor NM1 such that the first voltage and/or the second voltage (for example, a signal transitions between the high level and the low level) output from the first output interface UART0-Tx can be supplied to the transmitting port UART-Tx when the fourth voltage (for example, a low-level voltage) is steadily output from the second output interface UART1-Tx' in the normal mode (first mode). In addition, the dimension of the second NMOS transistor NM2' is less than the dimension of the third NMOS transistor NM3 such that the fifth voltage and/or the sixth voltage (for example, a signal transitions between the high level and the low level) output from the third output interface UART2-Tx can be supplied to the transmitting port UART-Tx when the fourth (for example, a low-level voltage) is steadily output from the second output interface UART1-Tx' in the second test mode (third mode). Therefore, the output ϕUART0-Tx from the first output interface UART0-Tx can be supplied as the signal to be transmitted to the transmitting port UART-Tx in the normal mode (first mode) and the output ϕUART2-Tx from the third output interface UART2-Tx can be supplied as the signal to be transmitted to the transmitting port UART-Tx in the second test mode (third mode).

(Eleventh Embodiment)

Next, a memory system 1100 according to an eleventh embodiment will be described. Hereinafter, the eleventh embodiment will be described with an emphasis on the difference from the first embodiment.

In the first embodiment, the low-speed interface 30a of the controller CTR is connected to the low-speed serial port unit 13a of the connector 13. However, in the eleventh embodiment, a case in which the low-speed interface 30a of the controller CTR is connected to the high-speed serial port unit 13b (see FIG. 3) of the connector 13 will be described.

When the low-speed interface 30a of the controller CTR communicates with a host apparatus 100 through the high-speed serial port unit 13b, it is preferable to reduce the number of ports used by the low-speed interface 30a (for example, a pair of ports) in order to ensure a band for transmitting and receiving commands and data for a normal operation.

However, supposing that plural types of low-speed serial communication interfaces in the low-speed interface 30a are simply connected so as to share a pair of a transmitting port and a receiving port in the high-speed serial port unit 13b, signals output from the plural types of low-speed serial communication interfaces are mixed, for example, during the transmission of the signals and it is difficult to transmit an appropriate signal.

Figure 48:
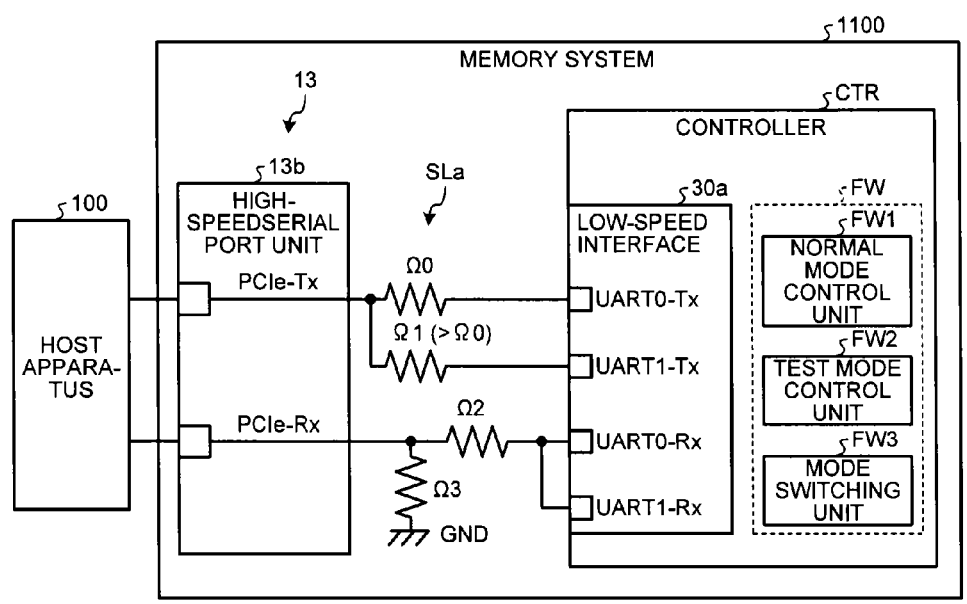
FIG. 48 is a diagram illustrating the structure of a memory system according to an eleventh embodiment.

In the eleventh embodiment, to address the problem, as illustrated in FIG. 48, the low-speed lines SLa similar to that in the first embodiment is used to connect the high-speed serial port unit 13b and the low-speed interface 30a in order to appropriately transmit and receive signals while plural types of low-speed serial communication interfaces share a pair of a transmitting port and a receiving port. FIG. 48 is a diagram illustrating the structure of the memory system 1100.

The high-speed serial port unit 13b includes a transmitting port PCIe-Tx as a usable transmitting port and includes a receiving port PCIe-Rx as a usable receiving port. For example, in the SFF-8639 form factor, it is defined that ports (pins) E1 to E6 and S15 to S28 are used as ports of the high-speed serial port unit 13b, as illustrated in FIG. 49. FIG. 49 is a diagram illustrating the ports of the high-speed serial port unit 13b in the SFF-8639 form factor. For example, one of the ports S17, S18, S23, and S24 which is not used by a high-speed interface 30b (see FIG. 3) can be used as the transmitting port PCIe-Tx. For example, one of the ports S20, S21, S26, and S27 which is not used by the high-speed interface 30b (see FIG. 3) can be used as the receiving port PCIe-Rx.

The resistance value of a second resistor Ω1 is greater than that of a first resistor Ω0 such that a first signal output from a first output interface UART0-Tx can be supplied to a transmitting port UART-Tx when a fixed-level second signal is output from a second output interface UART1-Tx in the normal mode (first mode).

That is, the resistance value of the second resistor Ω1 is greater than that of the first resistor Ω0 such that a first voltage and/or a second voltage (for example, a signal transitions between the high level and the low level) output from the first output interface UART0-Tx can be supplied to the transmitting port UART-Tx when a third voltage (for example, a high-level voltage) is steadily output from the second output interface UART1-Tx in the normal mode (first mode).

As described above, in the memory system 1100 according to the eleventh embodiment, the first output interface UART0-Tx of the low-speed interface 30a in the controller CTR is connected to the transmitting port PCIe-Tx of the high-speed serial port unit 13b through the first resistor Ω0. The second output interface UART1-Tx of the low-speed interface 30a in the controller CTR is connected to the transmitting port PCIe-Tx of the high-speed serial port unit 13b through the second resistor Ω1. That is, the first output interface UART0-Tx and the second output interface UART1-Tx of the controller CTR share the transmitting port PCIe-Tx of the connector 13.

In this case, the resistance value of the second resistor Ω1 is greater than that of the first resistor Ω0. For example, the resistance value of the second resistor Ω1 is greater than that of the first resistor Ω0 such that the first signal output from the first output interface UART0-Tx can be supplied to the transmitting port PCIe-Tx when the fixed-level second signal is output from the second output interface UART1-Tx in the normal mode (first mode). That is, the resistance value of the second resistor is greater than that of the first resistor Ω0 such that the first voltage and/or the second voltage (for example, a signal transitions between the high level and the low level) output from the first output interface UART0-Tx can be supplied to the transmitting port PCIe-Tx when the third voltage (for example, a high-level voltage) is steadily output from the second output interface UART1-Tx in the normal mode (first mode).

Therefore, for example, in the normal mode (first mode), the drivability of an output φUART0-Tx from the first output interface UART0-Tx is larger than the drivability of an output φUART1-Tx from the second output interface UART1-T and the output φUART0-Tx from the first output interface UART0-Tx can be supplied as the signal to be transmitted to the transmitting port PCIe-Tx. That is, when a signal is transmitted, it is possible to prevent the signals output from the first output interface UART0-Tx and the second output interface UART1-Tx from being mixed up and thus transmit an appropriate signal. In other words, it is possible to reduce the number of transmitting ports PCIe-Tx (the number of pins) required to transmit an appropriate signal (for example, to 1). Therefore, it is possible to reduce the number of transmitting ports PCIe-Tx (the number of pins) required to transmit an appropriate signal (for example, to 1) while ensuring the band for transmitting and receiving commands and data for a normal operation.

(Twelfth Embodiment)

Next, a memory system 1200 according to a twelfth embodiment will be described. Hereinafter, the twelfth embodiment will be described with an emphasis on the difference from the first embodiment.

In the first embodiment, the low-speed interface 30a of the controller CTR is connected to the low-speed serial port unit 13a of the connector 13. However, in the twelfth embodiment, the low-speed interface 30a of the controller CTR is connected to the port unit 13c for other purposes (see FIG. 3) in the connector 13.

When the low-speed interface 30a of the controller CTR communicates with a host apparatus 100 through the port unit 13c for other purposes, it is preferable to reduce the number of ports used by the low-speed interface 30a (for example, to a pair of ports) since, for example, the number of ports which are not used by an interface 30c for other purposes (see FIG. 3) is limited.

However, supposing that plural types of low-speed serial communication interfaces in the low-speed interface 30a are simply connected so as to share a pair of a transmitting port and a receiving port in the port unit 13c for other purposes, signals output from the plural types of low-speed serial communication interfaces are mixed, for example, during the transmission of the signals and it is difficult to transmit an appropriate signal.

Figure 50:
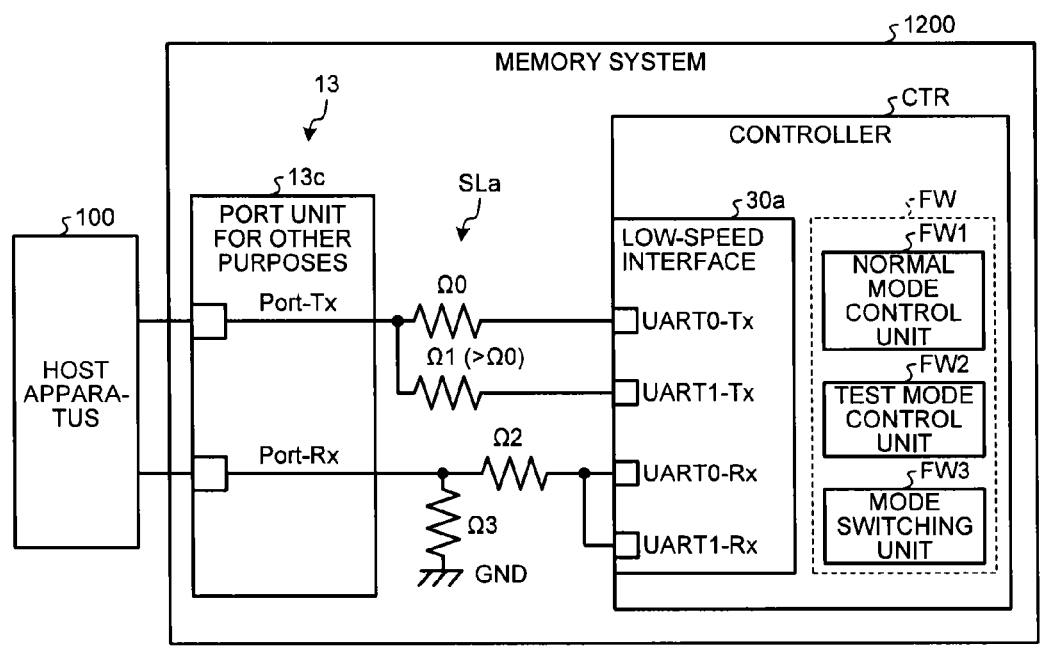
FIG. 50 is a diagram illustrating the structure of a memory system according to a twelfth embodiment.

In the twelfth embodiment, to address the problem, as illustrated in FIG. 50, the low-speed lines SLa similar to that in the first embodiment is used to connect the port unit 13c for other purposes and the low-speed interface 30a in order to appropriately transmit and receive signals while plural types of low-speed serial communication interfaces share a pair of the transmitting port and the receiving port. FIG. 50 is a diagram illustrating the structure of the memory system 1200.

In the normal mode (for example, after Step S4 in FIG. 6 is performed), the port unit 13c for other purposes needs to be used for other purposes (purposes other than the transmission and reception of signals) according to the form factor standard of the memory system 1200 (for example, a 2.5-inch form factor, an SFF-8639 form factor, or a form factor designated by the manufacturer of a computer system CS). However, in the test mode (for example, after Step S5 in FIG. 6 is performed), the port unit 13c for other purposes is not subject to the restrictions of the form factor standard of the memory system 1200. Therefore, in the normal mode (for example, after Step S4 in FIG. 6 is performed), when the low-speed interface 30a is adjusted so as to comply with the form factor standard of the memory system 1200, it can be used for communication with the host apparatus 100 in the test mode.

The port unit 13c for other purposes includes a transmitting port Port-Tx as a usable transmitting port and includes a receiving port Port-Rx as a usable receiving port. For example, in the SFF-8639 form factor, it is defined that ports (pins) P1 to P15 are used as ports of the port unit 13c for other purposes, as illustrated in FIG. 51. FIG. 51 is a diagram illustrating ports corresponding to the port unit 13c for other purposes in the SFF-8639 form factor. For example, ports which are not used by the interface 30c for other purposes (see FIG. 3) among ports P8, P9, P14, and P15 can be used as the transmitting port Port-Tx and the receiving port Port-Rx.

For example, when any one of the ports P8, P9, P14, and P15 is used, a mode control unit FW pulls up each of an output from each of a first output interface UART0-Tx, a second output interface UART1-Tx, a first input interface UART0-Rx, and a second input interface UART1-Rx to the high level in the normal mode (for example, after Step S4 in FIG. 6 is performed). Alternatively, in the normal mode (for example, after Step S4 in FIG. 6 is performed), the mode control unit FW sets the first output interface UART0-Tx and the first input interface UART0-Rx to high impedance and pulls up the second output interface UART1-Tx and the second input interface UART1-Rx to the high level. In this way, it is possible to comply with the form factor standard of the memory system 1200.

It should be noted that, when the fourth voltage (for example, a low-level voltage) is steadily output from the second output interface UART-Tx in the normal mode (first mode) as in the second embodiment, for example, one of the ports P5 and P6 which is not used by the interface 30c for other purposes (see FIG. 3) among the ports (pins) P1 to P15 illustrated in FIG. 51 may be used as the transmitting port Port-Tx and the receiving port Port-Rx.

For example, when one of the ports P5 and P6 is used, the mode control unit FW pulls down the output from each of the first output interface UART0-Tx, the second output interface UART1-Tx, the first input interface UART0-Rx, and the second input interface UART1-Rx to the low level in the normal mode (for example, after Step S4 in FIG. 6 is performed). Alternatively, in the normal mode (for example, after Step S4 in FIG. 6 is performed), the mode control unit FW sets the first output interface UART0-Tx and the first input interface UART0-Rx to high impedance and pulls down the second output interface UART1-Tx and the second input interface UART1-Rx to the low level. In this way, it is possible to comply with the form factor standard of the memory system 1200.

Figures 54, 55:
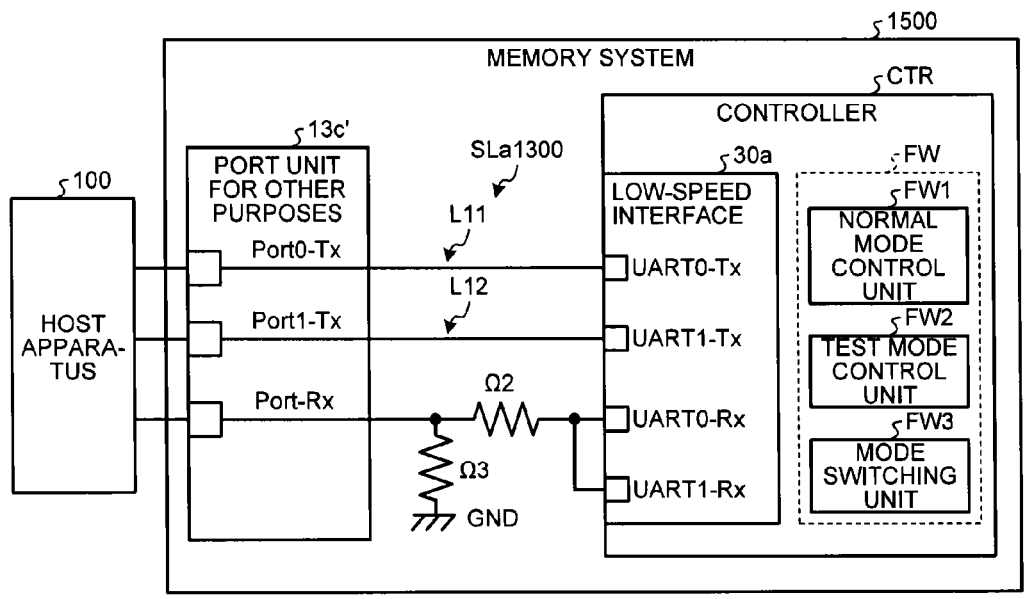
FIG. 54 is a diagram illustrating the structure of a memory system according to a fifteenth embodiment.
FIG. 55 is a diagram illustrating the operation of a memory system according to a modification of the fifteenth embodiment.

As illustrated in FIG. 55, when the controller CTR is refined (the specifications of the controller CTR are changed) such that the first signal which is selected from a plurality of first signals including high impedance is output from the first output interface UART0-Tx and the second signal which is selected from a plurality of second signals including high impedance is output from the second output interface UART1-Tx, for example, the ports P3 and P11 illustrated in FIG. 51 are used as the transmitting port Port-Tx.

For example, when one of the ports P3 and P11 is used as the transmitting port Port-Tx, the mode control unit FW sets the first output interface UART0-Tx to high impedance and sets the second output interface UART1-Tx to high impedance in the normal mode (for example, after Step S4 in FIG. 6 is performed). In this way, it is possible to comply with the form factor standard of the memory system 1200.

(Thirteenth Embodiment)

Next, a memory system 1300 according to a thirteenth embodiment will be described. Hereinafter, the thirteenth embodiment will be described with an emphasis on the difference from the first embodiment.

In the first embodiment, the example in which the usable transmitting port and the usable receiving port of the low-speed serial port unit 13a in the connector 13 are limited to a pair of a transmitting port and a receiving port has been described. However, in the thirteenth embodiment, a case in which two transmitting ports and one receiving port can be used in the low-speed serial port unit 13a' of the connector 13 will be described.

For example, in the 2.5-inch form factor, supposing that a port GND is used for connection to the ground potential and two pairs of ports are used as the transmitting port and the receiving port among four ports respectively, one port remains.

In the thirteenth embodiment, the remaining one port is used as the transmitting port, plural types of output interfaces for low-speed serial communication are connected to different transmitting ports, and the receiving port is shared by plural types of input interfaces for low-speed serial communication.

Figure 52:
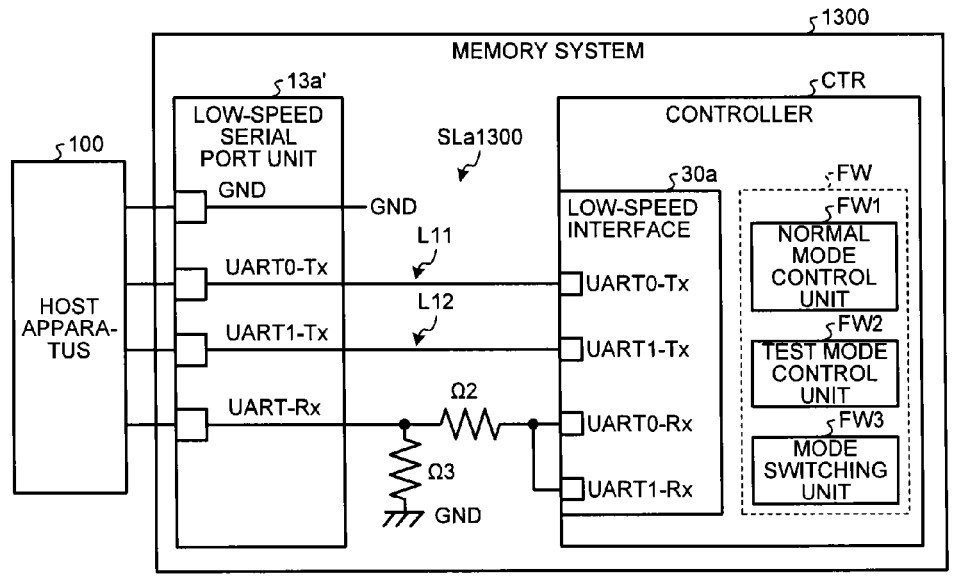
FIG. 52 is a diagram illustrating the structure of a memory system according to a thirteenth embodiment.

Specifically, the memory system 1300 is configured as illustrated in FIG. 52. FIG. 52 is a diagram illustrating a structure related to a low-speed communication interface (a low-speed serial port unit 13a' and a low-speed interface 30a) in the memory system 1300.

The memory system 1300 includes the low-speed serial port unit 13a' and low-speed lines SLa1300, instead of the low-speed serial port unit 13a and the low-speed lines SLa (see FIG. 5).

The low-speed serial port unit 13a' includes transmitting ports UART0-Tx and UART1-Tx as the usable transmitting port and includes a receiving port UART-Rx as the usable receiving port.

The low-speed lines SLa1300 connect the transmitting port UART0-Tx of the low-speed serial port unit 13a' to a first output interface UART0-Tx of the low-speed interface 30a, without connecting the transmitting port UART0-Tx to a second output interface UART1-Tx of the low-speed interface 30a. In addition, the low-speed lines SLa1300 connect the transmitting port UART1-Tx of the low-speed serial port unit 13a' to the second output interface UART1-Tx of the low-speed interface 30a, without connecting the transmitting port UART1-Tx to the first output interface UART0-Tx of the low-speed interface 30a.

Specifically, the low-speed lines SLa1300 include lines L11 and L12, instead of the lines L1 to L3, the node N1, the first resistor Ω0, and the second resistor Ω1 (see FIG. 5). The line L11 connects the transmitting port UART0-Tx and the first output interface UART0-Tx. The line L12 connects the transmitting port UART1-Tx and the second output interface UART1-Tx. With this arrangements, the first output interface UART0-Tx and the second output interface UART1-Tx can be connected to different transmitting ports. Therefore, when a signal is transmitted, it is possible to prevent the signals output from the first output interface UART0-Tx and the second output interface UART1-Tx from being mixed up and thus transmit an appropriate signal.

It should be noted that, in the thirteenth embodiment, a first input interface UART0-Rx and a second input interface UART1-Rx of a controller CTR share a receiving port UART-Rx of the connector 13. In this case, in the normal mode (first mode), the controller CTR receives the value input to the first input interface UART0-Rx as the received signal and ignores the value input to the second input interface UART1-Rx. In the test mode (second mode), the controller CTR receives the value input to the second input interface UART1-Rx as the received signal and ignores the value input to the first input interface UART0-Rx. Therefore, it is possible to receive and process an appropriate signal in each operation mode.

Therefore, when a signal is received and processed, it is possible to prevent the signals received by the first input interface UART0-Rx and the second input interface UART1-Rx from being mixed up and thus receive and process an appropriate signal. In other words, it is possible to reduce the number of receiving ports UART-Rx (the number of pins) required to receive and process an appropriate signal (for example, to 1).

(Fourteenth Embodiment)

Next, a memory system 1400 according to a fourteenth embodiment will be described. Hereinafter, the fourteenth embodiment will be described with an emphasis on the difference from the eleventh embodiment.

In the eleventh embodiment, the example in which the usable transmitting port and the usable receiving port are limited to a pair of a transmitting port and a receiving port in the high-speed serial port unit 13b of the connector 13 has been described. However, in the fourteenth embodiment, a case in which two transmitting ports and one receiving port can be used in the high-speed serial port unit 13b' of the connector 13 will be described.

In the fourteenth embodiment, two ports are used as the transmitting ports, plural types of output interfaces for low-speed serial communication are connected to different transmitting ports, and the receiving port is shared by plural types of input interfaces for low-speed serial communication.

Figure 53:
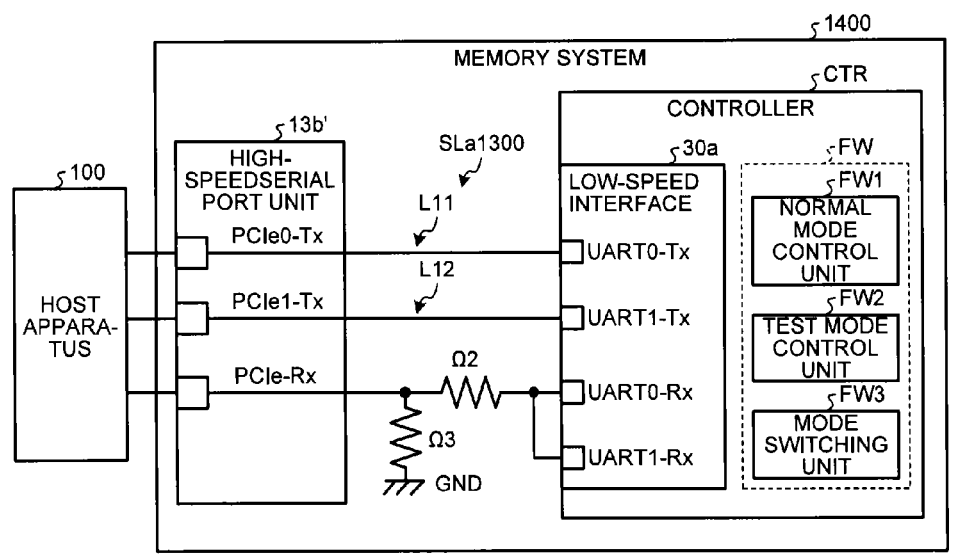
FIG. 53 is a diagram illustrating the structure of a memory system according to a fourteenth embodiment.

Specifically, the memory system 1400 is configured as illustrated in FIG. 53. FIG. 53 is a diagram illustrating the structure of the memory system 1400.

The memory system 1400 includes a high-speed serial port unit 13b' and the low-speed lines SLa1300, instead of the high-speed serial port unit 13b and the low-speed lines SLa (see FIG. 48).

The high-speed serial port unit 13b' includes transmitting ports PCIe0-Tx and PCIe1-Tx as usable transmitting ports and includes a receiving port PCIe-Rx as a usable receiving port.

The low-speed lines SLa1300 connect the transmitting port PCIe0-Tx of the high-speed serial port unit 13b' to a first output interface UART0-Tx of the low-speed interface 30a, without connecting the transmitting port PCIe0-Tx to a second output interface UART1-Tx of a low-speed interface 30a. In addition, the low-speed lines SLa1300 connect the transmitting port PCIe1-Tx of the high-speed serial port unit 13b' to the second output interface UART1-Tx of the low-speed interface 30a, without connecting the transmitting port PCIe1-Tx to the first output interface PCIe0-Tx of the low-speed interface 30a.

Specifically, the low-speed lines SLa1300 include lines L11 and L12, instead of the lines L1 to L3, the node N1, the first resistor Ω0, and the second resistor Ω1 (see FIG. 5). The line L11 connects the transmitting port PCIe0-Tx and the first output interface UART0-Tx. The line L12 connects the transmitting port PCIe1-Tx and the second output interface UART1-Tx. With this arrangements, the first output interface UART0-Tx and the second output interface UART1-Tx can be connected to different transmitting ports. Therefore, when a signal is transmitted, it is possible to prevent the signals output from the first output interface UART0-Tx and the second output interface UART1-Tx from being mixed up and thus transmit an appropriate signal.

It should be note that, in the fourteenth embodiment, a first input interface UART0-Rx and a second input interface UART1-Rx of a controller CTR share a receiving port PCIe-Rx of the connector 13. In this case, in the normal mode (first mode), the controller CTR receives the value input to the first input interface UART0-Rx as the received signal and ignores the value input to the second input interface UART1-Rx. In the test mode (second mode), the controller CTR receives the value input to the second input interface UART1-Rx as the received signal and ignores the value input to the first input interface UART0-Rx. Therefore, it is possible to receive and process an appropriate signal in each operation mode.

Therefore, when a signal is received and processed, it is possible to prevent the signals received by the first input interface UART0-Rx and the second input interface UART1-Rx from being mixed up and thus receive and process an appropriate signal. In other words, it is possible to reduce the number of receiving ports PCIe-Rx (the number of pins) required to receive and process an appropriate signal (for example, to 1).

(Fifteenth Embodiment)

Next, a memory system 1500 according to a fifteenth embodiment will be described. Hereinafter, the fifteenth embodiment will be described with an emphasis on the difference from the twelfth embodiment.

In the twelfth embodiment, the example in which the usable transmitting port and the usable receiving port of the port unit 13c for other purposes in the connector 13 are limited to a pair of a transmitting port and a receiving port has been described. However, in the fifteenth embodiment, a case in which two transmitting ports and one receiving port can be used in the port unit 13c' for other purposes of the connector 13 will be described.

In the fifteenth embodiment, two ports are used as the transmitting ports, plural types of output interfaces for low-speed serial communication are connected to different transmitting ports, and the receiving port is shared by plural types of input interfaces for low-speed serial communication.

Specifically, the memory system 1500 is configured as illustrated in FIG. 54. FIG. 54 is a diagram illustrating the structure of the memory system 1500.

The memory system 1500 includes a port unit 13c' for other purposes and the low-speed lines SLa1300, instead of the port unit 13c for other purposes and the low-speed line SLa (see FIG. 50).

The port unit 13c' for other purposes includes transmitting ports Port0-Tx and Port1-Tx as the usable transmitting ports and includes a receiving port Port-Rx as the usable receiving port.

The low-speed lines SLa1300 connect the transmitting port Port0-Tx of the port unit 13c' for other purposes to a first output interface UART0-Tx of the low-speed interface 30a, without connecting the transmitting port Port0-Tx to a second output interface UART1-Tx of the low-speed interface 30a. In addition, the low-speed lines SLa1300 connect the transmitting port Port1-Tx of the port unit 13c' for other purposes to the second output interface UART1-Tx of the low-speed interface 30a, without connecting the transmitting port Port1-Tx to the first output interface PCIe0-Tx of the low-speed interface 30a.

Specifically, the low-speed lines SLa1300 includes lines L11 and L12, instead of the lines L1 to L3, the node N1, the first resistor Ω0, and the second resistor Ω1 (see FIG. 5). The line L11 connects the transmitting port Port0-Tx and the first output interface UART0-Tx. The line L12 connects the transmitting port Port1-Tx and the second output interface UART1-Tx. With this arrangements, the first output interface UART0-Tx and the second output interface UART1-Tx can be connected to different transmitting ports. Therefore, when a signal is transmitted, it is possible to prevent the signals output from the first output interface UART0-Tx and the second output interface UART1-Tx from being mixed up and thus transmit an appropriate signal.

It should be noted that, in the fifteenth embodiment, in the test mode (second mode), a controller CTR receives the value input to a second input interface UART1-Rx as the received signal and ignores the value input to a first input interface UART0-Rx. Therefore, in the test mode, it is possible to receive and process an appropriate signal.

When a signal is received and processed, it is possible to prevent the signals received by the first input interface UART0-Rx and the second input interface UART1-Rx from being mixed up and thus receive and process an appropriate signal. In other words, it is possible to reduce the number of receiving ports Port-Rx (the number of pins) required to receive and process an appropriate signal (for example, to 1).

Alternatively, as illustrated in FIG. 55, when the controller CTR is refined (the specifications of the controller CTR are changed) such that the first signal which is selected from a plurality of first signals including high impedance is output from the first output interface UART0-Tx and the second signal which is selected from a plurality of second signals including high impedance is output from the second output interface UART1-Tx, for example, the ports P3 and P11 illustrated in FIG. 51 can be used as the transmitting ports Port0-Tx and Port1-Tx.

For example, when the ports P3 and P11 are used as the transmitting ports Port0-Tx and Port1-Tx, a mode control unit FW sets the first output interface UART0-Tx to high impedance and sets the second output interface UART1-Tx to high impedance in the normal mode (for example, after Step S4 in FIG. 6 is performed). In this way, it is possible to comply with the form factor standard of the memory system 1500.

(Sixteenth Embodiment)

Next, a memory system 1600 according to a sixteenth embodiment will be described. Hereinafter, the sixteenth embodiment will be described with an emphasis on the difference from the first embodiment.

In the first embodiment, the example in which plural types of low-speed serial communication interfaces in the low-speed interface 30a of the controller CTR are all used has been described. However, in the sixteenth embodiment, a case in which there is a low-speed serial communication interface which does not communicate with a host apparatus 100 among plural types of low-speed serial communication interfaces in the low-speed interface 30a of the controller CTR will be described.

Figure 56A:
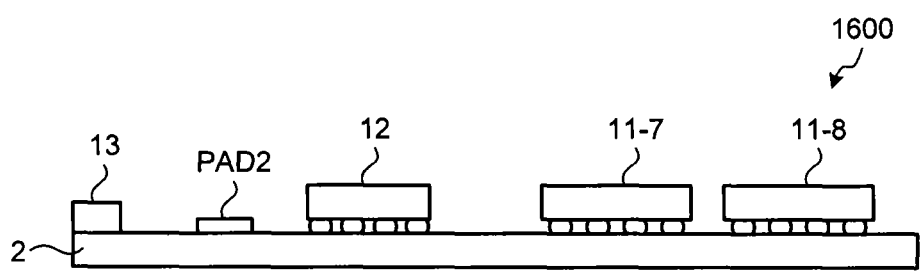
FIGS. 56A and 56B are diagrams illustrating the structure of a memory system according to a sixteenth embodiment.
Figure 56B:
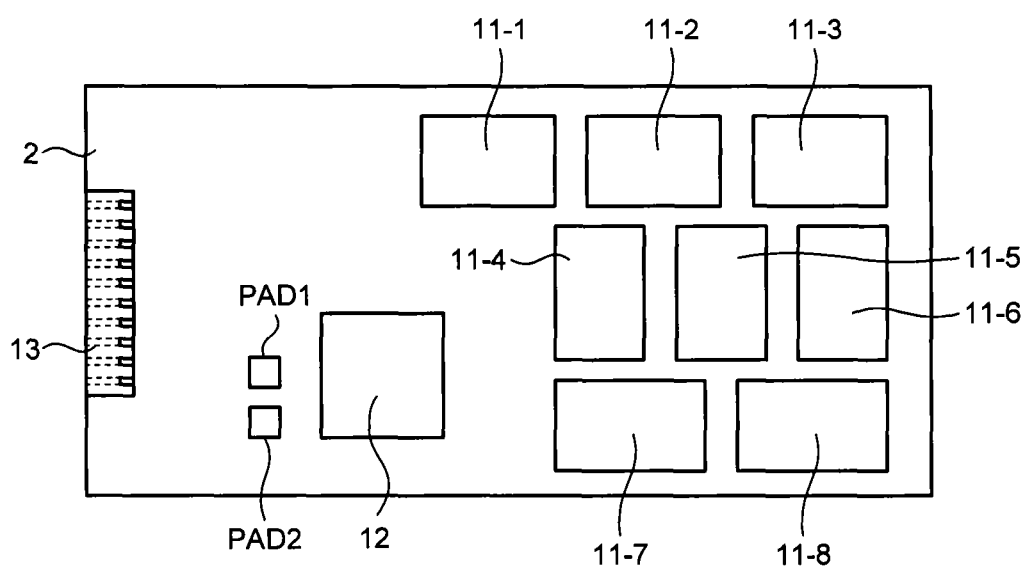

For example, as illustrated in FIGS. 56A and 56B, the printed circuit board 2 includes pads PAD1 and PAD2 which remain without being used to mount memory chips 11-1 to 11-8 or a controller chip 12. FIG. 56A and FIG. 56B are diagrams schematically illustrate an example of the outward appearance and structure of the memory system 1600. FIG. 56A is a side view and FIG. 56B is a top view of FIG. 56A. The pads PAD1 and PAD2 are in a high impedance state with respect to an input from the outside of the memory system 1600 (through a connector 13) and are less likely to be affected by the input from the outside.

In the sixteenth embodiment, taking into account the points, the low-speed serial communication interfaces which are not used among plural types of low-speed serial communication interfaces in the low-speed interface 30a of the controller CTR are connected to the pads PAD1 and PAD2 so as to be stable in terms of potential.

Figure 57:
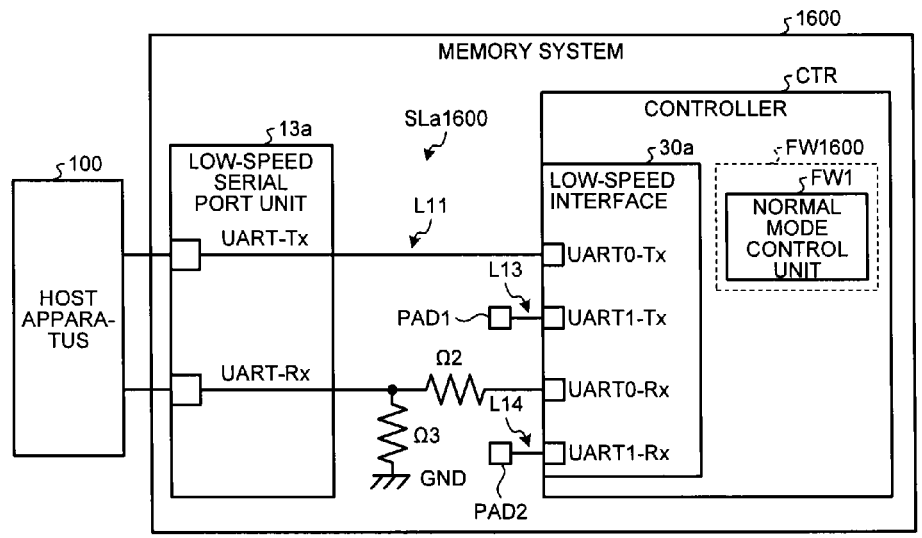
FIG. 57 is a diagram illustrating the structure of the memory system according to the sixteenth embodiment.

Specifically, as illustrated in FIG. 57, the memory system 1600 includes low-speed lines SLa1600 as a structure related to the low-speed communication interface, instead of the low-speed lines SLa (see FIG. 5). FIG. 57 is a diagram illustrating the structure of the memory system 1600.

For example, when the memory system 1600 uses UART0 communication, but does not use UART1 communication, the low-speed lines SLa1600 connect a transmitting port UART-Tx of a low-speed serial port unit 13a to a first output interface UART0-Tx of the low-speed interface 30a. In addition, the low-speed lines SLa1600 connect the pad PAD1 to the second output interface UART1-Tx of the low-speed interface 30a. For example, the low-speed lines SLa1600 connect a receiving port UART-Rx of the low-speed serial port unit 13a to the first input interface UART0-Rx of the low-speed interface 30a through a third resistor Ω2. The low-speed lines SLa1600 connect the pad PAD2 to the second input interface UART1-Rx of the low-speed interface 30a.

Specifically, the low-speed lines SLa1600 include lines L11, L13, and L14 and the pads PAD1 and PAD2, instead of the lines L1 to L3 and L8, the nodes N1 and N3, the first resistor Ω0, and the second resistor Ω1 (see FIG. 5).

The line L11 connects the transmitting port UART-Tx and the first output interface UART0-Tx. The line L13 connects the pad PAD1 and the second output interface UART1-Tx. The line L14 connects the pad PAD2 and the second input interface UART1-Rx.

For example, a mode control unit FW1600 pulls down the second output interface UART1-Tx and the second input interface UART1-Rx to the low level. Therefore, it is possible to prevent a variation in the potential of the pads PAD1 and PAD2 and thus suppress the influence of the pads PAD1 and PAD2 on the periphery (for example, noise propagation).

It should be noted that, although the communication of the pads PAD1 and PAD2 with a host apparatus 100 is unavailable, the pads PAD1 and PAD2 can be electrically connected to a probe terminal of a manufacturing apparatus or a tester apparatus and can communicate with the manufacturing apparatus or the tester apparatus during the manufacture of the memory system 1600. When the transmitting port UART1-Tx or the receiving port UART1-Rx is not used for general purposes, for example, when the transmitting port UART1-Tx or the receiving port UART1-Rx is used during manufacture, test, or failure analysis, the host apparatus 100 need not communicate with the transmitting port UART1-Tx or the receiving port UART1-Rx. Therefore, this modification is particularly effective. However, when the manufacturing apparatus or the tester apparatus communicates with the transmitting port UART1-Tx or the receiving port UART1-Rx, for example, a probe card for connection to the probe terminals of the pads PAD1 and PAD2 is needed. Therefore, in order to reduce manufacturing costs or test costs, for example, it is preferable that the transmitting port UART1-Tx or the receiving port UART1-Rx communicate with the host apparatus 100, as in the first embodiment.

Alternatively, when the memory system 1600 uses UART1 communication, but does not use UART0 communication, the pad PAD1 and the pad PAD2 may be connected to the first output interface UART0-Tx and the first input interface UART0-Rx, respectively, and the transmitting port UART-Tx and the receiving port UART-Rx may be connected to the second output interface UART1-Tx and the second input interface UART0-Rx, respectively. For example, the mode control unit FW1600 may set the second output interface UART1-Tx and the second input interface UART1-Rx to high impedance. In this case, it is also possible to prevent a variation in the potential of the pads PAD1 and PAD2 and thus suppress the influence of the pads PAD1 and PAD2 on the periphery (for example, noise propagation).

(Seventeenth Embodiment)

Next, a memory system 1700 according to a seventeenth embodiment will be described. Hereinafter, the seventeenth embodiment will be described with an emphasis on the difference from the first embodiment.

In the first embodiment, the example in which the usable transmitting port and the usable receiving port in the low-speed serial port unit 13a of the low-speed interface 30a in the connector 13 are limited to a pair of the transmitting port and the receiving port has been described. However, in the seventeenth embodiment, a case will be described in which the usable transmitting port and the usable receiving port in the low-speed serial port unit 13a of the low-speed interface 30a in the connector 13 are limited to a pair of the transmitting port and the receiving port in the low-speed serial port unit 13a and a pair of the transmitting port and the receiving port in a high-speed serial port unit 13b.

Figure 58:
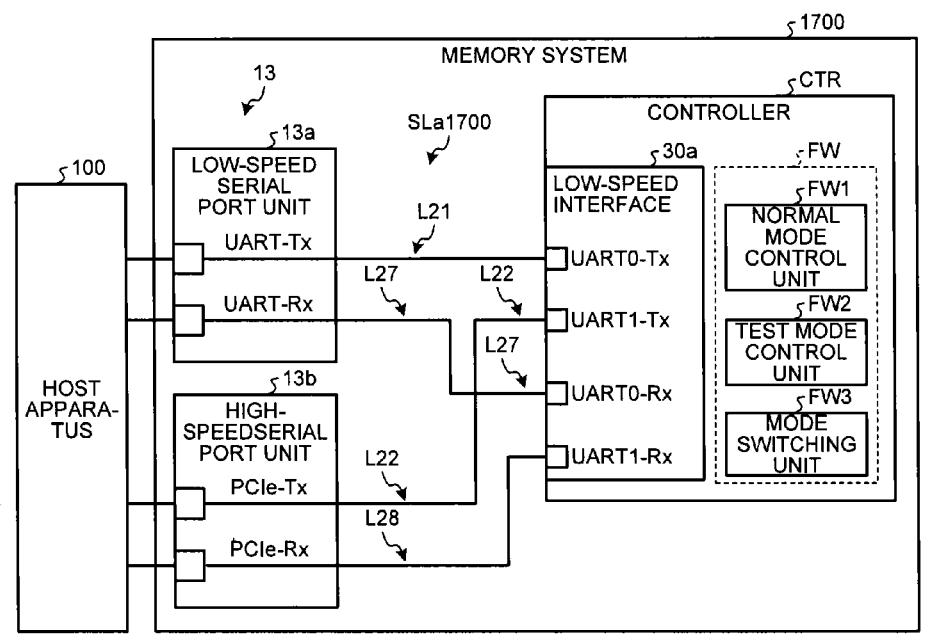
FIG. 58 is a diagram illustrating the structure of a memory system according to a seventeenth embodiment.

Specifically, the memory system 1700 is configured as illustrated in FIG. 58. FIG. 58 is a diagram illustrating a structure related to the low-speed interface 30a in the memory system 1700.

The memory system 1700 includes low-speed lines SLa1700, instead of the low-speed lines SLa (see FIG. 5). The low-speed lines SLa1700 connect the low-speed interface 30a to the low-speed serial port unit 13a and the high-speed serial port unit 13b.

The low-speed serial port unit 13a includes a transmitting port UART-Tx as the usable transmitting port and includes a receiving port UART-Rx as the usable receiving port.

The high-speed serial port unit 13b includes a transmitting port PCIe-Tx as the usable transmitting port and includes a receiving port PCIe-Rx as the usable receiving port. For example, in the SFF-8639 form factor, it is defined that ports (pins) E1 to E6 and S15 to S28 are used as the ports of the high-speed serial port unit 13b, as illustrated in FIG. 49. FIG. 49 is a diagram illustrating the ports corresponding to the high-speed serial port unit 13b in the SFF-8639 form factor. For example, a port which is not used by the high-speed interface 30b (see FIG. 3) among the ports S17, S18, S23, and S24 can be used as the transmitting port PCIe-Tx. For example, a port which is not used by the high-speed interface 30b (see FIG. 3) among the ports S20, S21, S26, and S27 can be used as the receiving port PCIe-Rx.

Specifically, the low-speed line SLa1700 includes lines L21, L22, L27, and L28, instead of the lines L1 to L8, the nodes N1 to N3, the first resistor Ω0, the second resistor Ω1, the third resistor Ω2, and the fourth resistor Ω3 (see FIG. 5).

The line L21 connects the transmitting port UART-Tx of the low-speed serial port unit 13a and the first output interface UART0-Tx. The line L22 connects the transmitting port PCIe-Tx of the high-speed serial port unit 13b and the second output interface UART1-Tx. With this arrangements, the first output interface UART0-Tx and the second output interface UART1-Tx can be connected to different transmitting ports. Therefore, when a signal is transmitted, it is possible to prevent the mixture of the signals output from the first output interface UART0-Tx and the second output interface UART1-Tx and thus transmit an appropriate signal.

The line L27 connects the receiving port UART-Rx of the low-speed serial port unit 13a and the first input interface UART0-Rx. The line L22 connects the receiving port PCIe-Rx of the high-speed serial port unit 13b and the second input interface UART1-Rx. With this arrangements, the first input interface UART0-Rx and the second input interface UART1-Rx can be connected to different receiving ports. Therefore, when a signal is transmitted, it is possible to prevent the signals input to the first input interface UART0-Rx and the second input interface UART1-Rx from being mixed up and thus receive and process an appropriate signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a first transmitting port connectable to a first host apparatus; and
a controller that is configured to transmit a transmission signal to the first host apparatus through the first transmitting port, that includes a first output interface and a second output interface, that outputs a first signal from the first output interface to the first transmitting port, and that outputs a second signal from the second output interface to the first transmitting port, the first signal being selected from a plurality of first signals, the plurality of first signals including high impedance, the second signal being selected from a plurality of second signals, the plurality of second signals not including high impedance; and
a signal line including a first signal line, a second signal line and a third signal line, the first signal line being connected to the first transmitting port, the second signal line being diverged from the first signal line, the second signal line being connected to the first output interface through a first resistor, the third signal line being diverged from the first signal line, the third signal line being connected to the second output interface through a second resistor, the second resistor having a greater resistance value than the first resistor.

2. The memory system according to claim 1,
wherein the controller supplies the first signal output from the first output interface as the transmission signal to the first transmitting port in a first mode, and supplies the second signal output from the second output interface as the transmission signal to the first transmitting port in a second mode.

3. The memory system according to claim 2,
wherein the second resistor has a greater resistance value than the first resistor such that the first signal output from the first output interface can be supplied to the first transmitting port when the second signal with a fixed level is output from the second output interface in the first mode.

4. The memory system according to claim 2,
wherein the plurality of first signals include a first voltage, a second voltage lower than the first voltage, and the high impedance,
the plurality of second signals include a third voltage and a fourth voltage lower than the third voltage,
in the first mode, the controller outputs the first voltage and/or the second voltage from the first output interface and steadily outputs the third voltage or the fourth voltage from the second output interface, and
in the second mode, the controller outputs the high impedance from the first output interface and outputs the third voltage and/or the fourth voltage from the second output interface.

5. The memory system according to claim 4,
wherein the second resistor has a greater resistance value than the first resistor such that the first voltage and/or the second voltage output from the first output interface can be supplied to the first transmitting port when the third voltage or the fourth voltage is steadily output from the second output interface in the first mode.

6. The memory system according to claim 4,
wherein the first output interface includes a first PMOS transistor and a first NMOS transistor,
the second output interface includes a second PMOS transistor and a second NMOS transistor,
the first output interface outputs the first voltage when the first PMOS transistor is turned on and the first NMOS transistor is turned off, outputs the second voltage when the first PMOS transistor is turned off and the first NMOS transistor is turned on, and outputs the high impedance when the first PMOS transistor is turned off and the first NMOS transistor is turned off, and
the second output interface outputs the third voltage when the second PMOS transistor is turned on and the second NMOS transistor is turned off, and outputs the fourth voltage when the second PMOS transistor is turned off and the second NMOS transistor is turned on.

7. The memory system according to claim 6,
wherein the controller includes:
a first selector that selects one of a first transmission control signal and a signal fixed to the high level and supplies the selected signal to a gate of the first PMOS transistor, in response to a first control signal; and
a second selector that selects one of the first transmission control signal to be transmitted and a signal fixed to a low level and supplies the selected signal to a gate of the first NMOS transistor, in response to the first control signal.

8. The memory system according to claim 1,
wherein the controller further includes a third output interface, the signal line further includes a fourth signal line diverged from the first signal line, the fourth signal line is connected to the third output interface through a third resistor, the second resistor has a greater resistance value than the third resistor, and the controller outputs a third signal from the third output interface, the third signal being selected from the plurality of third signals, the plurality of third signals including high impedance.

9. A memory system comprising:

a first transmitting port connectable to a first host apparatus; and a controller that is configured to transmit a transmission signal to the first host apparatus through the first transmitting port, that includes a first output interface and a second output interface, that outputs a first signal from the first output interface to the first transmitting port, and that outputs a second signal from the second output interface to the first transmitting port, the first signal being selected from a plurality of first signals, the plurality of first signals including high impedance, the second signal being selected from a plurality of second signals, the plurality of second signals not including high impedance, wherein the first output interface includes a first PMOS transistor and a first NMOS transistor, the second output interface includes a second PMOS transistor and a second NMOS transistor, and the memory system satisfies at least either one of a condition that a dimension of the second NMOS transistor is less than a dimension of the first NMOS transistor and a condition that a dimension of the second PMOS transistor is less than a dimension of the first PMOS transistor.

10. The memory system according to claim 9, wherein the memory system satisfies at least either one of the condition that the dimension of the second NMOS transistor is less than the dimension of the first NMOS transistor and the condition that the dimension of the second PMOS transistor is less than the dimension of the first PMOS transistor, such that the first signal output from the first output interface can be supplied to the transmitting port when the fixed-level second signal is output from the second output interface in the first mode.

11. The memory system according to claim 10, wherein the first output interface outputs a first voltage when the first PMOS transistor is turned on and the first NMOS transistor is turned off, outputs a second voltage when the first PMOS transistor is turned off and the first NMOS transistor is turned on, and outputs the high impedance when the first PMOS transistor is turned off and the first NMOS transistor is turned off, and the second output interface outputs a third voltage when the second PMOS transistor is turned on and the second NMOS transistor is turned off, and outputs a fourth voltage when the second PMOS transistor is turned off and the second NMOS transistor is turned on.

12. The memory system according to claim 1, wherein the controller makes an operation mode transition to a first mode in response to a first switch command to instruct the operation mode transition to the first mode, and makes the operation mode transition to a second mode in response to a second switch command to instruct the operation mode transition to the second mode.

13. The memory system according to claim 1, further comprising:

a memory including a firmware storage area, wherein the controller makes an operation mode transition to one mode of a first mode and a second mode when firmware is stored in the firmware storage area and makes the operation mode transition to the other mode of the first mode and the second mode when the firmware is not stored in the firmware storage area, at the time the memory system starts up.

14. The memory system according to claim 1, further comprising:

a receiving port that receives a reception signal from the first host apparatus, wherein the controller further includes a first input interface and a second input interface, the first input interface is connected to the receiving port, and the second input interface is connected to the receiving port.

15. The memory system according to claim 1, wherein the controller outputs the high impedance from the first output interface when the controller supplies the second signal output from the second output interface as the transmission signal to the first transmitting port.

16. The memory system according to claim 2, wherein the controller outputs the high impedance from the first output interface in the second mode.

17. The memory system according to claim 14, wherein the controller supplies the first signal output from the first output interface as the transmission signal to the first transmitting port in the a first mode, receives a third signal from the receiving port at the first input interface and ignores a fourth signal from the receiving port at the second input interface in the first mode, supplies the second signal output from the second output interface as the transmission signal to the first transmitting port in a second mode, and ignores the third signal at the first input interface and receives the fourth signal at the second input interface in the second mode.

18. The memory system according to claim 3, wherein the resistance value of the second resistor is about ten times as large as the resistance value of the first resistor.

19. The memory system according to claim 17, further comprising:

a second transmitting port that is configured to be connectable to a second host apparatus, wherein the controller is configured to transmit a transmission signal through the first transmitting port to the first host apparatus at a first transfer speed, and the controller is configured to transmit a transmission signal through the second transmitting port to the second host apparatus at a second transfer speed higher than the first transfer speed.

20. The memory system according to claim 19, wherein the controller is able to communicate with the first host apparatus through the first transmitting port based on a UART (Universal Asynchronous Receiver Transmitter) standard, and the controller is able to communicate with the second host apparatus through the second transmitting port based on a SATA (Serial Advanced Technology Attachment) standard.

* * * * *